United States Patent
Jikutani et al.

(10) Patent No.: US 8,624,950 B2
(45) Date of Patent: Jan. 7, 2014

(54) SURFACE-EMITTING LASER COMPRISING EMISSION REGION HAVING PERIPHERAL PORTION WITH ANISOTROPY IN TWO PERPENDICULAR DIRECTIONS, AND SURFACE-EMITTING LASER ARRAY, OPTICAL SCANNING APPARATUS AND IMAGE FORMING APPARATUS INCLUDING THE SAME

(75) Inventors: Naoto Jikutani, Miyagi (JP); Kazuhiro Harasaka, Miyagi (JP); Satoru Sugawara, Miyagi (JP); Shunichi Sato, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 88 days.

(21) Appl. No.: 13/386,725

(22) PCT Filed: Sep. 14, 2010

(86) PCT No.: PCT/JP2010/066270
§ 371 (c)(1),
(2), (4) Date: Jan. 24, 2012

(87) PCT Pub. No.: WO2011/034194
PCT Pub. Date: Mar. 24, 2011

(65) Prior Publication Data
US 2012/0121297 A1    May 17, 2012

(30) Foreign Application Priority Data

Sep. 18, 2009 (JP) .................................. 2009-217917
Jul. 5, 2010 (JP) .................................. 2010-152678

(51) Int. Cl.
*B41J 2/45* (2006.01)
*H01S 5/00* (2006.01)

(52) U.S. Cl.
USPC ...................................... 347/238; 372/50.12

(58) Field of Classification Search
USPC .......................... 347/238; 399/221; 372/50.12
See application file for complete search history.

(56) References Cited

U.S. PATENT DOCUMENTS

| 5,357,123 A | 10/1994 | Sugawara |
| 5,923,691 A | 7/1999 | Sato |

(Continued)

FOREIGN PATENT DOCUMENTS

| EP | 1130720 A1 | 9/2001 |
| JP | 11-48520 | 2/1999 |

(Continued)

OTHER PUBLICATIONS

International Search Report and Written Opinion in PCT/JP2010/066270.

(Continued)

*Primary Examiner* — Stephen Meier
*Assistant Examiner* — Carlos A Martinez
(74) *Attorney, Agent, or Firm* — Cooper & Dunham LLP

(57) ABSTRACT

A surface-emitting laser includes a substrate; a lower semiconductor multilayer film reflector disposed on the substrate; a resonator structure including an active layer and disposed on the lower semiconductor multilayer film reflector; and an upper semiconductor multilayer film reflector disposed on the resonator structure. The second semiconductor multilayer film reflector includes a confinement structure in which a current passage region is surrounded by an oxidized portion of a selectively oxidized layer containing aluminum. An emission region includes a central portion and a peripheral portion, the peripheral portion being covered with a transparent dielectric film whose reflectivity is lower than a reflectivity of the central portion. The selectively oxidized layer has a thickness in a range from 30 nm to 40 nm. The temperature at which an oscillation threshold current is minimized is 60° C. or lower.

12 Claims, 44 Drawing Sheets

(56) References Cited

U.S. PATENT DOCUMENTS

| | | |
|---|---|---|
| 5,939,733 A | 8/1999 | Sato |
| 6,002,700 A | 12/1999 | Sato |
| 6,072,196 A | 6/2000 | Sato |
| 6,207,973 B1 | 3/2001 | Sato et al. |
| 6,233,264 B1 | 5/2001 | Sato |
| 6,542,528 B1 | 4/2003 | Sato et al. |
| 6,563,851 B1 | 5/2003 | Jikutani et al. |
| 6,614,821 B1 | 9/2003 | Jikutani et al. |
| 6,639,931 B1 | 10/2003 | Dowd et al. |
| 6,674,785 B2 | 1/2004 | Sato et al. |
| 6,765,232 B2 | 7/2004 | Takahashi et al. |
| 6,803,604 B2 | 10/2004 | Takahashi et al. |
| 6,927,412 B2 | 8/2005 | Takahashi et al. |
| 6,959,025 B2 | 10/2005 | Jikutani et al. |
| 6,975,663 B2 | 12/2005 | Sekiya et al. |
| 7,002,527 B2 | 2/2006 | Sugawara |
| 7,466,738 B2 | 12/2008 | Jikutani |
| 7,542,499 B2 | 6/2009 | Jikutani |
| 7,684,458 B2 | 3/2010 | Sato et al. |
| 7,693,204 B2 | 4/2010 | Sato et al. |
| 7,720,125 B2 | 5/2010 | Jikutani et al. |
| 7,746,912 B2 | 6/2010 | Motomura et al. |
| 7,957,444 B2 | 6/2011 | Itoh et al. |
| 7,978,739 B2 | 7/2011 | Sugawara et al. |
| 7,981,700 B2 | 7/2011 | Sato et al. |
| 8,035,676 B2 | 10/2011 | Harasaka et al. |
| 2005/0013334 A1 | 1/2005 | Watanabe et al. |
| 2007/0014324 A1 | 1/2007 | Maeda et al. |
| 2008/0024849 A1 | 1/2008 | Hayashi et al. |
| 2008/0055672 A1 | 3/2008 | Watanabe et al. |
| 2008/0212636 A1 | 9/2008 | Sato et al. |
| 2009/0129417 A1 | 5/2009 | Maeda et al. |
| 2009/0180506 A1 | 7/2009 | Maeda et al. |
| 2009/0285252 A1 | 11/2009 | Ishii et al. |
| 2009/0295902 A1 | 12/2009 | Sato et al. |
| 2009/0303308 A1 | 12/2009 | Itoh et al. |
| 2010/0060712 A1 | 3/2010 | Sato et al. |
| 2010/0177799 A1 | 7/2010 | Watanabe et al. |
| 2010/0214633 A1 | 8/2010 | Sato et al. |

FOREIGN PATENT DOCUMENTS

| | | |
|---|---|---|
| JP | 2000-277852 | 10/2000 |
| JP | 3566902 | 6/2004 |
| JP | 2004-289033 | 10/2004 |
| JP | 2004-319643 | 11/2004 |
| JP | 2004-342970 | 12/2004 |
| JP | 2005-340779 | 12/2005 |
| JP | 3955925 | 5/2007 |
| JP | 2007-201398 | 8/2007 |
| JP | 2008-16824 | 1/2008 |
| JP | 2009-164466 | 7/2009 |
| JP | 2009-188382 | 8/2009 |
| WO | WO2009/102048 A1 | 8/2009 |

OTHER PUBLICATIONS

Choquette, K.D., et al. (1994) "Low threshold voltage vertical-cavity lasers fabricated by selective oxidation," Electronic Letters, vol. 30, No. 24., pp. 2043-2044.

Choquette, K.D., (1995), "Cavity characteristics of selectively oxidized vertical-cavity lasers," Applied Physics Letters, vol. 66, No. 25, pp. 3413-3415.

Nakayama, Hideo, et al. (2004), "780nm VCSELs for Home Networks and Printers," Electronic Components and Technology Conference Proceedings, 54th, vol. 2, pp. 1371-1375.

FIG.5A
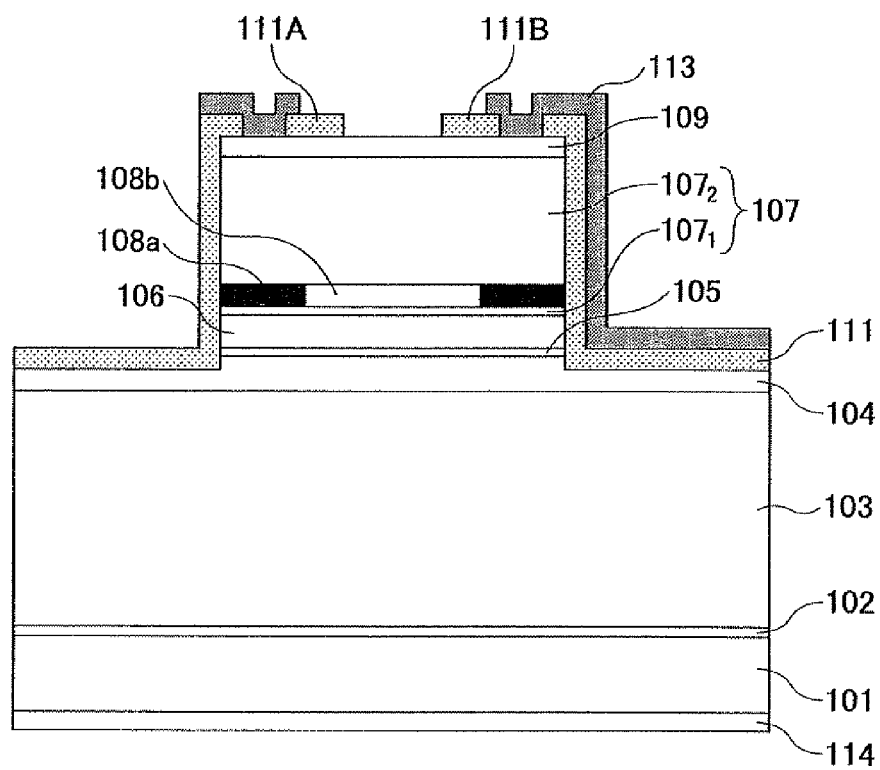
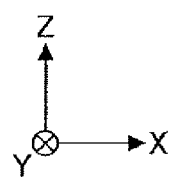

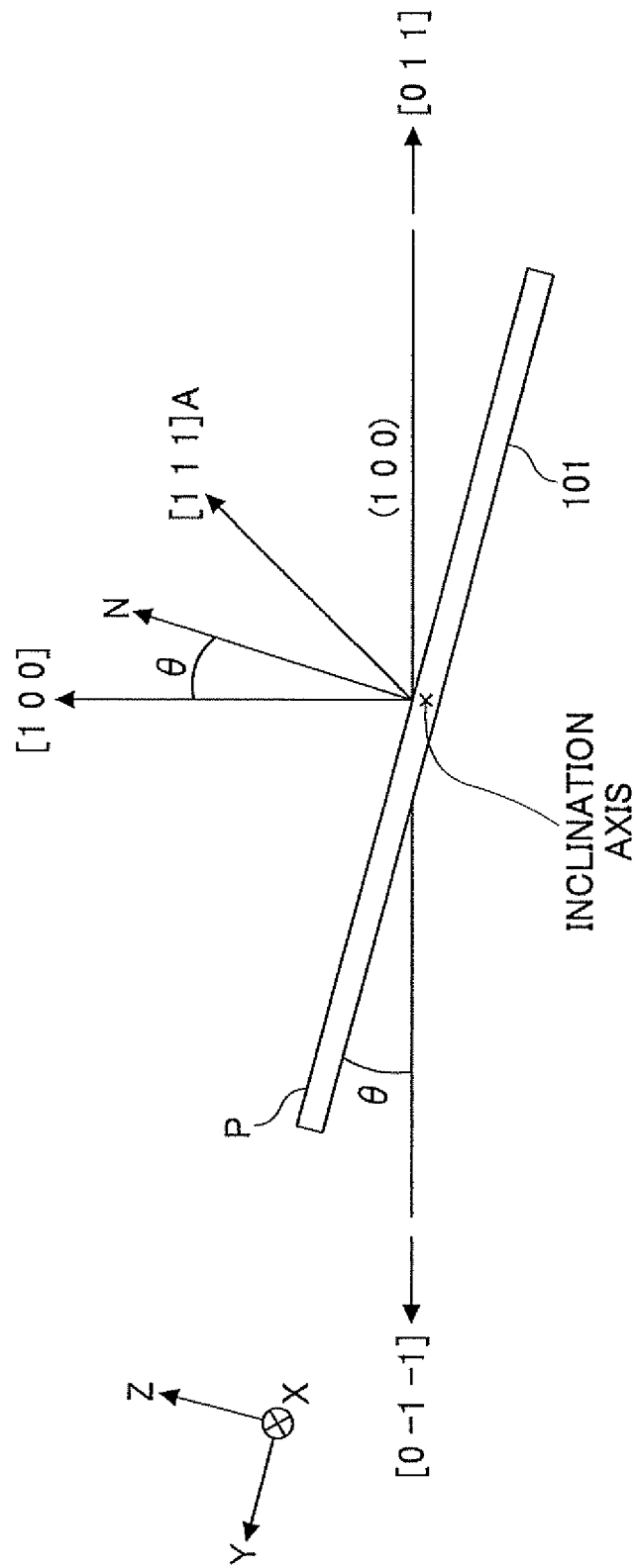

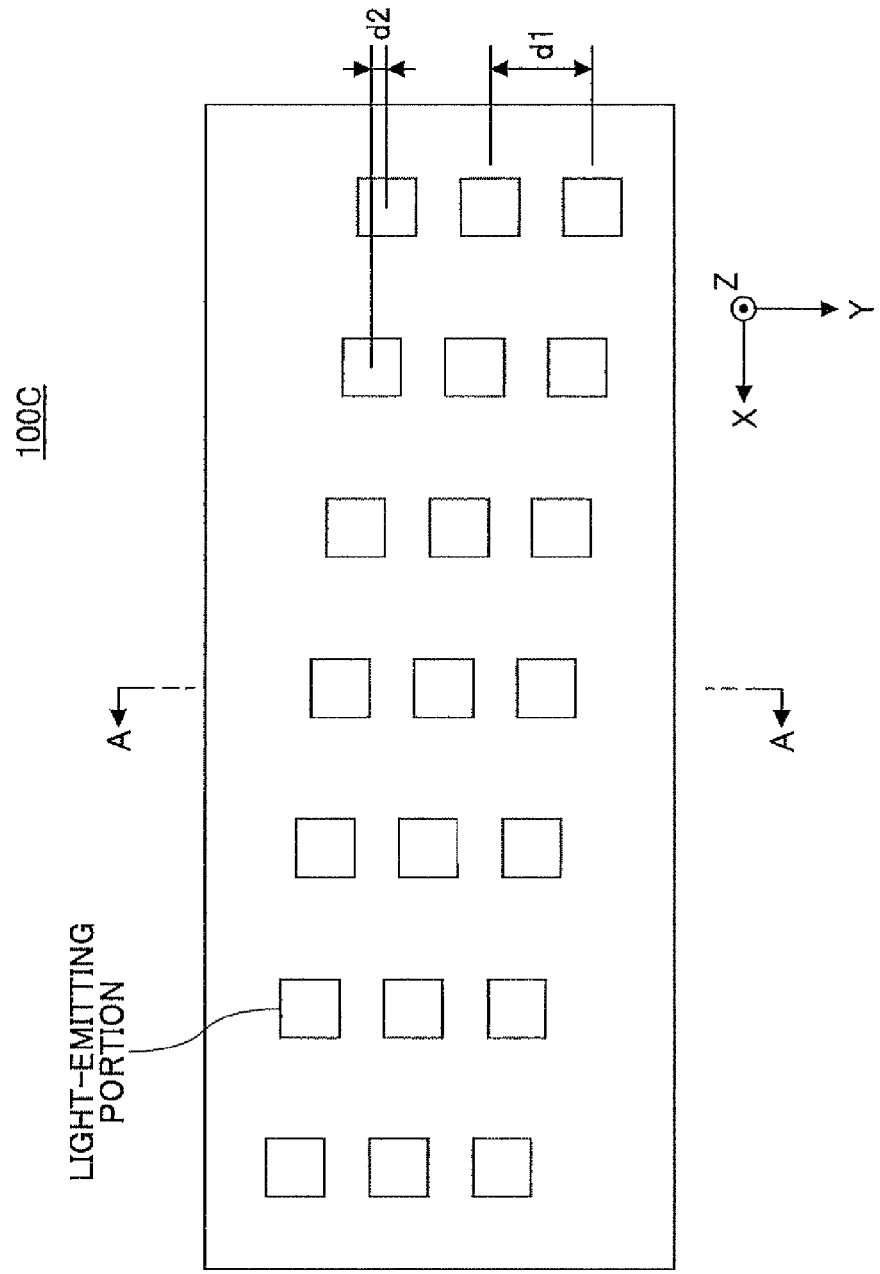

SURFACE-EMITTING LASER COMPRISING EMISSION REGION HAVING PERIPHERAL PORTION WITH ANISOTROPY IN TWO PERPENDICULAR DIRECTIONS, AND SURFACE-EMITTING LASER ARRAY, OPTICAL SCANNING APPARATUS AND IMAGE FORMING APPARATUS INCLUDING THE SAME

TECHNICAL FIELD

The present invention generally relates to surface-emitting lasers, surface-emitting laser arrays, optical scanning apparatuses, and image forming apparatus. More specifically, the present invention relates to a surface-emitting laser configured to emit light in a direction perpendicular to a substrate, a surface-emitting laser array including a plurality of the surface-emitting lasers, an optical scanning apparatus including the surface-emitting laser or the surface-emitting laser array, and an image forming apparatus including the optical scanning apparatus.

BACKGROUND ART

Surface-emitting lasers that emit light in a direction perpendicular to a substrate are the subject of intense research and development. Surface-emitting lasers have a lower threshold current for oscillation than edge-emitting lasers, and are capable of emitting a high-quality circular beam profile. Because a laser output can be obtained from the surface-emitting laser in a direction perpendicular to a substrate of the laser, a plurality of the surface-emitting lasers can be readily integrated two-dimensionally at high density. Potential applications of the surface-emitting laser include a light source for parallel optical interconnection and high-speed/high-resolution electrophotography systems.

Typically, the surface-emitting laser has a confinement structure for improving current inflow efficiency. The confinement structure may be formed by selective oxidation of Al (aluminum), as discussed in Non-Patent Documents 1 and 2. Such a confinement structure may be hereafter referred to as an "oxidized confinement structure".

Non-Patent Document 3 discusses a printer in which a VCSEL (Vertical Cavity Surface Emitting) array of a 780 nm band is used. Patent Document 1 discusses a surface-emitting laser in which a predetermined amount of a difference ("detuning") is obtained between an oscillation wavelength which is determined by the length of a resonator and a peak gain wavelength which is determined by the composition of an active layer at a predetermined temperature. It is also discussed in Patent Document 1 that the oscillation wavelength corresponds to the peak gain wavelength in a temperature range above the predetermined temperature.

Patent Document 2 discusses a multi-spot image forming apparatus having a multi-spot light source. When a surface-emitting laser is applied to an image forming apparatus such as a printer, a small diameter of the beam spot focused on a photosensitive material is desirable. Further, for high-speed writing, a large laser output is desirable. Namely, it is desirable to obtain a high output in a single fundamental transverse mode (single-mode) operation.

In a printer system, for example, image quality is greatly affected by the behavior of the response waveform ("optical waveform") of an optical output of a light source at the rise timing following the start of supply of a drive current, namely the changes in the optical output over time, such as the rise time. Such behavior includes the rise time. For example, image quality may decrease if the amount of light varies even slightly after the optical output has reached a certain amount in an initial period of the rise timing.

This is due to the fact that it is an outline portion of an image that is formed at the rise or fall timing of the optical waveform. Particularly, if the light amount varies at the rise timing or in a duration of time following the time that can be substantially considered the rise timing, the image outline is obscured, thereby rendering the image visually unclear.

When it takes 300 µs to scan one line on an A4-sized sheet along its length, which is about 300 mm, a width of about 1 mm is scanned in 1 µs. It is generally said that the human eye is most sensitive to a change in image density within a width of 1 mm to 2 mm. Thus, if image density changes in a width of about 1 mm, that density change is well recognizable by the human eye, thus giving the viewer an impression of an obscured outline.

FIG. 1 is a graph of an optical waveform plotted when a surface-emitting laser having an oxidized confinement structure was driven under the pulse conditions of pulse width of 500 µs and a duty of 50% (pulse period: 1 ms). As illustrated in FIG. 1, when viewed in a relatively long time scale, the optical output exhibits a peak once immediately after rising, and then decreases and stabilizes. Such a change in the optical output is due to the self-heating of the surface-emitting laser and generally referred to as "droop characteristics".

The droop characteristics illustrate a comparison of the optical output immediately after pulse application (i.e., immediately after the rise of the optical pulse) and the optical output 500 µs after pulse application, and quantify the influence of heat on optical output.

A detailed analysis conducted by the present inventors has revealed that, when the droop characteristics of FIG. 1 are viewed in a much shorter time scale by enlarging an initial portion of the optical waveform near the rise timing, as illustrated in FIG. 2, a change in the optical output is present that is different from the droop characteristics.

Specifically, the waveform of FIG. 2 shows that the optical output does not fully rise even after 100 ns and may be considered to have fully risen only after about 200 ns, after which the waveform gradually rises until about 1 µs. This phenomenon (characteristics) has never been reported as far as the present inventors are aware. The time scale illustrated in FIG. 2 is about 1 µs immediately after the application of a pulse (immediately after the rise of the optical pulse) and is very short compared to the time scale of the droop characteristics. Such characteristics in the short time span are referred to herein as "negative droop characteristics". The negative droop characteristics are basically not observed in conventional edge-emitting lasers.

A detailed analysis of the cause of the negative droop characteristics revealed that this phenomenon is due to a change in optical confinement in the lateral direction caused by the heating of the device, and a change in the light-emitting efficiency of the device.

Patent Document 1: JP2004-319643A
Patent Document 2: JP11-48520A
Non-Patent Document 1: K. D. Choquette, K. L. Lear, R. P. Schneider, Jr., K. M. Geib, "Cavity characteristics of selectively oxidized vertical-cavity lasers", Applied Physics Letters, vol. 66, No. 25, pp. 3413-3415, 1995
Non-Patent Document 2: K. D. Choquette, R. P. Schneider, Jr., K. L. Lear, K. M. Geib, "Low threshold voltage vertical-cavity lasers fabricated by selective oxidation", Electronics Letters, No. 24, Vol. 30, pp. 2043-2044, 1994
Non-Patent Document 3: H. Nakayama, T. Nakamura, M. Funada, Y. Ohashi, M. Kato, "780 nm VCSELs for Home

DISCLOSURE OF THE INVENTION

One or more of the disadvantages of the related art are overcome by the present invention which, in one aspect, is a surface-emitting laser that includes a substrate; a lower semiconductor multilayer film reflector disposed on the substrate; a resonator structure including an active layer and disposed on the lower semiconductor multilayer film reflector; an upper semiconductor multilayer film reflector disposed on the resonator structure, the second semiconductor multilayer film reflector including a confinement structure in which a current passage region is surrounded by an oxidized portion of a selectively oxidized layer containing aluminum; and an upper electrode disposed on the upper semiconductor multilayer film reflector, the upper electrode defining an emission region. The emission region includes a central portion and a peripheral portion, the peripheral portion being covered with a transparent dielectric film and having a reflectivity lower than a reflectivity of the central portion. The selectively oxidized layer has a thickness in a range from 30 nm to 40 nm, and the temperature at which an oscillation threshold current is minimized is 60° C. or lower.

In another aspect, the invention may provide a surface-emitting laser array comprising a plurality of the surface-emitting lasers.

In another aspect, the invention may provide an optical scanning apparatus that includes a light source including the surface-emitting laser; a deflector configured to deflect a beam of light emitted by the light source; and a scanning optical system configured to focus the beam of light deflected by the deflector on a scanned surface.

In another aspect, the invention may provide an optical scanning apparatus that includes a light source including the surface-emitting laser array; a deflector configured to deflect a beam of light emitted by the light source; and a scanning optical system configured to focus the beam of light deflected by the deflector on a scanned surface.

In another aspect, the invention may provide an image forming apparatus that includes an image carrier and the optical scanning apparatus. The optical scanning apparatus is configured to scan the image carrier with the beam of light that is modulated in accordance with image information.

In another aspect, the invention may provide an image forming apparatus that includes an image carrier and the optical scanning apparatus. The optical scanning apparatus is configured to scan the image carrier with the beam of light that is modulated in accordance with image information.

BRIEF DESCRIPTION OF THE DRAWINGS

The foregoing summary, as well as the following detailed description of preferred embodiments, is better understood when read in conjunction with the appended drawings in which:

FIG. 5A is a cross section of a surface-emitting laser in a light source of the optical scanning apparatus of FIG. 4 taken in an X-Z plane;

FIG. 6A illustrates an inclined substrate in the surface-emitting laser;

FIG. 39 is a plan view of a surface-emitting laser array;

BEST MODE OF CARRYING OUT THE INVENTION

Image Forming Apparatus

Figure 1:
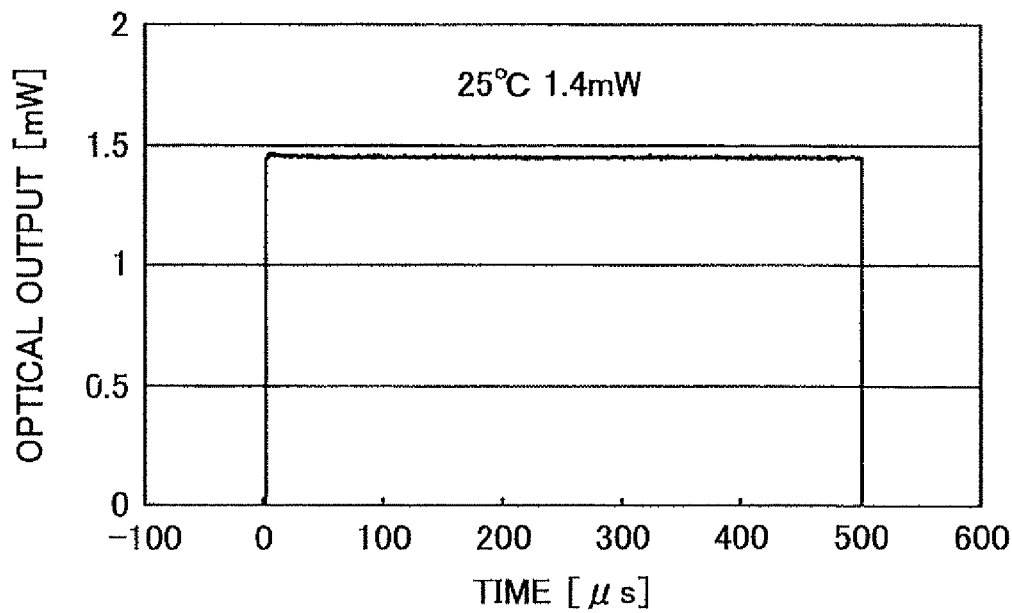
FIG. 1 is a graph illustrating an optical waveform of a conventional surface-emitting laser.
Figure 2:
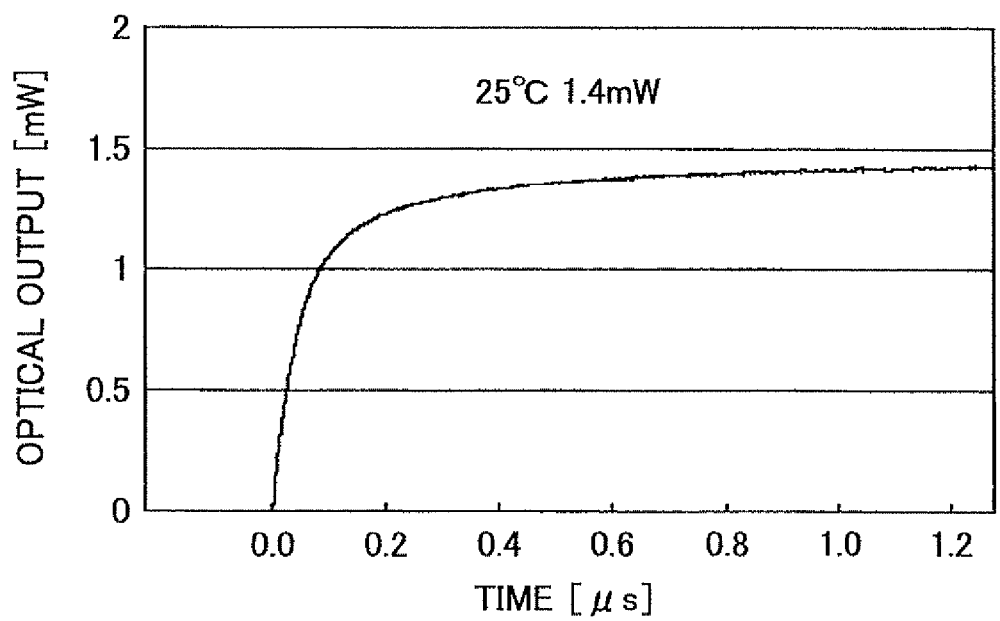
FIG. 2 is a graph illustrating an enlarged portion of a rise portion of the graph of FIG. 1.
Figure 3:
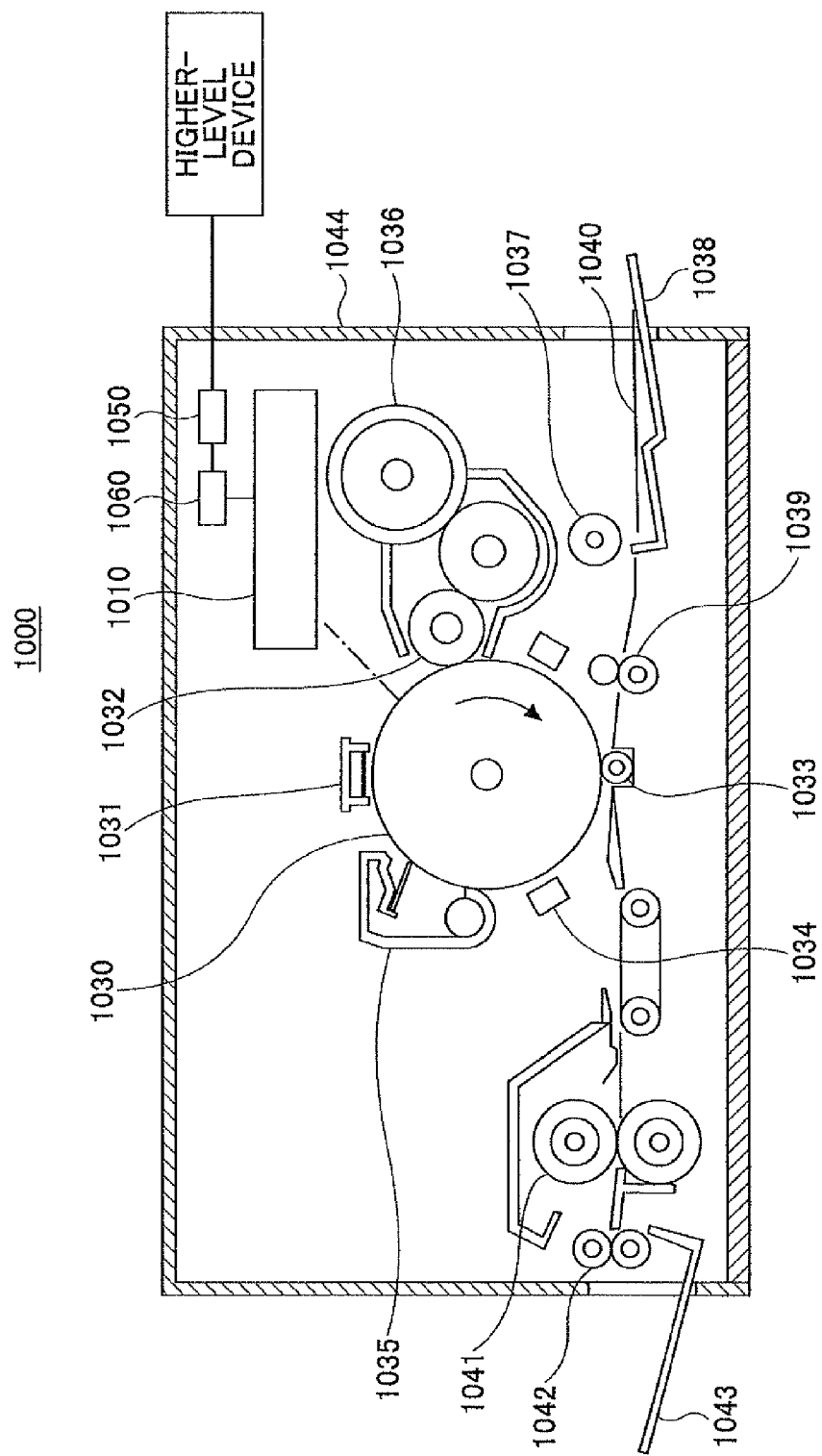
FIG. 3 illustrates a laser printer according to an embodiment of the present invention.

FIG. 3 illustrates a laser printer 1000 (image forming apparatus) according to an embodiment of the present embodiment. The laser printer 1000 includes an optical scanning apparatus 1010; a photosensitive drum 1030; a charging unit 1031; a developing roller 1032; a transfer charger 1033; a neutralizing unit 1034; a cleaning unit 1035; a toner cartridge 1036; a sheet-feeding roller 1037; a sheet-feeding tray 1038; a registration roller pair 1039; a fusing roller 1041; a sheet-ejecting roller 1042; an ejected-sheet tray 1043; a communications control unit 1050; and a printer control unit 1060 configured to centrally control the various units of the laser printer 1000. These units of the laser printer 1000 are housed in a printer casing 1044.

The communications control unit 1050 controls communications with an upper-level apparatus, such as a personal computer, via a network. The photosensitive drum 1030 is a cylindrical member on a surface of which a photosensitive layer is formed. The surface of the photosensitive drum 1030 provides a scanned surface. The photosensitive drum 1030 is configured to be rotated in a direction indicated by the arrow in FIG. 3.

The charging unit 1031, the developing roller 1032, the transfer charger 1033, the neutralizing unit 1034, and the cleaning unit 1035 are disposed near the scanned surface of the photosensitive drum 1030 in the order mentioned, along the rotating direction of the photosensitive drum 1030.

The charging unit 1031 is configured to charge the scanned surface of the photosensitive drum 1030 uniformly. The optical scanning apparatus 1010 is configured to scan the charged scanned surface of the photosensitive drum 1030 with a beam of light modulated in accordance with image information supplied from the upper-level apparatus, thereby forming a latent image on the scanned surface that corresponds to the image information. The latent image is then transported in the direction of the developing roller 1032 as the photosensitive drum 1030 rotates. The structure of the optical scanning apparatus 1010 is described in detail later.

The toner cartridge 1036 stores a toner that is supplied to the developing roller 1032. The developing roller 1032 is configured to cause the toner supplied from the toner cartridge 1036 to attach to the latent image on the photosensitive drum 1030, thus producing a toner image. The toner image is then transported in the direction of the transfer charger 1033 as the photosensitive drum 1030 rotates.

The sheet-feeding tray 1038 stores sheets of a recording paper 1040. A sheet-feeding roller 1037 is disposed near the sheet-feeding tray 1038. The sheet-feeding roller 1037 is configured to take out the recording paper 1040 from the sheet-feeding tray 1038 one sheet at a time, and transport the recording paper to the registration roller pair 1039. The registration roller pair 1039 is configured to first retain the recording paper 1040 and then feed the recording paper 1040 into a gap between the photosensitive drum 1030 and the transfer charger 1033 in step with the rotation of the photosensitive drum 1030.

The transfer charger 1033 has applied a voltage of a polarity opposite to that of the toner so that the toner on the surface of the photosensitive drum 1030 can be electrically drawn to the recording paper 1040. Thus, the toner image on the surface of the photosensitive drum 1030 is transferred onto the recording paper 1040. The recording paper 1040 with the transferred image is then transported to the fusing roller 1041.

The fusing roller 1041 is configured to fuse the toner image onto the recording paper 1040 by applying heat and pressure to the recording paper 1040. The thus fused recording paper 1040 is then sent out onto the ejected-sheet tray 1043 via the sheet-ejecting roller 1042.

The neutralizing unit 1034 is configured to neutralize the surface of the photosensitive drum 1030. The cleaning unit 1035 is configured to remove the toner remaining on the surface of the photosensitive drum 1030. A region on the surface of the photosensitive drum 1030 from which the remaining toner has been removed is again moved back to the position opposite the charging unit 1031.

Optical Scanning Apparatus

Figure 4:
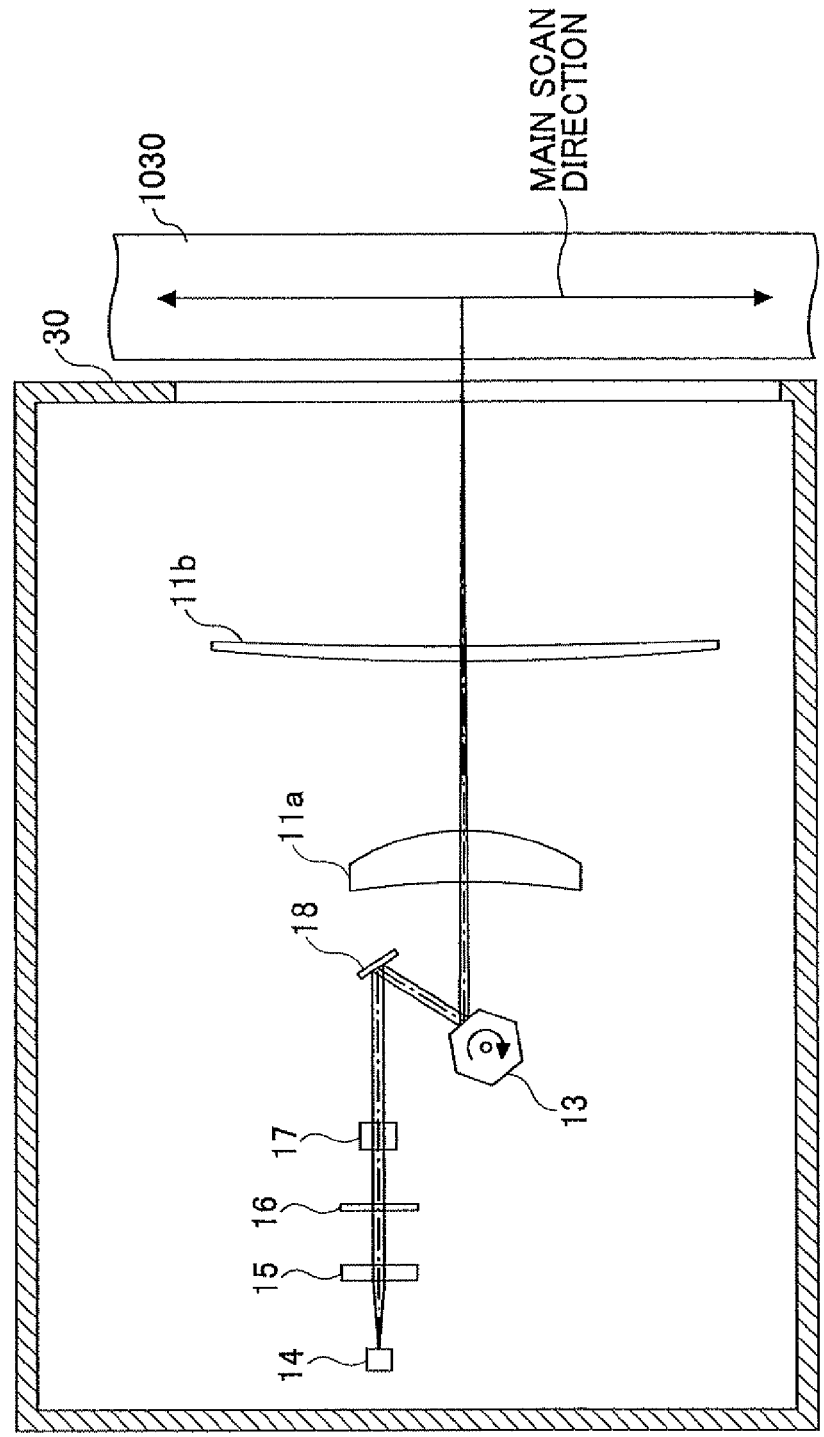
FIG. 4 illustrates an optical scanning apparatus of the laser printer illustrated in FIG. 3.

The optical scanning apparatus 1010 includes, as illustrated in FIG. 4, a deflector-side scanning lens 11a, an image-side scanning lens 11b; a polygon mirror 13; a light source 14; a coupling lens 15; an aperture plate 16; a cylindrical lens 17; a reflecting mirror 18; and a scan control unit (not illustrated).

The various portions of the optical scanning apparatus 1010 are attached to predetermined positions within an optical housing 30.

In the following, a direction corresponding to a main-scan direction is referred to as a "main-scan-corresponding direction", and a direction corresponding to a sub-scan direction is referred to as a "sub-scan corresponding direction".

The coupling lens 15 is configured to make the beam of light emitted by the light source 14 into a substantially parallel beam of light. The aperture plate 16 has an aperture portion configured to define a size of the beam of light that has passed through the coupling lens 15. The cylindrical lens 17 is configured to focus the beam of light from the aperture portion of the aperture plate 16 near a deflecting/reflecting surface of the polygon mirror 13 via the reflecting mirror 18, with respect to the sub-scan corresponding direction.

A pre-deflector optical system includes the coupling lens 15, the aperture plate 16, the cylindrical lens 17, and the reflecting mirror 18. The polygon mirror 13 may have a radius of 18 mm of an inscribed circle, with each mirror providing a deflecting/reflecting surface. The polygon mirror 13 is configured to deflect the light beam from the reflecting mirror 18 while rotating at a constant velocity about an axis parallel to the sub-scan corresponding direction.

The deflector-side scanning lens 11a is disposed on an optical path of the light beam deflected by the polygon mirror 13. The image-side scanning lens 11b is disposed on an optical path of the light beam that has passed the deflector-side scanning lens 11a. The light beam that has passed through the image-side scanning lens 11b irradiates the surface of the photosensitive drum 1030, forming an optical spot. The optical spot moves along the longitudinal direction of the photosensitive drum 1030 as the polygon mirror 13 rotates, thus scanning the surface of the photosensitive drum 1030. The direction of movement of the optical spot corresponds to the main-scan direction. The direction of rotation of the photosensitive drum 1030 corresponds to the sub-scan direction.

A scanning optical system includes the deflector-side scanning lens 11a and the image-side scanning lens 11b. Preferably, at least one folding mirror may be disposed in the optical path between the deflector-side scanning lens 11a and the image-side scanning lens 11b, and the optical path between the image-side scanning lens 11b and the photosensitive drum 1030.

Surface-Emitting Laser

Figure 5B:
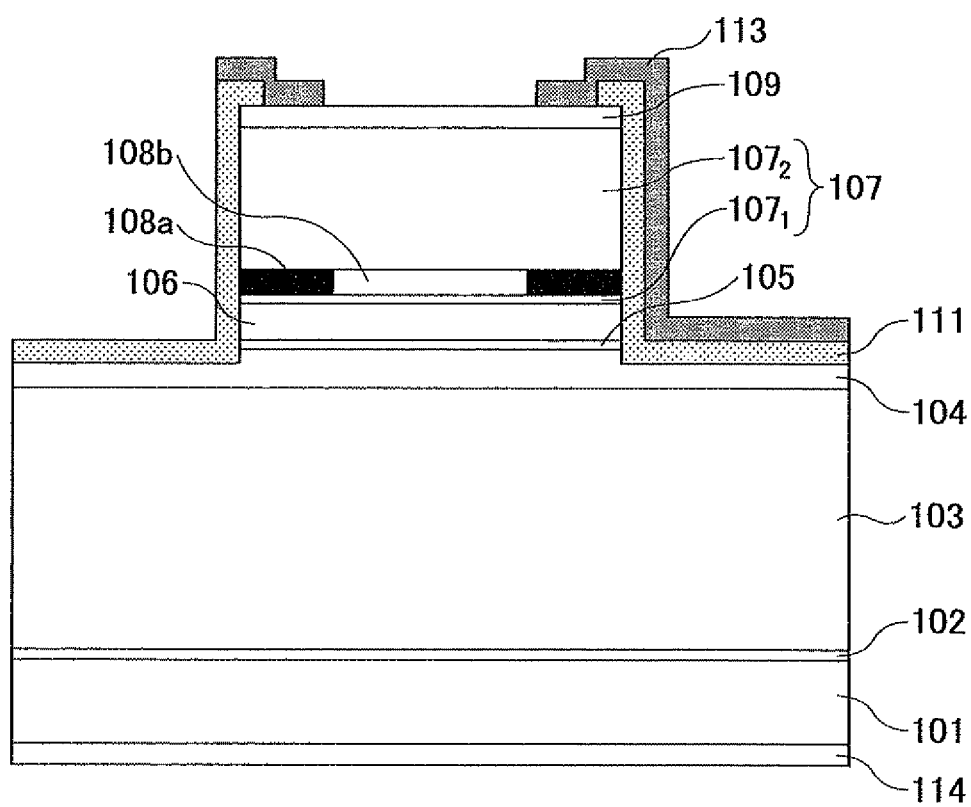
FIG. 5B is a cross section of the surface-emitting laser taken in an Z-Y plane.

The light source 14 may include a surface-emitting laser 100 illustrated in FIGS. 5A and 5B. In the present disclosure, a direction in which laser oscillation occurs is defined as the Z-axis direction, and the two directions perpendicular to each other in a plane perpendicular to the Z-axis direction are defined as the X-axis direction and the Y-axis direction. FIG. 5A is a cross section of the surface-emitting laser 100 parallel to an X-Z plane. FIG. 5B is a cross section of the surface-emitting laser 100 parallel to a Y-Z plane.

Figure 6B:
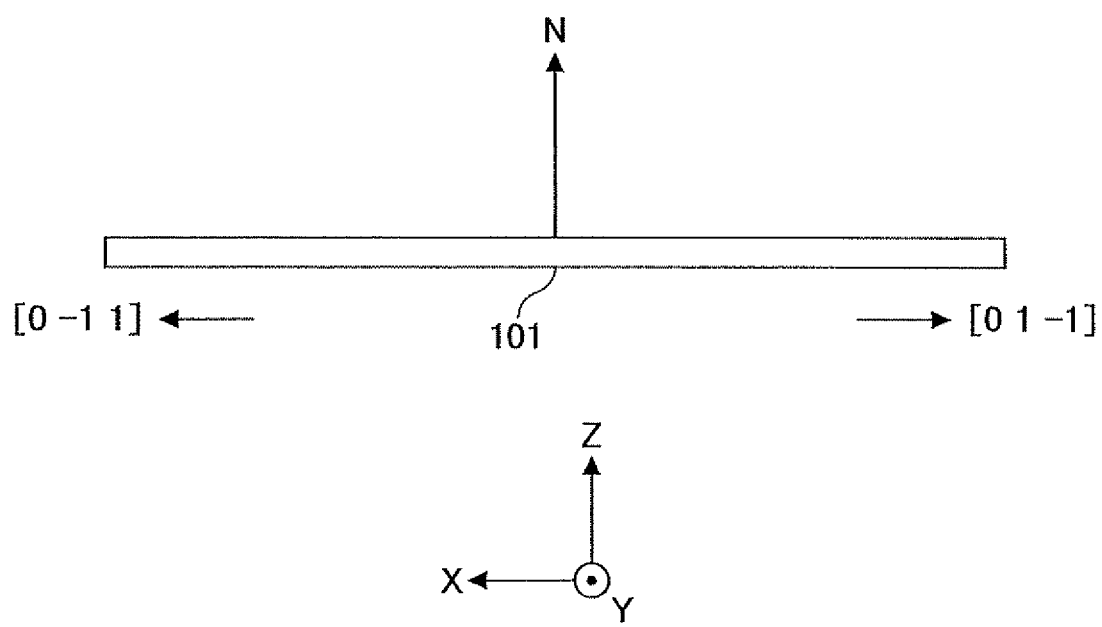
FIG. 6B illustrates the inclined substrate seen from the Y direction.

The surface-emitting laser 100 has an oscillation wavelength of a 780 nm band. The surface-emitting laser 100 includes a substrate 101; a buffer layer 102; a lower semiconductor DBR 103; a lower spacer layer 104; an active layer 105; an upper spacer layer 106; an upper semiconductor DBR 107; and a contact layer 109. The substrate 101 may include a n-GaAs single crystal substrate having a mirror-polished surface. As illustrated in FIG. 6A, the normal N to the mirror-polished surface (principal surface) is inclined with respect to the direction of a crystal orientation [1 0 0] by 15 degrees ($\theta=15°$) toward a crystal orientation [1 1 1]A. Namely, the substrate 101 is an inclined substrate. As illustrated in FIG. 6B, the direction of a crystal orientation [0 –1 1] corresponds to the +X direction, and the direction of a crystal orientation [0 1 –1] corresponds to the –X direction.

Referring back to FIGS. 5A and 5B, the buffer layer 102 is stacked on the +Z side of the substrate 101 and comprises n-GaAs. The lower semiconductor DBR 103 is stacked on the +Z side of the buffer layer 102 and comprises 40.5 pairs of low-refractive index layers of n-$Al_{0.9}Ga_{0.1}As$ and high-refractive index layers of n-$Al_{0.3}Ga_{0.7}As$. Between the refractive index layers, graded composition layers of thickness 20 nm are provided in which the composition is gradually varied from one composition to the other in order to reduce electric resistance. Each refractive index layer has an optical thickness of $\lambda/4$ including ½ of an adjacent graded composition layer, where $\lambda$ is an oscillation wavelength. When the optical thickness is $\lambda/4$, an actual thickness D of the layer is $\lambda/4n$ (where n is the refractive index of the medium of the layer).

The lower spacer layer 104 is stacked on the +Z side of the lower semiconductor DBR 103 and includes a non-doped $(Al_{0.1}Ga_{0.9})_{0.5}In_{0.5}P$ layer. The active layer 105 is stacked on the +Z side of the lower spacer layer 104 and has a multiple quantum well structure of GaInAsP/GaInP. The quantum-well layer comprises a mixed crystal of GaInP into which As is introduced in order to obtain an oscillation wavelength of the 780 nm band. The quantum-well layer may have a compression strain of 0.7%. The composition of the quantum-well layer is selected such that the oscillation wavelength at a CW oscillation threshold current in an edge LD (laser diode) structure is equal to the oscillation wavelength of the surface-emitting laser 100. Specifically, the PL (photoluminescence) wavelength is adjusted to be 770 nm in view of the difference (about 10 nm) from the edge LD oscillation wavelength. In this case, when the oscillation wavelength of the resonator is 780 nm, the temperature at which the threshold current is minimized (hereafter referred to as the "threshold-current-minimizing temperature") is 25° C., and the amount of detuning is 0 nm. The threshold-current-minimizing temperature may be set to be equal to or below 60° C. by adjusting the PL wavelength of the active layer depending on the oscillation wavelength, the, which corresponds to an amount of detuning of 8.4 nm or less.

By introducing a tensile strain of 0.6% in the barrier layer, the bandgap is increased and a high degree of carrier confinement is realized while forming a strain-compensating structure for the quantum-well layer. The inclined substrate 101 and a strain active layer introduce optical anisotropy into the gain of the active layer 105, so that the polarization direction can be aligned in a specific direction (such as the X-axis direction in the illustrated example).

The upper spacer layer 106 is stacked on the +Z side of the active layer 105 and comprises a non-doped $(Al_{0.1}Ga_{0.9})_{0.5}In_{0.5}P$ layer. A resonator structure is formed by the lower spacer layer 104, the active layer 105, and the upper spacer layer 106. The thickness of the resonator structure is set to be equal to the optical thickness of one wavelength. The active layer 105 is disposed at the center of the resonator structure corresponding to an anti-node of the standing wave distribution of an electric field so that a high probability of stimulated emission can be obtained.

The upper semiconductor DBR 107 includes a first upper semiconductor DBR 107₁ and a second upper semiconductor DBR 107₂. The first upper semiconductor DBR 107₁ is stacked on the +Z side of the upper spacer layer 106 and includes a pair of a low-refractive index layer of p-$(Al_{0.7}Ga_{0.3})_{0.5}In_{0.5}P$ and a high-refractive index layer of p-$(Al_{0.1}Ga_{0.9})_{0.5}In_{0.5}P$. Between the refractive index layers, a graded composition layer is provided in which the composition is gradually changed from one composition to the other in order to reduce electric resistance. Each of the refractive index layers has an optical thickness of λ/4 including ½ of the adjacent graded composition layer.

The first upper semiconductor DBR $107_1$ has a greater bandgap energy than the AlGaAs layer and functions as a blocking layer for the electrons injected into the active region. Because the substrate 101 is inclined, defects such as hillocks in the AlGaInP material can be prevented and improved crystallinity can be obtained. Thus, the development of natural superlattice can be prevented, and decrease in bandgap energy can be prevented. Therefore, the first upper semiconductor DBR $107_1$ can maintain a high bandgap energy, thus functioning as a suitable electron blocking layer.

The second upper semiconductor DBR $107_2$ is stacked on the +Z side of the first upper semiconductor DBR $107_1$ and includes 24 pairs of low-refractive index layers of p-$Al_{0.9}Ga_{0.1}As$ and high-refractive index layers of p-$Al_{0.3}Ga_{0.7}As$. Between the refractive index layers, graded composition layers are provided of which the composition is gradually changed from one composition to another in order to reduce electric resistance. Each of the refractive index layers is set to have an optical thickness of λ/4 including ½ of an adjacent graded composition layer.

One of the low-refractive index layers in the second upper semiconductor DBR $107_2$ includes a selectively oxidized layer 108 comprising p-AlAs and having a thickness of 34 nm. The inserted position of the selectively oxidized layer 108 corresponds to the third node from the active layer 105 in the standing wave distribution of an electric field. Thus, the portion that is heated due to the increase in resistance caused by current confinement can be located away from the active layer while maintaining a practical threshold current. Furthermore, thermal resistance can be reduced and localized heating at the central portion can be reduced. In addition, the influence of strain on the active layer due to the selective oxidation of the selectively oxidized layer 108 can be reduced, so that the service life of the device can be increased. The contact layer 109 is stacked on the +Z side of the upper semiconductor DBR 107 and includes p-GaAs.

Figure 7:
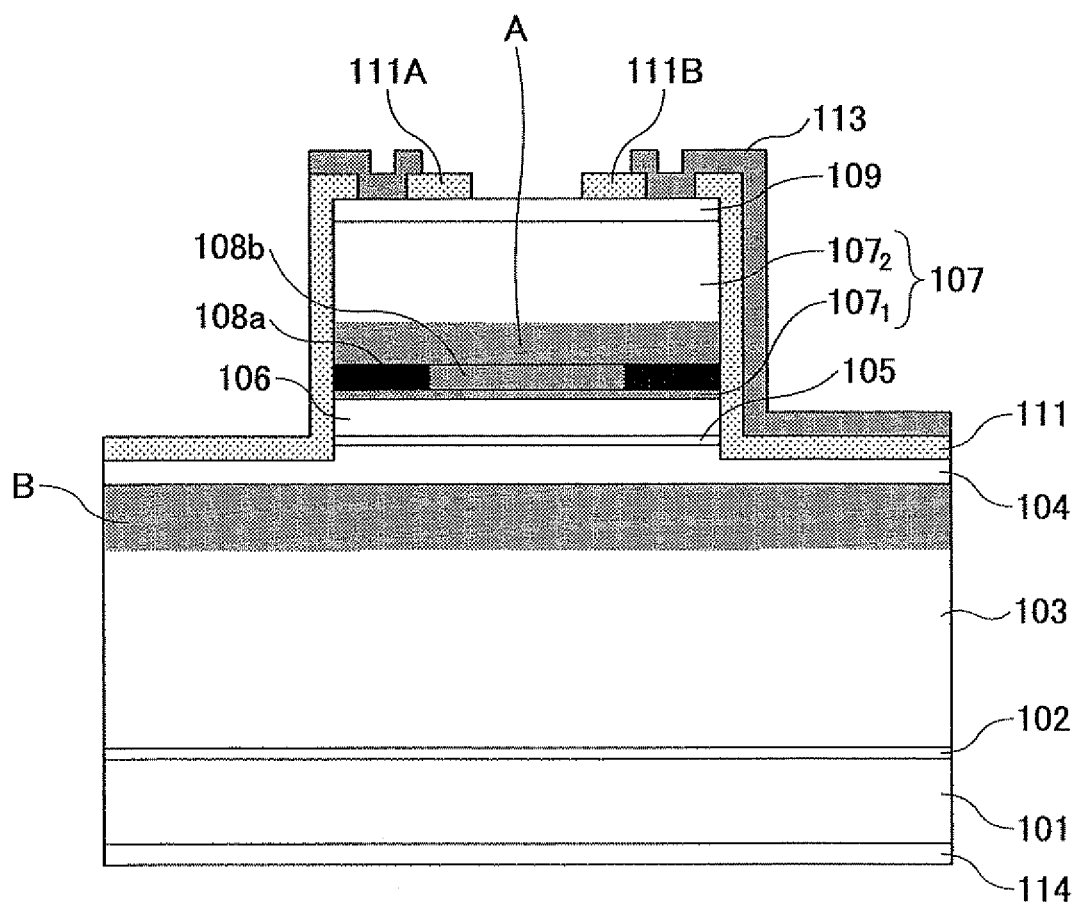
FIG. 7 is a cross section of the surface-emitting laser indicating a low-doping concentration region A.

In a layer (region A in FIG. 7) of the upper semiconductor DBR 107 near the resonator structure, the doping concentration of a p-type dopant is adjusted to be lower than in the other regions. Specifically, in the upper semiconductor DBR 107, the four pairs in a region adjacent the upper spacer layer 106 form a low-doping concentration region having a lower doping concentration than the remaining 20 pairs. More specifically, the doping concentration of the low-doping concentration region may be in a range of about 2.0 to $1.3 \times 10^{18}$ cm$^{-3}$ for the constant composition layers (refractive index layers) and portions corresponding to the anti-nodes of the standing wave distribution, and in a range of $2.0 \times 10^{17}$ to $4.0 \times 10^{18}$ cm$^{-3}$ for portions corresponding to the nodes of the standing wave distribution. For the remaining 20 pairs, the doping concentration in the constant composition layers (refractive index layers) and portions corresponding to the anti-nodes of the standing wave distribution is in a range of $1.0 \times 10^{18}$ to $1.5 \times 10^{18}$ cm$^{-3}$, and the doping concentration of portions corresponding to the nodes of the standing wave distribution is in a range of $4.0 \times 10^{18}$ cm$^{-3}$ or more.

The doping concentrations in the two kinds of the constant layers and the portions corresponding to the anti-nodes of the standing wave need not be the same and may be different within the aforementioned ranges. The doping concentrations in the two kinds of the constant layers and the portions corresponding to the anti-nodes and the nodes of the standing wave need not be the same in all of the periods of the low-concentration region but may vary from one period to another. Specifically, portions near the spacer layer of the low-doping concentration region that have greater optical standing wave intensities may have lower concentrations so that free carrier absorption can be effectively reduced.

In plural layers (region B in FIG. 7) of the lower semiconductor DBR 103 near the resonator structure, the doping concentration of an n-type dopant is reduced compared to the other regions. Specifically, in the lower semiconductor DBR 103, four pairs in a region adjacent the lower spacer layer 104 form a low-doping concentration region having a lower doping concentration than the remaining 36.5 pairs. More specifically, the doping concentration of the low-doping concentration region may be in a range of 3.0 to $7.5 \times 10^{17}$ cm$^{-3}$ for the constant composition layers (refractive index layers) and portions corresponding to the anti-nodes of the standing wave distribution, and the doping concentration of portions corresponding to the nodes of the standing wave distribution may be in a range of $3.0 \times 10^{17}$ to $1.0 \times 10^{18}$ cm$^{-3}$. For the remaining 36.5 pairs, the doping concentration in the constant composition layers (refractive index layers) and portions corresponding to the anti-nodes of the standing wave distribution may be in a range of 1.0 to $3.0 \times 10^{18}$ cm$^{-3}$, and the doping concentration in portions corresponding to the nodes of the standing wave distribution may be in a range of 1.0 to $5.0 \times 10^{18}$ cm$^{-3}$.

Thus, as in the case of the upper semiconductor DBR 107, loss by free carrier absorption can be effectively reduced. The decrease in absorption loss enables a decrease in the oscillation threshold current and an increase in slope efficiency, so that the device drive current can be reduced. In other words, heat generation can be reduced by the decrease in required power.

Next, a method of manufacturing the surface-emitting laser 100 is briefly described. As mentioned above, the substrate 101 on which the plural semiconductor layers are stacked may be referred to as a "stacked body".

Figure 8A:
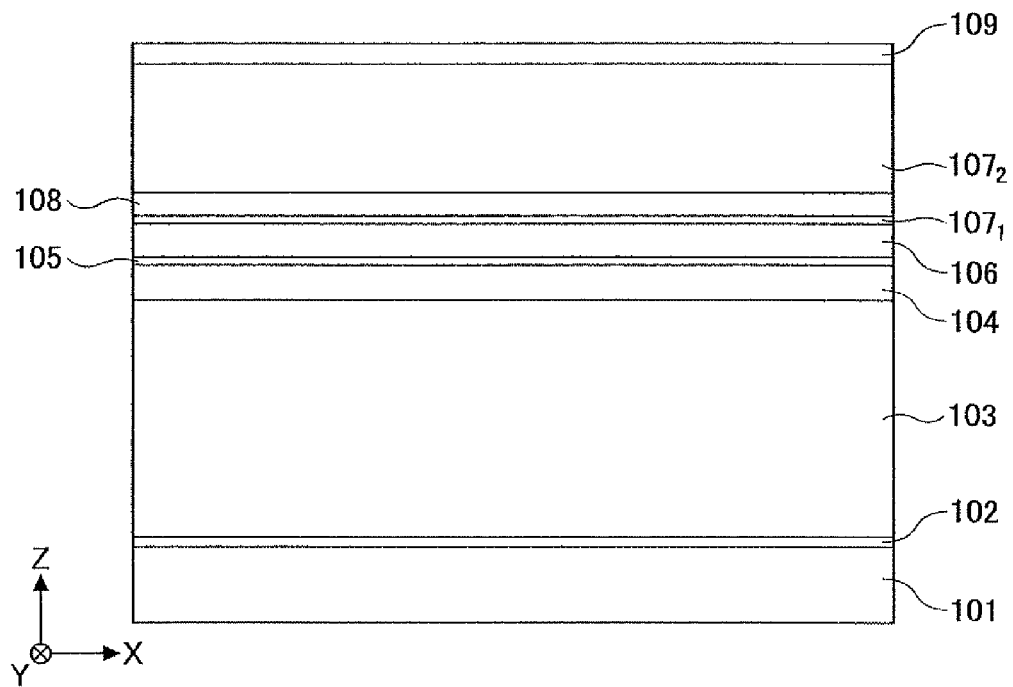
FIG. 8A illustrates a step of a process of manufacturing a surface-emitting laser.

(1) The stacked body is fabricated by a crystal growing process such as metal organic chemical vapor deposition (MOCVD) or molecular beam epitaxy (MBE), as illustrated in FIG. 8A.

In the case of MOCVD, the Group III material may include trimethylaluminium (TMA), trimethylgalium (TMG), or trimethylindium (TMI), and the Group V material may include phosphine ($PH_3$) or arsine ($AsH_3$). The p-type dopant material may include tetrabromomethane ($CBr_4$) or dimethylzinc (DMZn), and the n-type dopant material may include hydrogen selenide ($H_2Se$).

(2) A square resist pattern whose sides are 25 μm in length is formed on the stacked body.

(3) A square column-shaped mesa structure (which may be simply referred to as a "mesa") is formed by ECR etching using $Cl_2$ gas and the resist pattern as a photomask such that an etched bottom is positioned within the lower spacer layer 104.

Figure 8B:
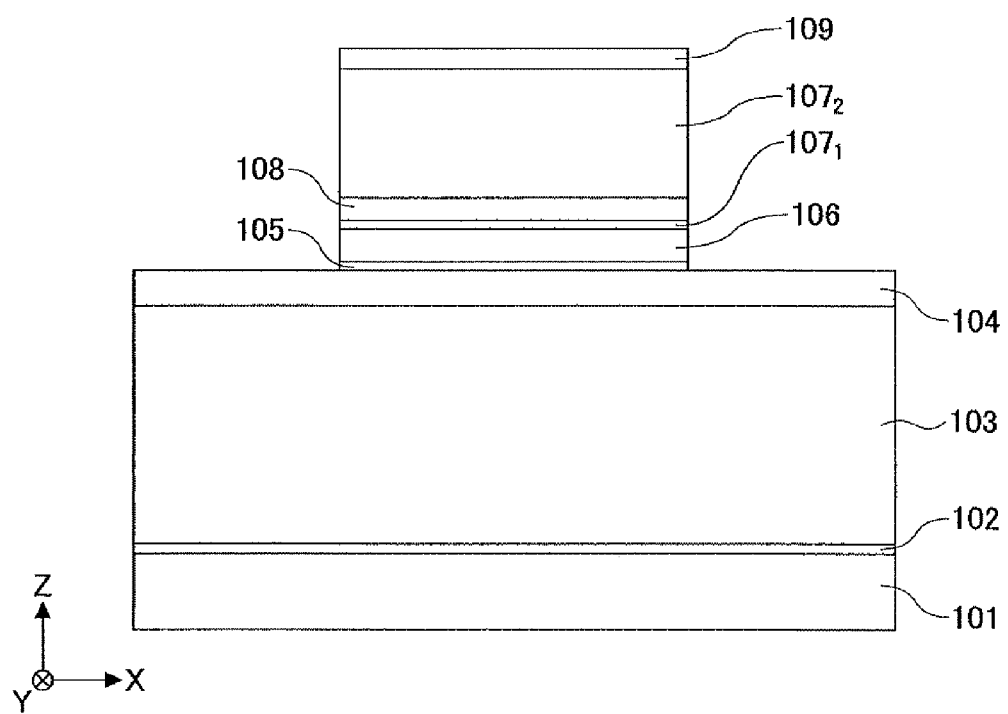
FIG. 8B illustrates another step of the surface-emitting laser manufacturing process.

(4) The photomask is removed (see FIG. 8B).

Figure 8C:
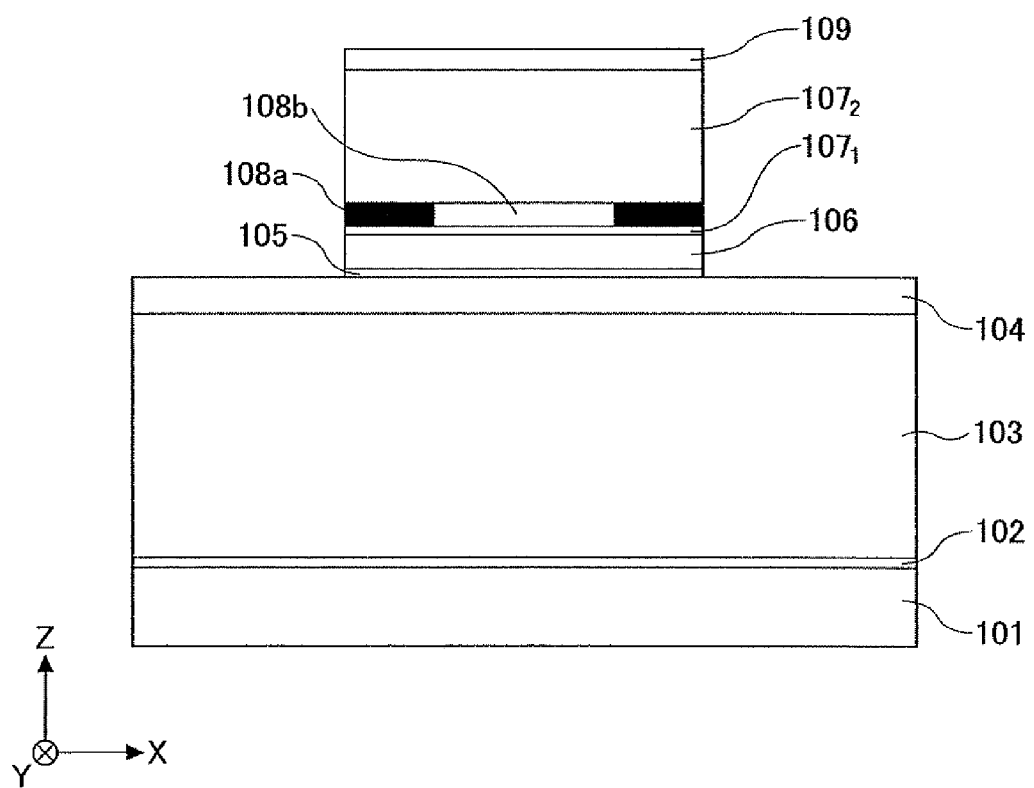
FIG. 8C illustrates another step of the surface-emitting laser manufacturing process.

(5) The stacked body is thermally treated in water vapor atmosphere. Thereby, Al (aluminum) in the selectively oxidized layer 108 is selectively oxidized from the sides of the mesa, leaving a non-oxidized region 108b at the center of the mesa that is surrounded by an Al oxidized layer 108a (see FIG. 8C). Thus, an oxidized confinement structure is formed that limits the passage of the light-emitting portion drive current to the center of the mesa. The non-oxidized region 108b provides a current passage region (current injection region). The current passage region may have a substantially square shape and a width of about 4 μm.

Figure 9A:
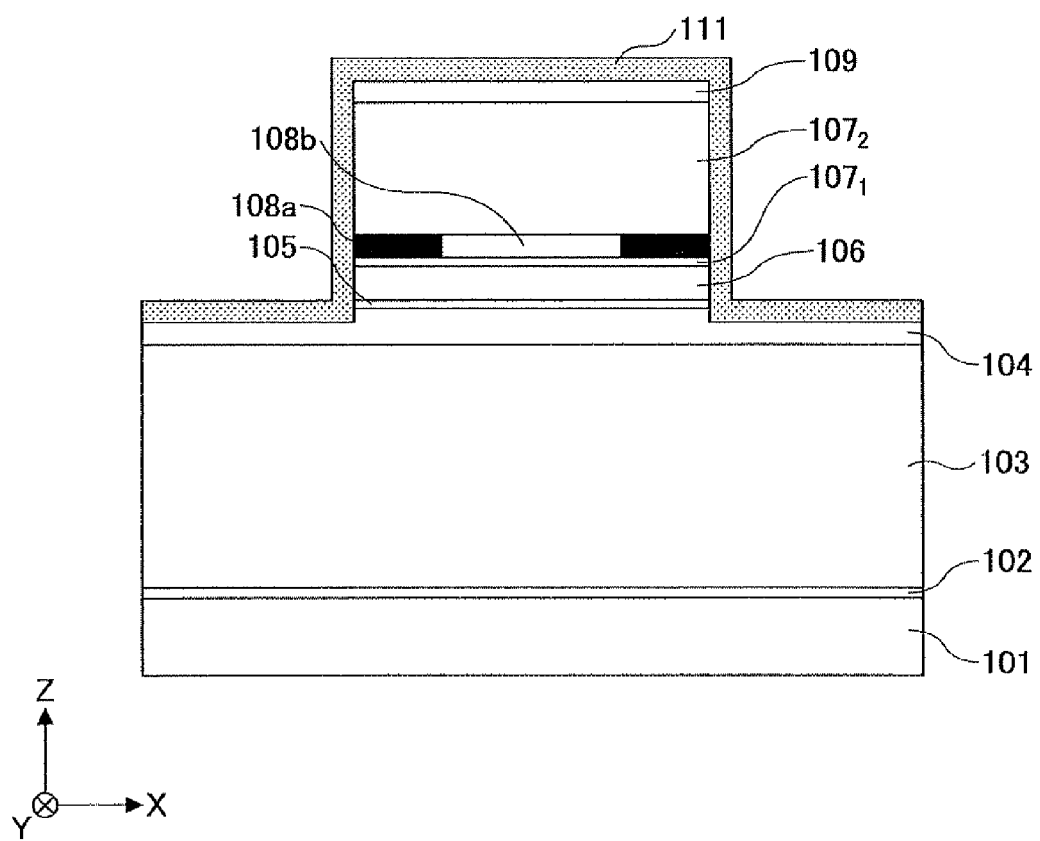
FIG. 9A illustrates another step of the surface-emitting laser manufacturing process.

(6) A protection layer 111 of SiN is formed by chemical vapor deposition (CVD), as illustrated in FIG. 9A. The protection layer 111 may have an optical thickness of λ/4. Specifically, because the refractive index n of SiN is 1.86 and the oscillation wavelength λ is 780 nm, the actual film thickness (=λ/4n) may be set to be about 105 nm.

Figure 9B:
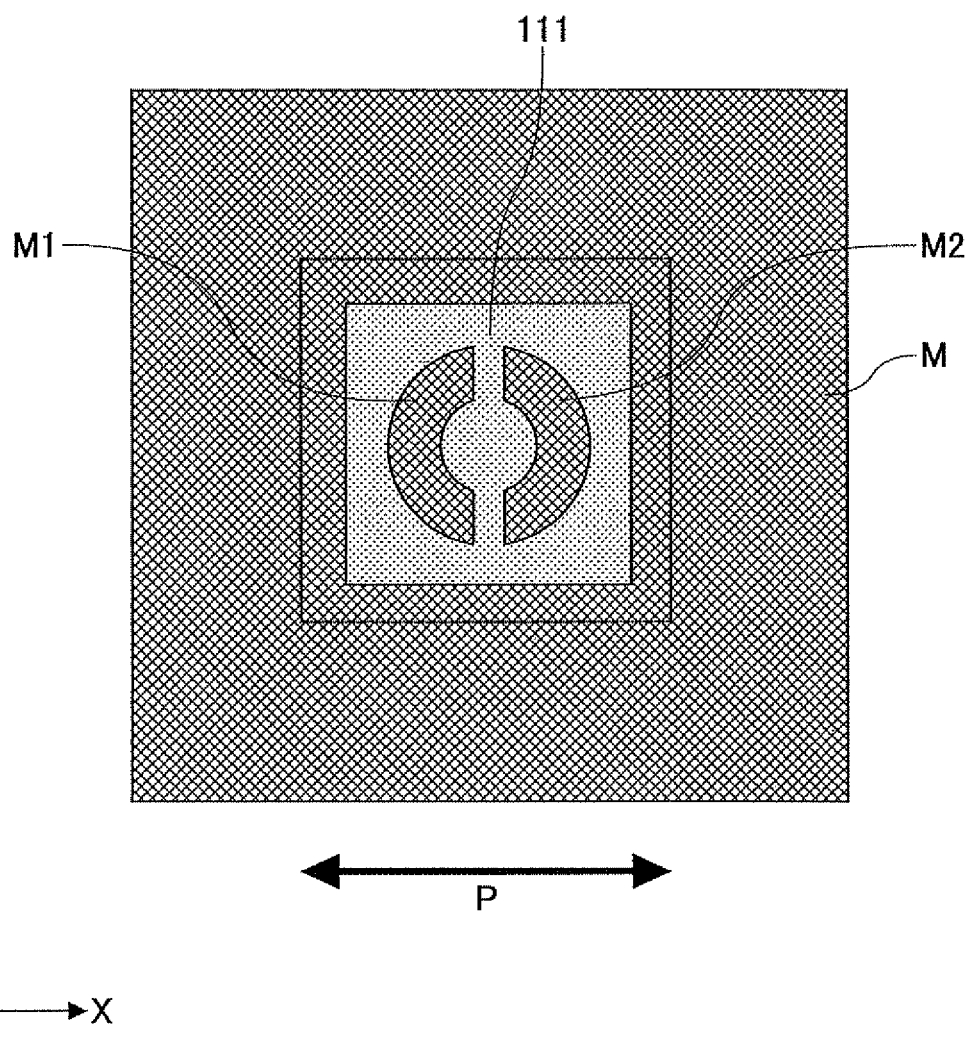
FIG. 9B is a plan view of the surface-emitting laser illustrating an etch mask.
Figure 10:
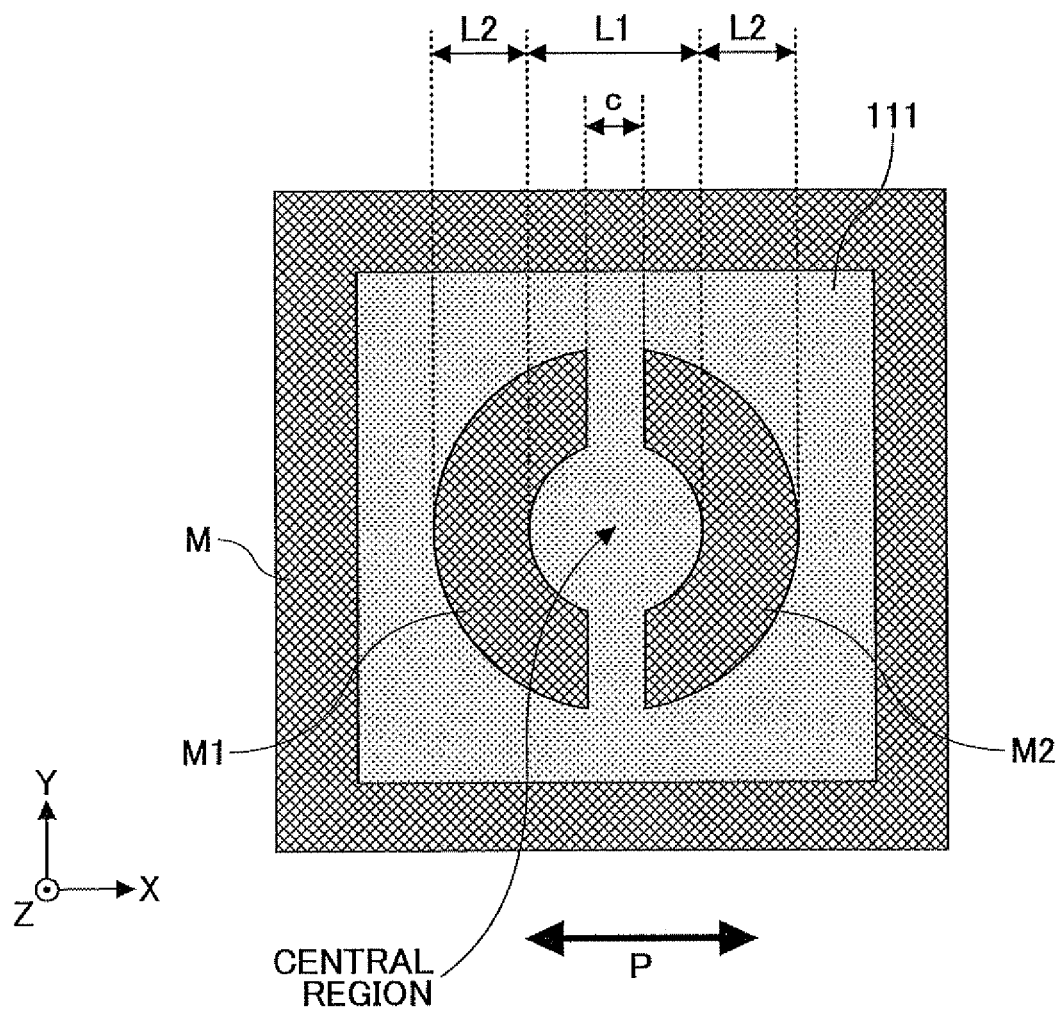
FIG. 10 is an enlarged plan view of a mesa of the surface-emitting laser.

(7) An etching mask M is prepared. The etching mask M is used for forming a window for a P-side electrode contact on top of the mesa where a laser light emitting surface is to be formed. For example, as illustrated in FIG. 9B and FIG. 10 which is an enlarged view of the mesa portion alone of FIG. 9B, the mask M is formed to cover the sides of the mesa, a peripheral area of the top surface of the mesa, and two small regions, i.e., first and second small regions M1 and M2. The first and the second small regions M1 and M2 are opposed to each other with respect to a direction parallel to a desired polarization direction P (such as the X-axis direction) across a central portion of the top surface of the mesa. As illustrated in FIG. 10, the mask M may have measurements such that L1 is 4.5 μm, L2 is 4 μm, and c is 2.2 μm. The first and the second small regions M1 and M2 may be considered as parts of a ring having an external diameter of L1+2L2 and an inner diameter of L1, which is divided in half by a line having the width c parallel to the Y-axis direction and extending through the center of the ring.

(8) The protection layer 111 is etched by BHF in order to form the window for the P-side electrode contact.

Figure 11A:
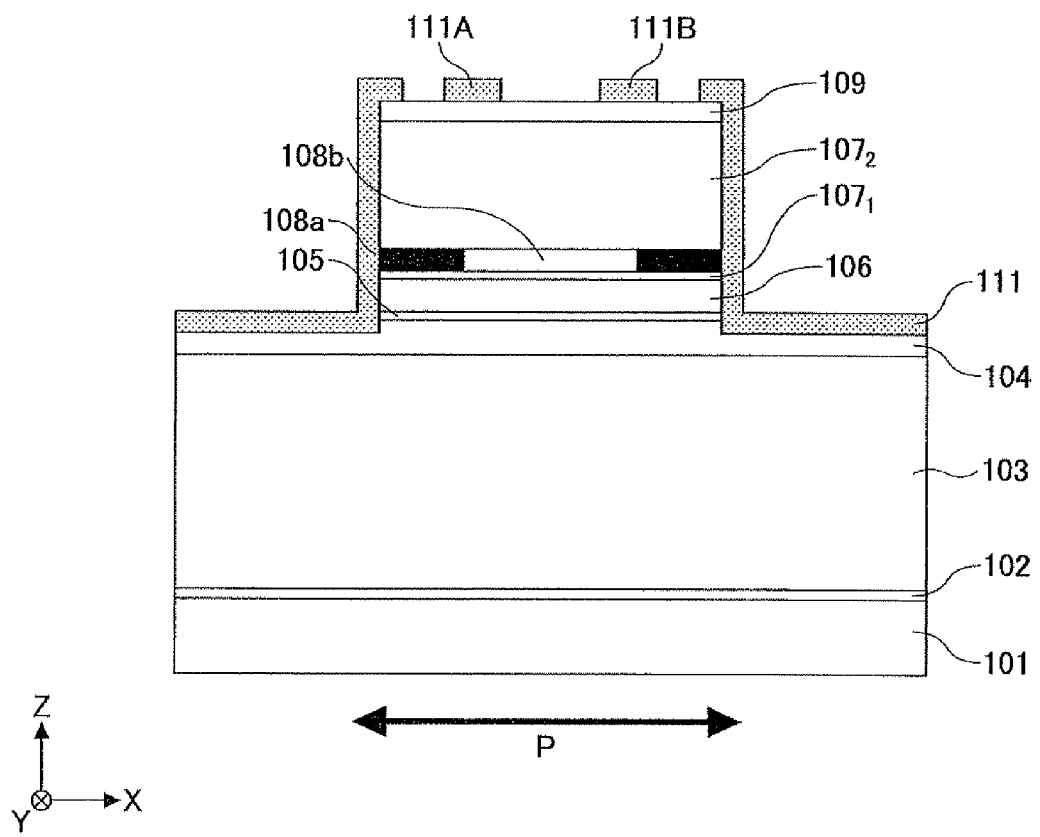
FIG. 11A illustrates another step of the surface-emitting laser manufacturing process.
Figure 11B:
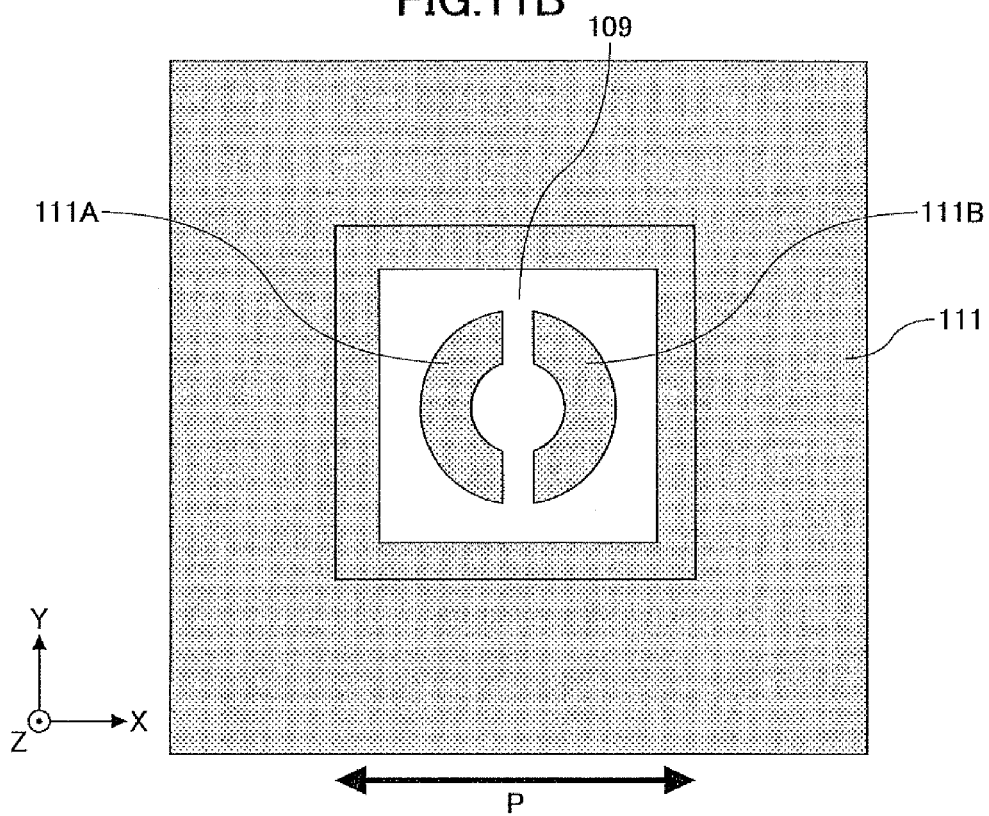
FIG. 11B is a plan view of the surface-emitting laser illustrating a protection layer.

(9) The mask M is removed (see FIGS. 11A and 11B). In the following, the part of the protection layer 111 that remains within the first small region M1 may be referred to as a "transparent layer 111A", and the part of the protection layer 111 that remains within the second small region may be referred to as a "transparent layer 111B".

(10) A square resist pattern whose sides are 10 μm in length is formed in a region at the top of the mesa where the light-emitting portion is to be formed, and a p-side electrode material is vapor-deposited in the region. The p-side electrode material may include a multi-layer film of Cr/AuZn/Au or Ti/Pt/Au.

Figure 11C:
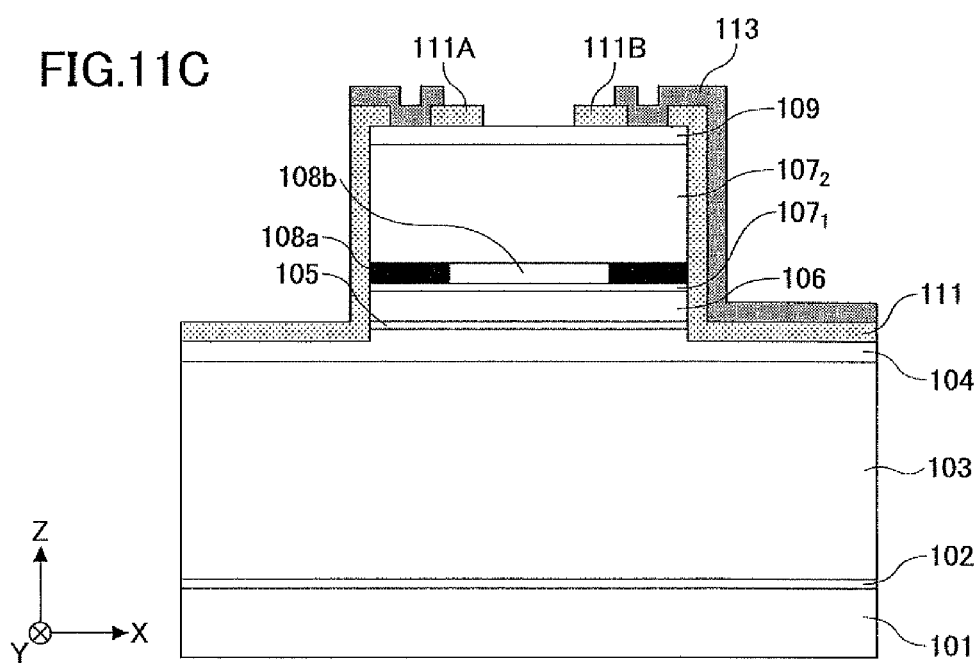
FIG. 11C illustrates another step of the surface-emitting laser manufacturing process.
Figure 12:
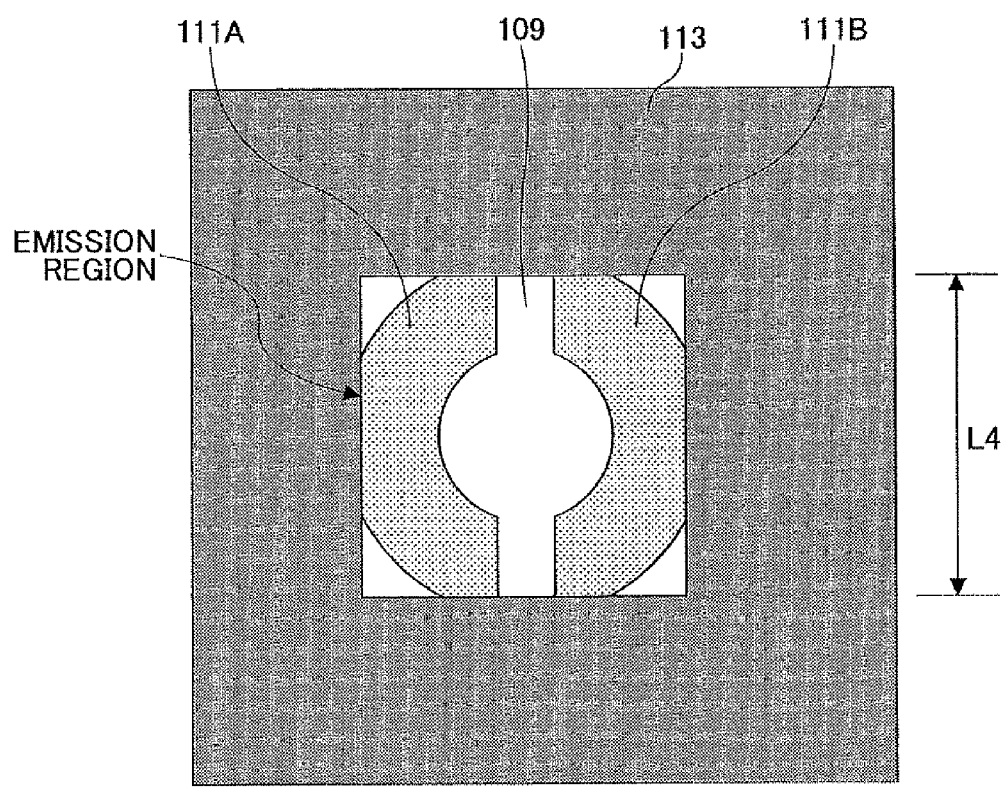
FIG. 12 is an enlarged plan view of the mesa.

(11) The electrode material vapor-deposited in the region for the light-emitting portion (emission region) is lifted off, thereby forming a p-side electrode 113 (see FIG. 11C). A region surrounded by the p-side electrode 113 provides the emission region. FIG. 12 is an enlarged view of the mesa portion of FIG. 11C. The shape of the emission region may be a square whose sides are L4 (such as 10 μm) in length. In accordance with the present embodiment, the transparent layers 111A and 111B exist in the two small regions (corresponding to the first and the second small regions M1 and M2) within the emission region. The transparent layers 111A and 111B are transparent dielectric films of SiN that have an optical thickness of λ/4. Thus, the reflectivity of the two small regions is less than that of the central portion of the emission region.

Figure 13:
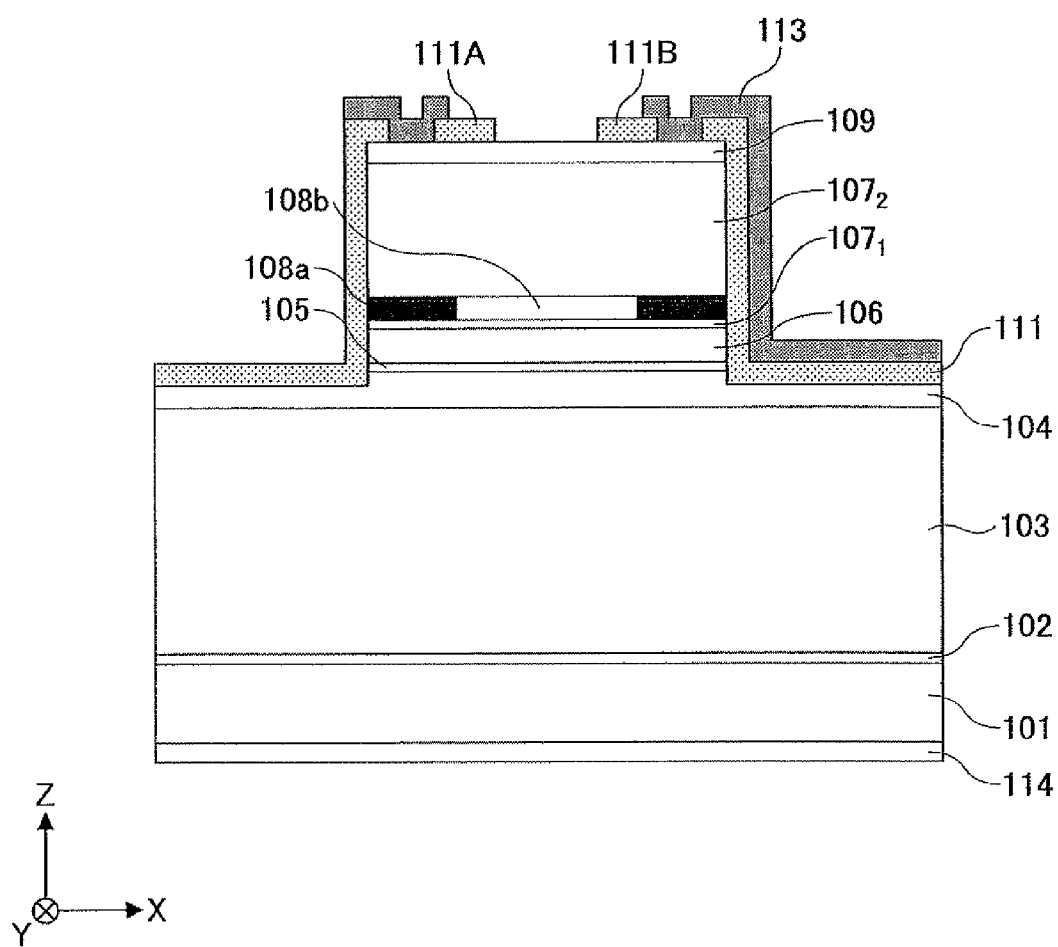
FIG. 13 illustrates another step of the surface-emitting laser manufacturing process.

(12) After the back side of the substrate 101 is polished to a predetermined thickness (such as 200 μm), an n-side electrode 114 is formed (see FIG. 13). The n-side electrode 114 may comprise a multi-layer film of AuGe/Ni/Au.

(13) Annealing is performed to provide ohmic conduction between the p-side electrode 113 and the n-side electrode 114, thereby forming a light-emitting portion.

(14) Individual chips are cut out.

When a surface-emitting laser is supplied with a square-wave current pulse having a pulse period of 1 ms and a pulse width of 500 μs for a target optical output of 1.4 mW, a value calculated by the following expression (1) is referred to as a "negative droop ratio (%)".

$$(P1-P2)/P2 \times 100 \quad (1)$$

where P1 and P2 are optical outputs 10 ns and 1 μs after the start of pulse supply, respectively.

If the output increases over time, the value of the expression (1) becomes negative, which is indicative of the appearance of the "negative droop characteristics". The appearance of the negative droop characteristics indicates that there is an opposite change in optical amount from the normal droop characteristics in a short period of time.

An analysis of image quality of various images formed by plural surface-emitting lasers having different negative droop ratios indicated that, when the negative droop ratio is −10% or more, the outline of an image outputted from the laser printer is at least partially obscured at high frequency when observed with the naked eye. In the surface-emitting laser 100 manufactured by the above-described method, the negative droop ratio was −6%. The surface-emitting laser 100 also provided a single fundamental transverse mode output of 2 mW or more.

Figure 14:
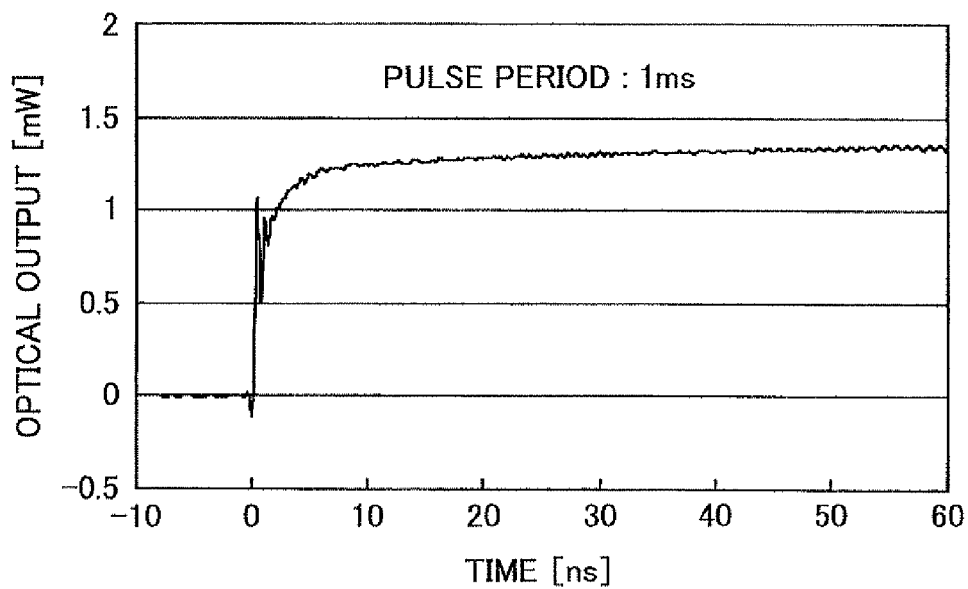
FIG. 14 is a graph of an optical waveform of a conventional surface-emitting laser where the pulse period is long.
Figure 15:
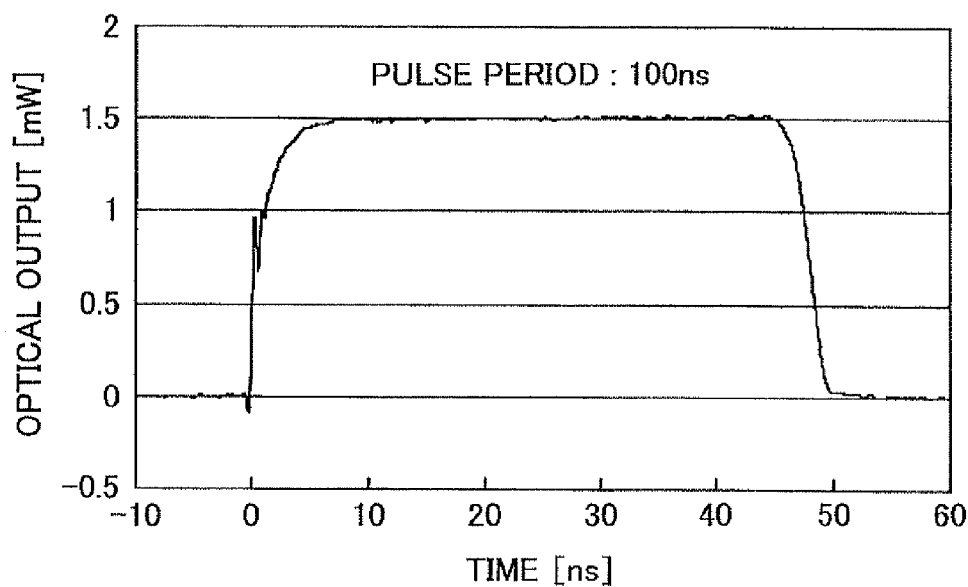
FIG. 15 is a graph of an optical waveform of the conventional surface-emitting laser where the pulse period is short.

The present inventors also conducted a detailed analysis of optical waveforms of conventional surface-emitting lasers having an oxidized confinement structure when driven at various square-wave current pulses. FIG. 14 illustrates an optical waveform in a case where the pulse period was 1 ms and the duty was 50%. FIG. 15 illustrates an optical waveform in a case where the pulse period was 100 ns and the duty was 50%. With regard to the optical waveform of FIG. 14, after the pulse rises, the optical output gradually increases, exhibiting the negative droop characteristics. Even after 60 ns, the optical output does not reach a target value (1.5 mW). On the other hand, in the case of the optical waveform of FIG. 15, the output is stable after the rise of the pulse, exhibiting no negative droop characteristics.

Thus, when the conventional surface-emitting lasers are supplied with square-wave current pulses having the same duty, i.e., the same amount of heat generated, the negative droop characteristics are observed when the pulse period is long and not when the pulse period is short.

Different pulse periods may cause different temperature situations within the surface-emitting laser. Specifically, when the pulse period is long, both the time in which the laser is heated and the time in which the laser is cooled are long, so that the temperature within the surface-emitting laser varies greatly. On the other hand, when the pulse period is short, a continuous cooling time may not be sufficiently obtained and, as a result, the temperature variation inside the surface-emitting laser may be small, so that the laser can be stabilized at a relatively high average temperature. Thus, under the drive conditions such that the negative droop characteristics are observed, the internal temperature of the surface-emitting laser may fluctuate greatly. In other words, it can be considered that the negative droop characteristics are a phenomenon caused by the internal temperature of the surface-emitting laser.

Figure 16:
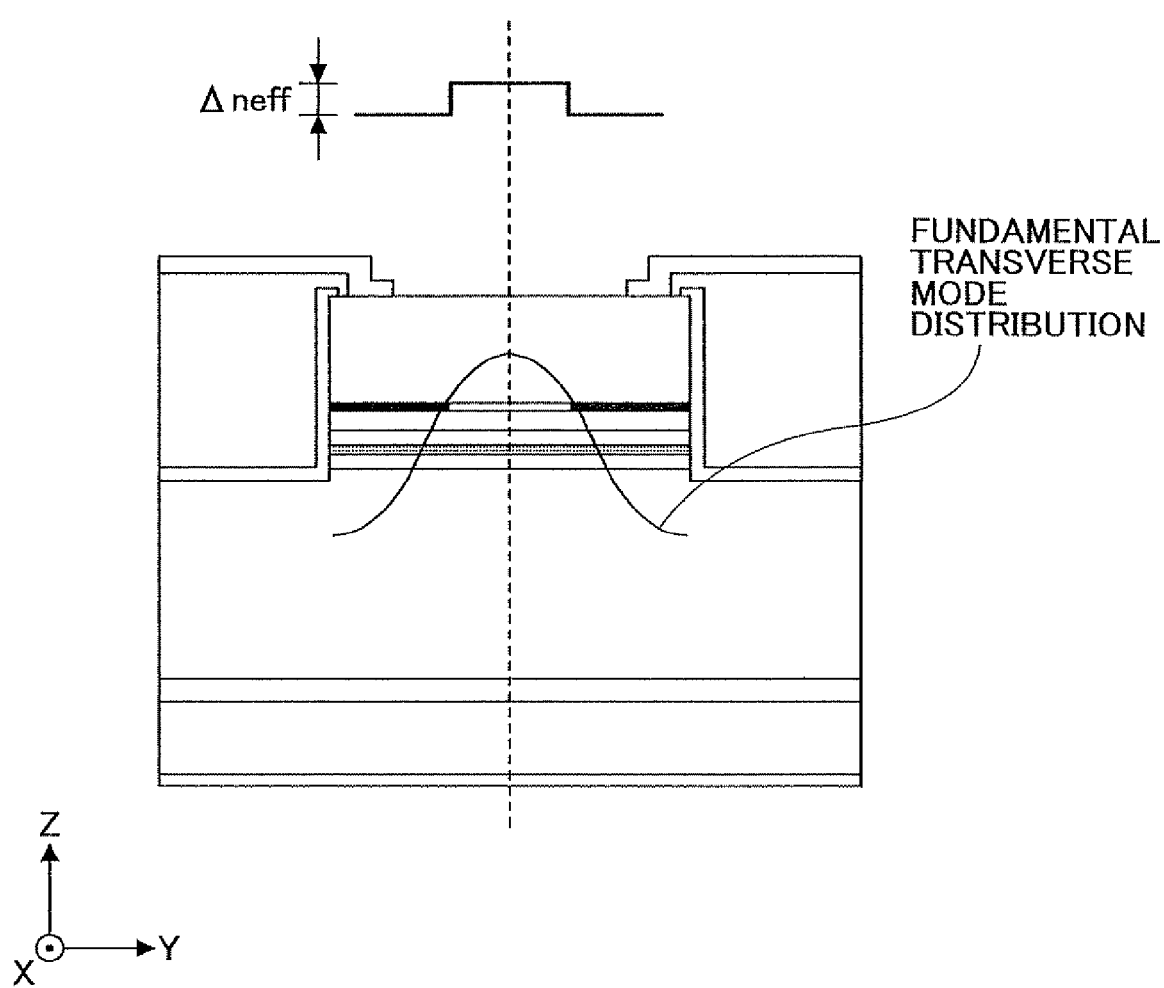
FIG. 16 illustrates a built-in effective refractive index difference Δneff.

The oxidized layer of the oxidized confinement structure has a refractive index of about 1.6, which is less than the refractive index (about 3) of the surrounding semiconductor layer. Thus, inside the surface-emitting laser, there is a so-called built-in effective refractive index difference Δneff in the transverse direction (see FIG. 16).

The effective refractive index difference Δneff causes an oscillation mode, such as the fundamental transverse mode, to be confined in the transverse direction. In this case, the spread of the oscillation mode in the transverse direction is determined by the magnitude of Δneff. Namely, the greater the Δneff, the smaller is the spread of the transverse direction (see FIGS. 17A and 17B).

When a current (drive current) is injected into the surface-emitting laser, the current is concentrated in the mesa central portion. As a result, the temperature around the active layer of the mesa central portion locally increases due to the Joule heat or non-radiative recombination in the active layer region, for example, relative to the peripheral regions. Semiconductor material has such properties that as temperature rises, band-gap energy decreases and refractive index increases. Therefore, when there is a localized temperature increase in the mesa central portion, the refractive index of the central portion increases compared to the peripheral regions, resulting in a stronger optical confinement in the transverse direction.

Figure 17A:
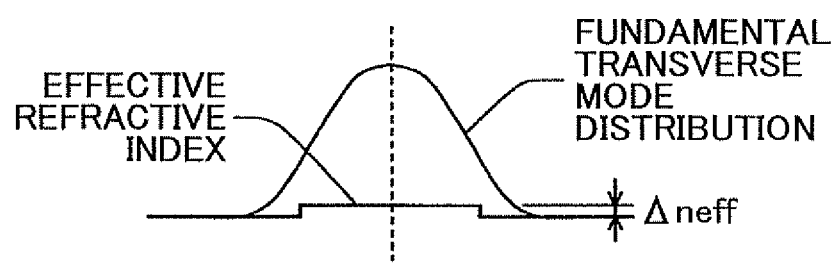
FIG. 17A illustrates a fundamental transverse mode distribution where the built-in effective refractive index difference Δneff is small.
Figure 18A:
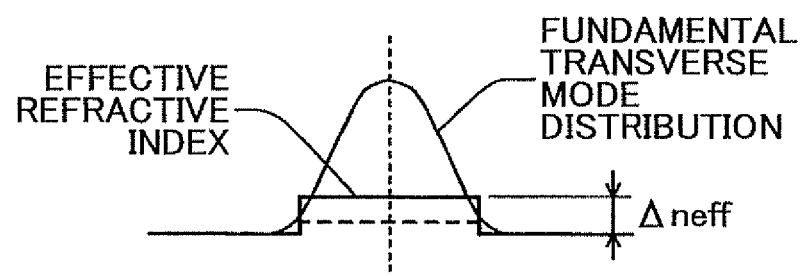
FIG. 18A illustrates the fundamental transverse mode distribution of FIG. 17A when the internal temperature increases.

When the built-in effective refractive index difference Δneff is small as illustrated in FIG. 17A, even if the temperature of the mesa central portion locally increases, the change in the effective refractive index difference Δneff increases, as illustrated in FIG. 18A. As a result, the electric field intensity distribution with respect to the transverse direction of the oscillation mode (which may be hereafter referred to as a "transverse mode distribution") greatly varies. In this case, the overlap between the gain region in which current injection is taking place and the transverse mode increases, so that the optical confinement in the transverse direction becomes stronger. As a result, the optical intensity in the gain region increases, the stimulated emission rate increases, and the threshold current decreases.

Figure 19:
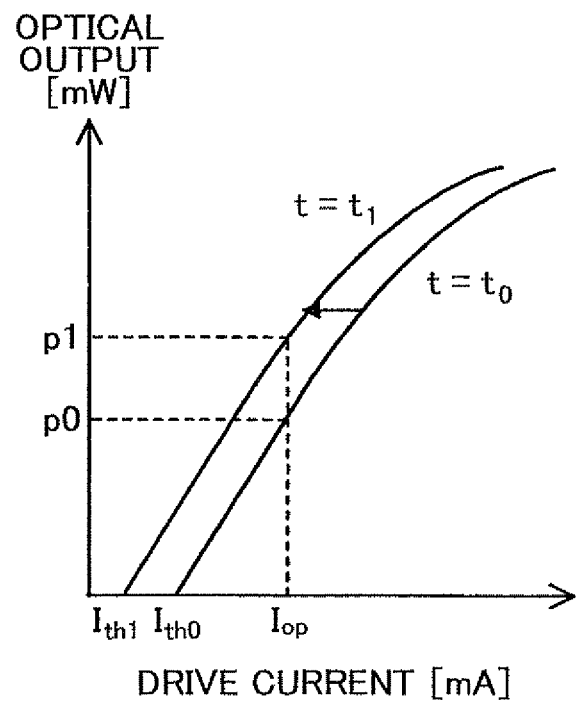
FIG. 19 is a graph illustrating a shift in the I-L curve due to an increase in the internal temperature of a surface-emitting laser having an insufficient optical confinement in the transverse direction at room temperature.

Thus, in a surface-emitting laser in which the built-in effective refractive index difference Δneff is small and the optical confinement in the transverse direction at room temperature is insufficient, the threshold current is reduced by the increase in the internal temperature, thereby improving the I-L characteristics. FIG. 19 illustrates the I-L characteristics that are predicted to be present at time $t=t_0$ before the increase in the internal temperature, and the I-L characteristics that are predicted to be present at time $t=t_1$ when the internal temperature has sufficiently risen after the application of pulse. As the temperature rises, the emission efficiency increases and the threshold current decreases. Thus, the I-L characteristics at t1 are shifted toward the lower current side relative to the I-L characteristics at $t_0$.

Figure 20:
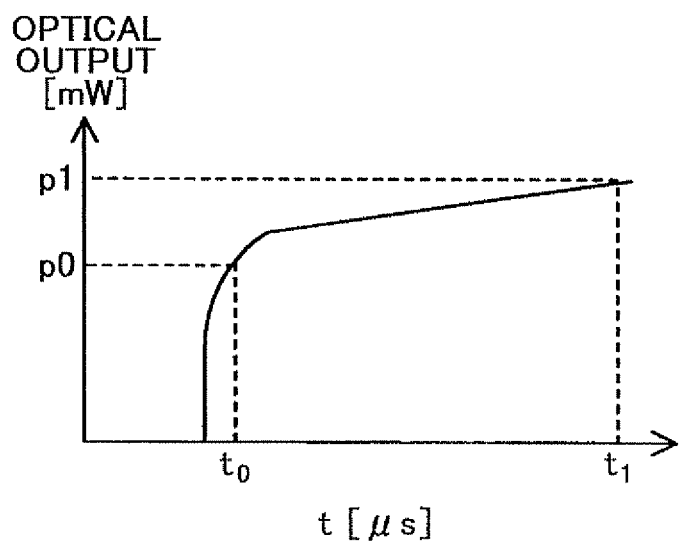
FIG. 20 is a graph illustrating a change in the optical output.

FIG. 20 illustrates a change in optical output upon pulse drive. Because the current value of the drive pulse is constant, the optical output at $t_1$ is greater than the optical output at $t_0$ as the I-L characteristics vary as illustrated in FIG. 19. Thus, the optical output at the same drive current value increases over time, thus resulting in the appearance of the negative droop characteristics.

Figure 17B:
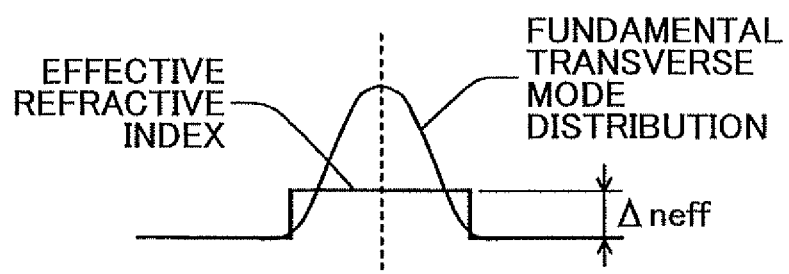
FIG. 17B illustrates a fundamental transverse mode distribution where the built-in effective refractive index difference Δneff is large.
Figure 18B:
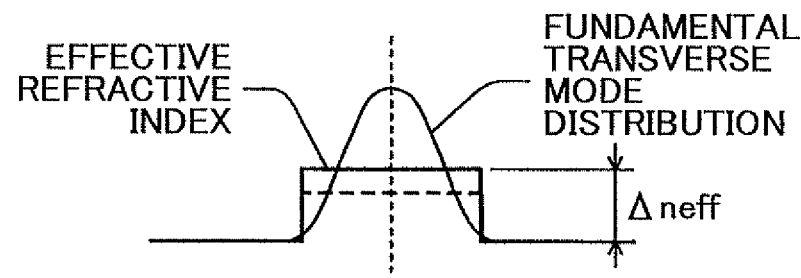
FIG. 18B illustrates the fundamental transverse mode distribution of FIG. 17B when the internal temperature increases.

On the other hand, when the built-in effective refractive index difference Δneff is large as illustrated in FIG. 17B, even when the temperature of the mesa central portion locally increases, the change in the effective refractive index difference Δneff is small, as illustrated in FIG. 18B, so that the transverse mode distribution does not change much.

Thus, when the built-in effective refractive index difference Δneff is large and there is sufficiently large optical confinement in the transverse direction at room temperature, the transverse mode distribution is stabilized even when the internal temperature rises, so that the emission efficiency changes little. In this case, the optical output at the same drive current value is substantially constant over time, and the negative droop characteristics are not observed.

The transverse mode distribution of a surface-emitting laser can be estimated by calculating an electric field intensity distribution using the following Helmholtz equations:

$$\left(\frac{\partial^2}{\partial x^2} + \frac{\partial^2}{\partial y^2} + k_0^2(\varepsilon(x, y) - n_{eff,m}^2)\right)E_m(x, y, z) = 0 \quad (2)$$

$$E_m(x,y,z)=E_m(x,y)\exp(ik_0 n_{eff,m} z) \quad (3)$$

Because it is difficult to analytically solve the above expressions (2) and (3), normally a numerical analysis is performed by a computer using the finite element method. There are various solvers for the finite element method, and commercially available VCSEL simulators (such as Laser MOD from RSoft Design Group) may be used.

As an example, the fundamental transverse mode distribution of a 780 nm band surface-emitting laser is calculated. In the surface-emitting laser used for the calculation, the active layer has a triple quantum well structure of $Al_{0.1}2Ga_{0.88}As/Al_{0.3}Ga_{0.7}As$ having a thickness of 8 nm/8 nm, and the spacer layers comprise $Al_{0.6}Ga_{0.4}As$. The lower semiconductor DBR comprises 40.5 pairs of $Al_{0.3}Ga_{0.7}As$ (high-refractive index layers)/AlAs (low-refractive index layers). The upper semiconductor DBR comprises 24 pairs of $Al_{0.3}Ga_{0.7}As$ (high-refractive index layers)/$Al_{0.9}Ga_{0.1}As$ (low-refractive index layers).

The surface-emitting laser has a columnar mesa shape having a diameter of 25 μm. Mesa etching is performed down to an interface between the lower semiconductor DBR and the lower spacer layer. The etched region is occupied by the atmosphere. Namely, the surface-emitting laser has a simple etched-mesa structure. The diameter of the non-mesa-etched portion of the lower semiconductor DBR is 35 μm, which is the maximum lateral width considered in the calculation. The material of the selectively oxidized layer is AlAs. The selectively oxidized layer is located in the low-refractive index layer having the optical thickness 3λ/4 in the upper semiconductor DBR. More specifically, the position of the selectively oxidized layer corresponds to the third node of the standing wave distribution from the active layer.

The calculation only determines the structurally determined inherent mode distribution without taking into consideration the gain of the active layer or absorption by semiconductor material. In the following, the oxidized layer of the oxidized confinement structure may be simply referred to as "the oxidized layer". The diameter of the current passage region may be referred to as an "oxidized confinement diameter".

Figure 21:
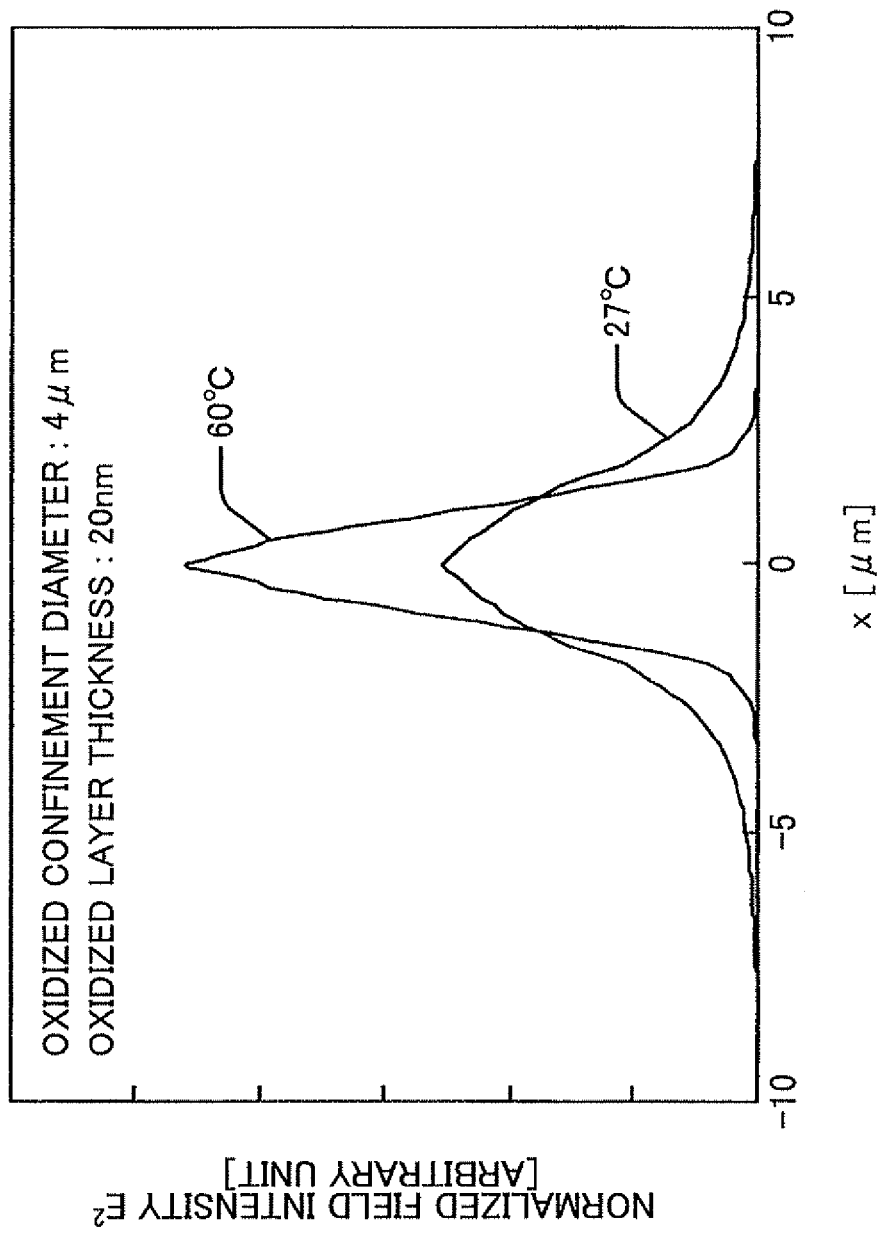
FIG. 21 is a graph illustrating an example of a change in the fundamental transverse mode distribution in response to a temperature change in a current injected portion.
Figure 22:
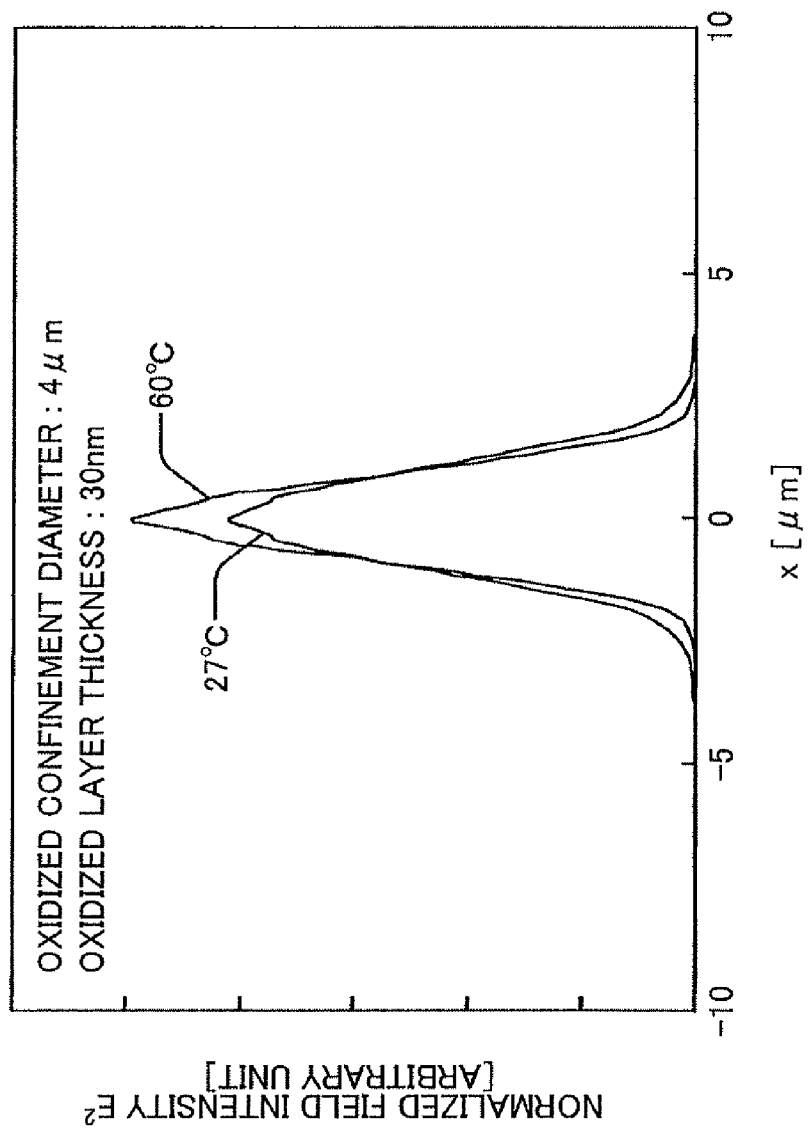
FIG. 22 is a graph illustrating another example of the change in the fundamental transverse mode distribution in response to a temperature change in a current injected portion.

FIG. 21 illustrates the result of calculation of the transverse mode distribution due to the self-heating of a surface-emitting laser structure having an oxidized confinement diameter of 4 μm and a thickness of the selectively oxidized layer of 20 nm. FIG. 22 illustrates the result of calculation of the transverse mode distribution due to the self-heating of a surface-emitting laser structure having an oxidized confinement diameter of 4 μm and a thickness of 30 nm of the selectively oxidized layer. Because it can be expected that the temperature of the current injection region of the active layer would significantly increase in an operated status, the calculation is performed by varying the temperature of the resonator structure. The temperatures indicated in FIGS. 21 and 22 are the temperatures of a heated region indicated in FIG. 23. The temperature of the other regions is 27° C.

FIG. 21 illustrates the case where the thickness of the selectively oxidized layer is small and the optical confinement in the transverse direction is weak. FIG. 22 illustrates the case where the thickness of the selectively oxidized layer is large and the optical confinement is strong. It can be seen from these figures that when the thickness of the selectively oxidized layer is small, the transverse mode distribution greatly changes depending on the self-heating of the laser. When there is the change in the transverse mode illustrated in FIG. 21, the negative droop characteristics appear. The influence of Δneff on the negative droop characteristics has never been known and has been revealed for the first time by the analysis by the present inventors.

Another factor causing a change in the efficiency of the surface-emitting laser due to heating is the amount of detuning. Next, the relationship between the amount of detuning and the negative droop characteristics is described.

In an edge-emitting laser, because a resonator longitudinal mode densely exists, laser oscillation occurs at the peak gain wavelength λg. On the other hand, in a surface-emitting laser, normally the oscillation wavelength corresponds to a single wavelength, so that only the single longitudinal mode can exist in the reflecting band of the semiconductor DBR. Further, because laser oscillation occurs at the resonating wavelength λr, the emission characteristics of the surface-emitting laser depend on the relationship between the resonating wavelength λr and the peak gain wavelength λg of the active layer.

The amount of detuning $\Delta\lambda_0$ is defined by the following expression:

$$\Delta\lambda_0 = \lambda r_0 - \lambda g0 \quad (4)$$

where $\lambda r_0$ is the oscillation wavelength, and $\lambda g_0$ is the peak gain wavelength. The suffix "0" indicates a CW (Continuous Wave) operation below a threshold current at room temperature. Absence of the suffix "0" indicates other operations where, for example, the drive current is equal to or more than the threshold current.

Figure 24A:
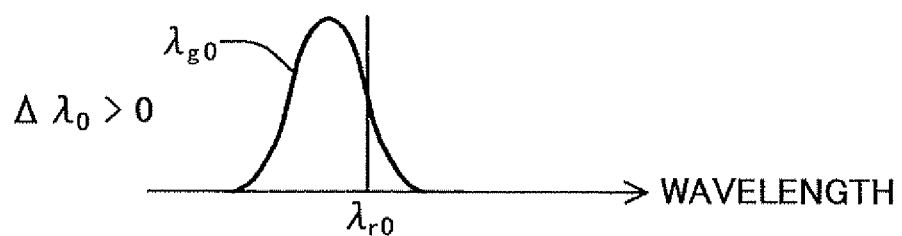
FIG. 24A illustrates the amount of detuning when $\Delta\lambda_0 > 0$.
Figure 24B:
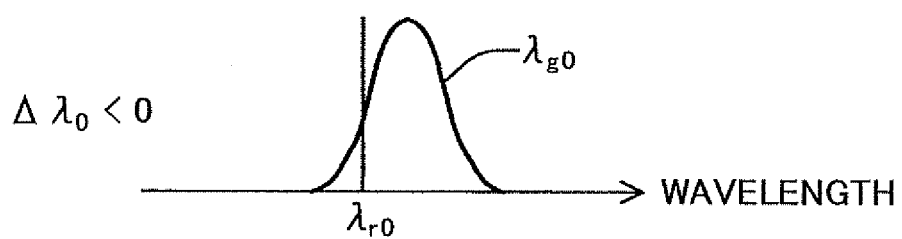
FIG. 24B illustrates the amount of detuning when $\Delta\lambda_0 < 0$.

FIG. 24A illustrates a case where $\Delta\lambda_0 > 0$. FIG. 24B illustrates a case where $\Delta\lambda_0 < 0$.

Because the oscillation wavelength is determined not by the peak gain wavelength but by the resonating wavelength, the laser characteristics of a surface-emitting laser is largely dependent on the sign of $\Delta\lambda_0$ and its value. For example, the threshold current at room temperature tends to increase as the absolute value of $\Delta\lambda_0$ increases.

Generally, the oscillating (emission) efficiency of a surface-emitting laser is the highest when the resonating wavelength and the peak gain wavelength correspond to each other. The resonating wavelength and the peak gain wavelength both change in the longer-wavelength side as the temperature increases. In this case, the change in the resonating wavelength is caused by a change in the refractive index of the material of the resonator structure, while the change in the peak gain wavelength is caused by a change in the bandgap energy of the active layer material. However, the rate of change of the bandgap energy is greater than that of the refractive index by approximately an order of magnitude. The rate of change of the resonating wavelength due to temperature is about 0.05 nm/K, which is substantially negligible. Thus, it can be said that the emission characteristics upon temperature change are mainly determined by the amount of change in the peak gain wavelength.

Thus, in a surface-emitting laser, when the internal temperature (active layer temperature) is increased by a change in injected current, for example, the absolute value of Δλ (degree of detuning) first decreases and then increases in the case of $\Delta\lambda_0 > 0$ (see FIG. 24A). In the case of $\Delta\lambda_0 > 0$, when the threshold current is measured while the device temperature (ambient temperature) is increased from room temperature, the threshold current starts to decrease as the device temperature increases. The threshold current is minimized when the peak gain wavelength corresponds to the oscillation wavelength, and starts to increase as the temperature is further increased. Thus, the threshold-current-minimizing temperature (T_Ith_min) exists above room temperature.

In the case of $\Delta\lambda_0 < 0$ (see FIG. 24B), as the internal temperature (active layer temperature) increases, the absolute value of Δλ simply increases. Therefore, when the threshold current is measured while the device temperature (ambient temperature) is increased from room temperature, the threshold current simply increases as the device temperature increases. In this case, the threshold-current-minimizing temperature (T_Ith_min) exists below room temperature. When the device temperature is decreased from room temperature, the peak gain wavelength Δλg is shifted toward the shorter-wavelength side. Thus, when the threshold current is measured while the device temperature (ambient temperature) is decreased from room temperature, the threshold current starts to decrease and is minimized when the peak gain wavelength and the oscillation wavelength correspond to each other. When the temperature is further lowered, the threshold current starts to increase. Thus, in the case of $\Delta\lambda_0 < 0$, the threshold-current-minimizing temperature exists below room temperature.

Figure 23:
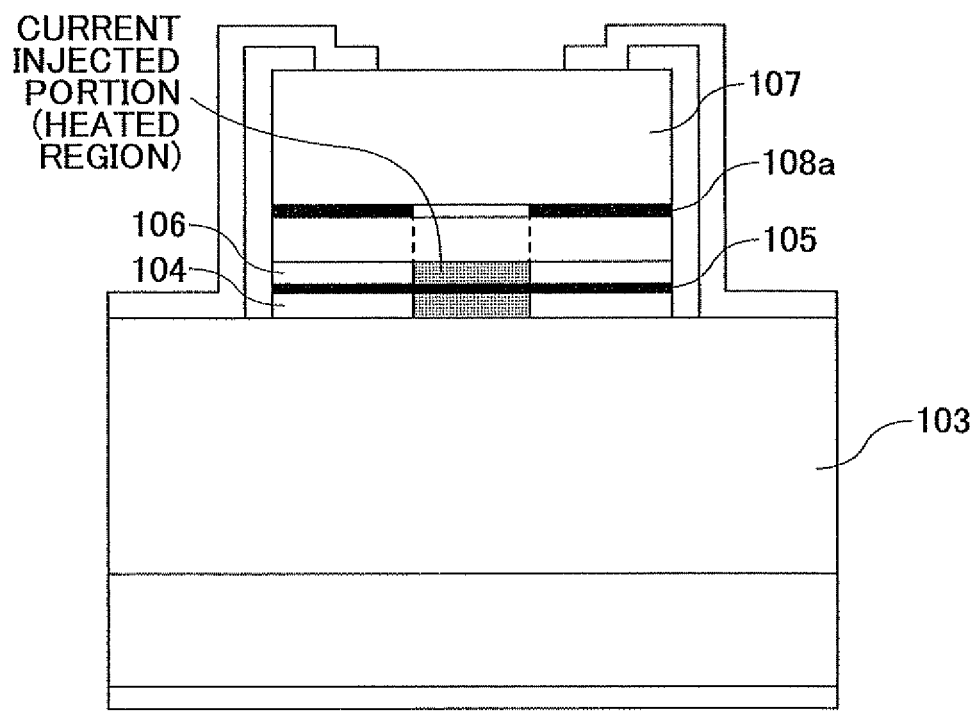
FIG. 23 is a cross section of the surface-emitting laser illustrating a heated region.
Figure 25:
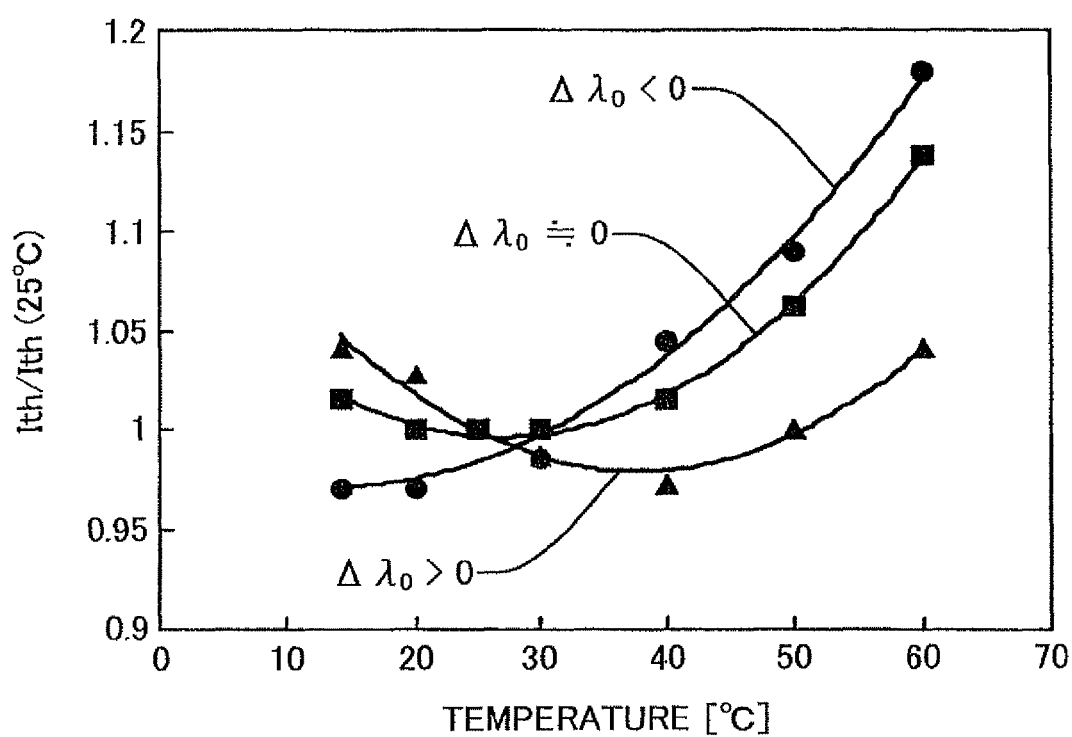
FIG. 25 is a graph illustrating the relationship between an oscillation threshold current and a measured temperature.

FIG. 25 illustrates the result of measuring the oscillation threshold currents of three lasers having different $\Delta\lambda_0$ ($\Delta\lambda_0 < 0$; $\Delta\lambda_0 \approx 0$; and $\Delta\lambda_0 > 0$) while the device temperature (ambient temperature) was changed. The vertical axis of FIG. 23 shows the oscillation threshold current (Ith) at the various temperatures that was normalized by the oscillation threshold current at room temperature of 25° C. (Ith(25° C.)). It can be seen from FIG. 25 that the threshold current is minimized at a temperature below room temperature in the case of $\Delta\lambda_0 < 0$, a temperature near room temperature in the case of $\Delta\lambda_0 \approx 0$, and a temperature above room temperature in the case of $\Delta\lambda_0 > 0$.

In conventional surface-emitting lasers, $\Delta\lambda_0$ is set such that $\Delta\lambda_0 > 0$ so that the threshold current at high temperatures can be reduced, in order to prevent degradation of the emission characteristics in a high temperature and high output operating status. However, when the surface-emitting laser in which $\Delta\lambda_0 > 0$ is driven with a square-wave current pulse, the I-L characteristics are shifted to the lower current side as the internal temperature increases, resulting in a decrease in the threshold current. As a result, the optical output at the same drive current value increases over time; namely, the negative droop characteristics appear. On the other hand, when $\Delta\lambda_0 < 0$, the I-L characteristics are shifted to the higher-current side as the internal temperature increases, so that the optical output does not increase; namely, the negative droop characteristics do not appear.

In order to set $\lambda_0$ to a desired value, the peak gain wavelength $\lambda g_0$ must be known. In an edge-emitting laser, because the oscillation wavelength corresponds to the peak gain wavelength, the peak gain wavelength can be known from the resonating wavelength. However, in the case of a surface-emitting laser, the oscillation wavelength is structurally determined, so that it is difficult to estimate the peak gain wavelength. Thus, either of the following two methods may be used: (1) an edge-emitting laser having the same active layer is fabricated, and the peak gain wavelength is estimated from the oscillation wavelength at room temperature; or (2) a double-hetero structure having the same active layer is fabricated, and the peak gain wavelength is estimated from the photoluminescence (PL) wavelength.

For example, when the method (1) is employed, an edge-emitting laser of the oxide film stripe type having the same active layer structure, a stripe width of 40 μm, and a resonator length of 500 μm is fabricated, and the wavelength at the CW-oscillation threshold current at room temperature is used as the peak gain wavelength $\lambda g_0$.

When the method (2) is employed, because the wavelength during laser oscillation is shifted to the longer-wavelength side with respect to the PL wavelength, a proper adjustment is required. Such a wavelength shift may be due to the difference in the process of excitation, such as photoexcitation or current excitation, or the influence of heat generated by a current in the case of current excitation. Generally, the oscillation wavelength of an edge-emitting laser is longer than the PL wavelength $\lambda_{PL}$ by about 10 nm. Thus, the amount of wavelength shift in this case is considered to be 10 nm.

Thus, with respect to the PL wavelength, the expression (4) may be modified into the following expression:

$$\Delta\lambda_0 = \lambda r_0 - \lambda g0 \qquad (5)$$
$$= \lambda r_0 - (\lambda_{PL} + 10)$$
$$= \lambda r_0 - \lambda_{PL} - 10$$

The wavelength shift amount of 10 nm is a general value and may be modified depending on the material system or structure employed. Alternatively, the wavelength shift amount may be substituted by the aforementioned temperature at which the threshold current is minimized.

By appropriately setting $\Delta\lambda_0$ such that device efficiency does not increase when the active layer temperature increases, the negative droop characteristics can be prevented.

Thus, the negative droop characteristics can be effectively controlled by appropriately setting the thickness of the selectively oxidized layer and the amount of detuning. However, increasing the thickness of the selectively oxidized layer to enhance the optical confinement in the transverse direction generally results in limiting the single-mode output. This is due to the fact that by increasing the optical confinement in the transverse direction, the high-order transverse mode is confined and oscillation tends to occur more easily.

When a surface-emitting laser is used as a light source not only for writing in an image forming apparatus but generally, it is desirable to increase the single-mode output as much as possible. Thus, in accordance with the present embodiment, oscillation of the high-order transverse mode is prevented by providing a high-reflectivity region of a transparent dielectric film and a low-reflectivity region on the emission surface of the surface-emitting laser. In this way, a high single-mode output can be obtained while the negative droop characteristics are effectively prevented.

Figure 26:
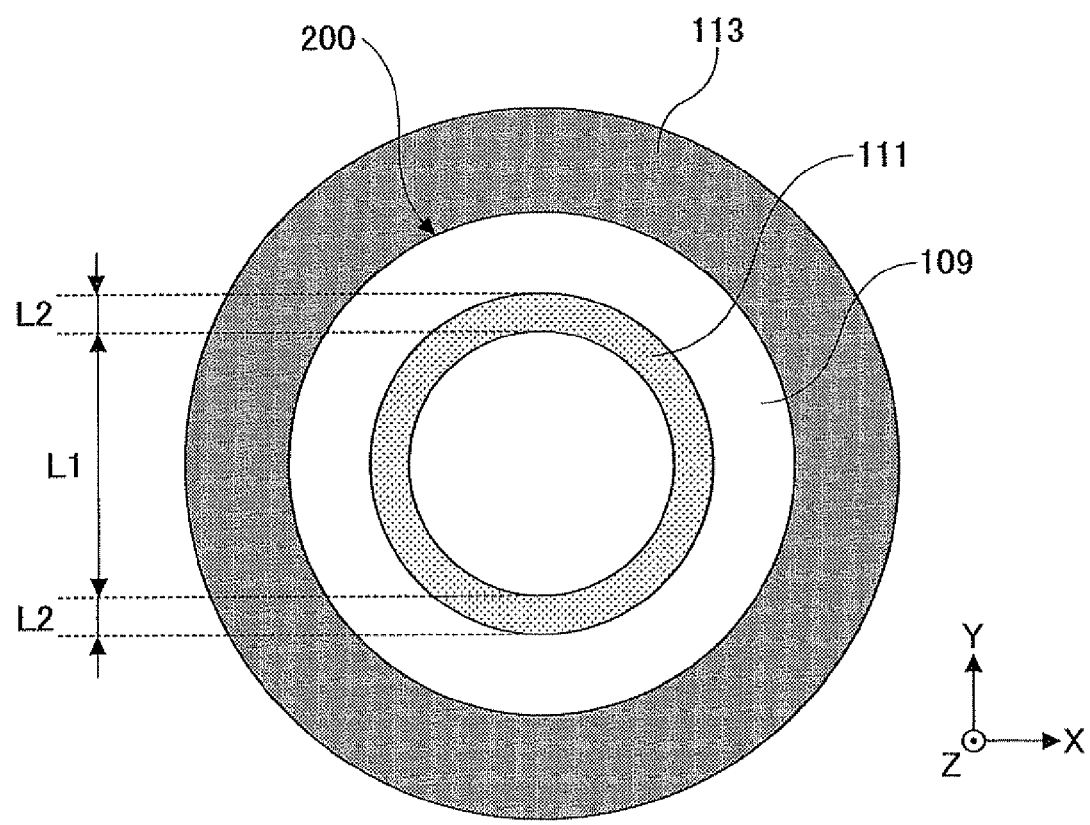
FIG. 26 illustrates a surface-emitting laser used for calculating an oscillation mode distribution.

For example, FIG. 26 illustrates a (theoretical) surface-emitting laser having a circular emission region 200. A central portion of the emission region 200 is surrounded by a ring-shaped low-reflectivity region 111. In the low-reflectivity region 111, a transparent dielectric film (SiN) having an optical thickness of $\lambda/4$ is formed. An oscillation mode distribution was calculated while varying an internal diameter L1 of the low-reflectivity region 111, with a width L2 of the low-reflectivity region fixed to 3 μm. The calculation was based on the assumption that the diameter of the current passage region was 4.5 μm. In FIG. 26, for ease of description and understanding, parts corresponding to the parts of the surface-emitting laser 100 are designated with similar numerals.

Figure 27:
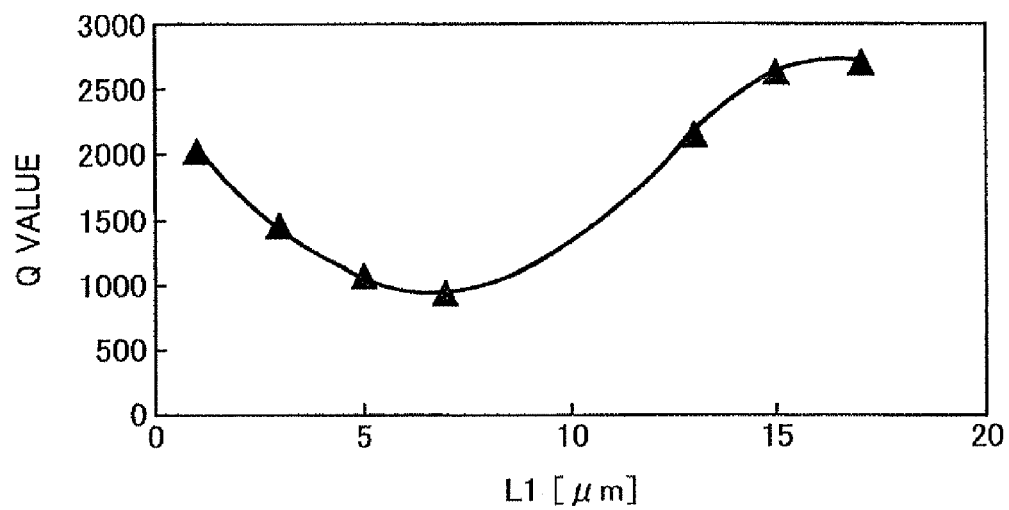
FIG. 27 is a graph illustrating the relationship between an internal diameter L1 of a low-reflectivity region and the Q value in the high-order transverse mode.

FIG. 27 illustrates the relationship between the internal diameter L1 of the low-reflectivity region and the Q value in the high-order transverse mode based on the above calculation. It can be seen from FIG. 27 that as the value of L1 is increased from 1 μm, the Q value decreases greatly.

In many surface-emitting lasers, the central portion mainly corresponds to the oscillation region of the fundamental transverse mode, and the high-order transverse mode has a partial mode distribution in a peripheral portion. The low-reflectivity region may be located at a position corresponding to a part of the oscillation region of the high-order transverse mode so that the reflectivity with respect to the high-order transverse mode can be selectively lowered. Namely, by overlapping the high-optical intensity portion in the high-order transverse mode on the low-reflectivity region, oscillation of the high-order transverse mode can be prevented.

Figure 28:
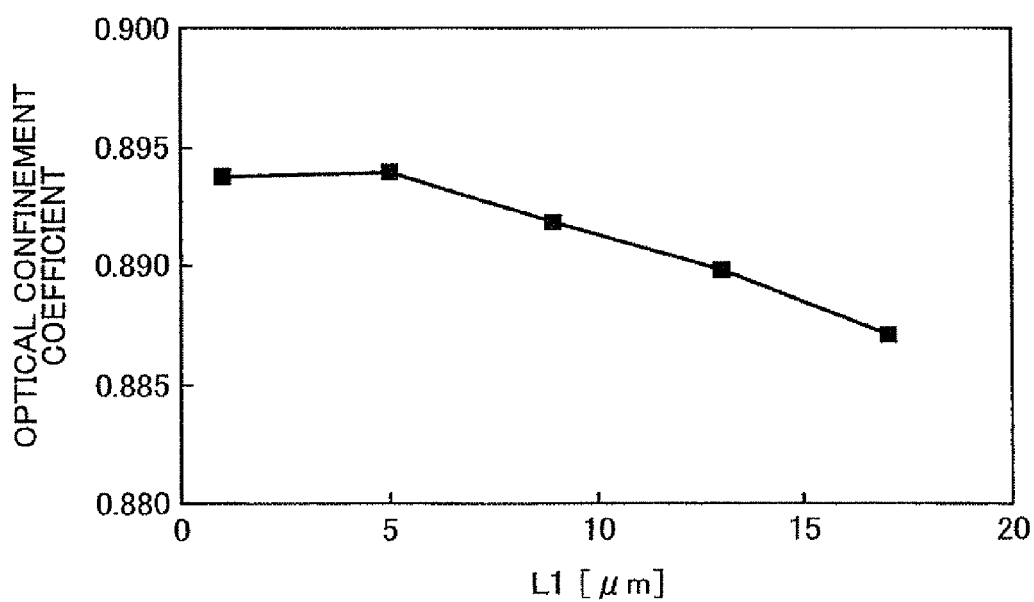
FIG. 28 is a graph illustrating the relationship between the internal diameter L1 of the low-reflectivity region and the optical confinement coefficient in the transverse direction in the fundamental transverse mode.

FIG. 28 illustrates the relationship between the internal diameter L1 of the low-reflectivity region and an optical confinement coefficient in the transverse direction of the fundamental transverse mode determined by the above calculation. It can be seen from FIG. 28 that the optical confinement effect in the transverse direction is strong when the value of L1 is 5 μm or less, and the effect decreases as the value of L1 increases beyond 5 μm. This shows that by providing plural low-reflectivity regions and providing optical anisotropy in the intervals of the low-reflectivity regions, optical anisotropy can be produced in the confinement effect in the transverse direction. As a result, the polarization component in a direction having a strong confinement effect can oscillate more easily than the polarization component in a direction having less confinement effect. In this way, the polarization direction can be controlled to be a direction having a strong confinement effect.

In accordance with the present embodiment, the two low-reflectivity regions having a longitudinal direction in the Y-axis direction are disposed opposite to each other with respect to the X-axis direction. In this case, in the X-axis direction and the Y-axis direction, optical anisotropy is produced in the confinement effect in the transverse direction, so that the optical confinement coefficient of the transverse direction in the Y-axis direction becomes smaller than in the X-axis direction. Thus, oscillation of light polarized in the Y-axis direction is prevented, so that oscillation occurs with the polarization aligned in the X-axis direction.

Figure 29:
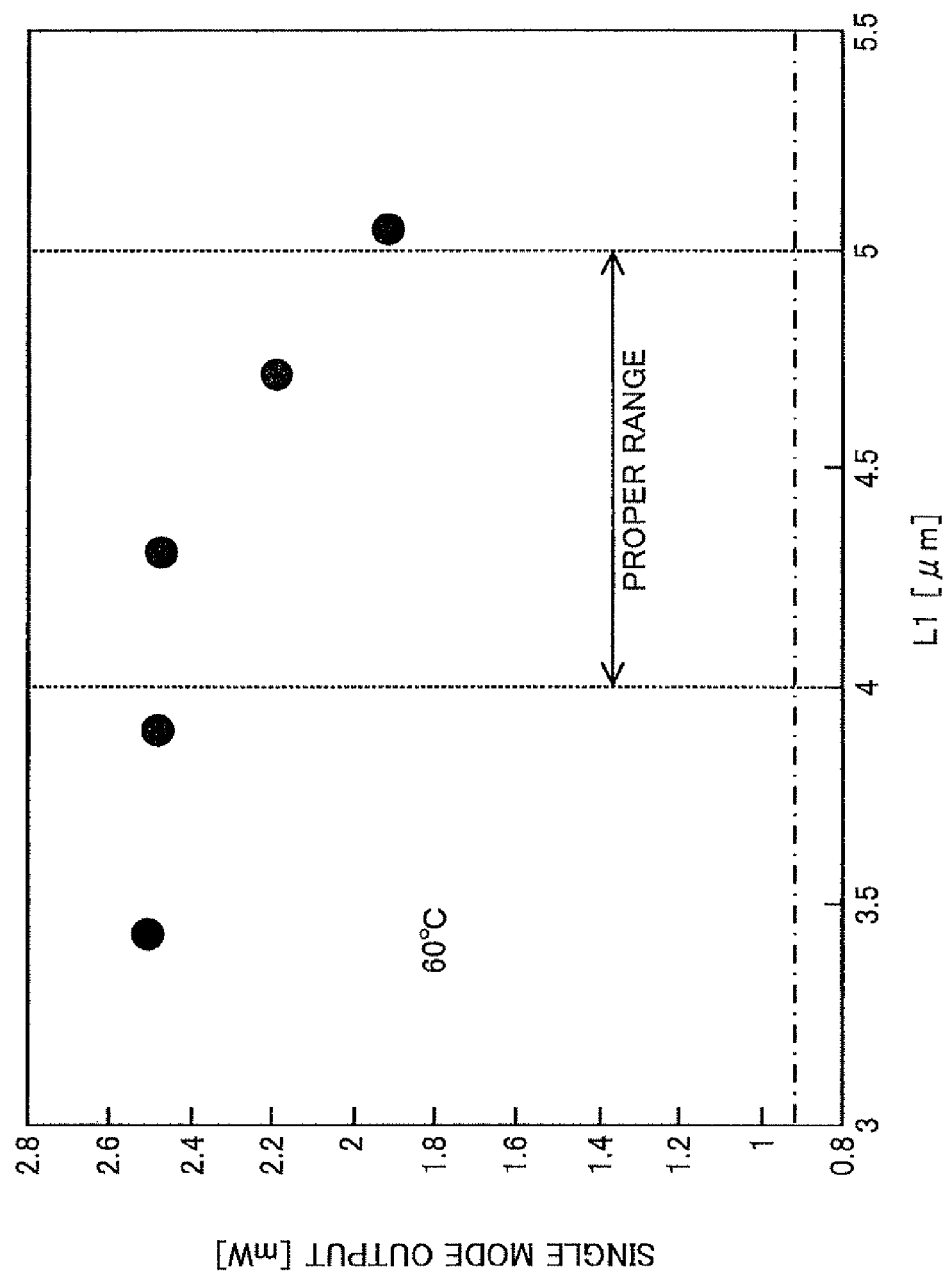
FIG. 29 is a graph illustrating the relationship between a single-mode output and the internal diameter L1 of the low-reflectivity region.
Figure 30:
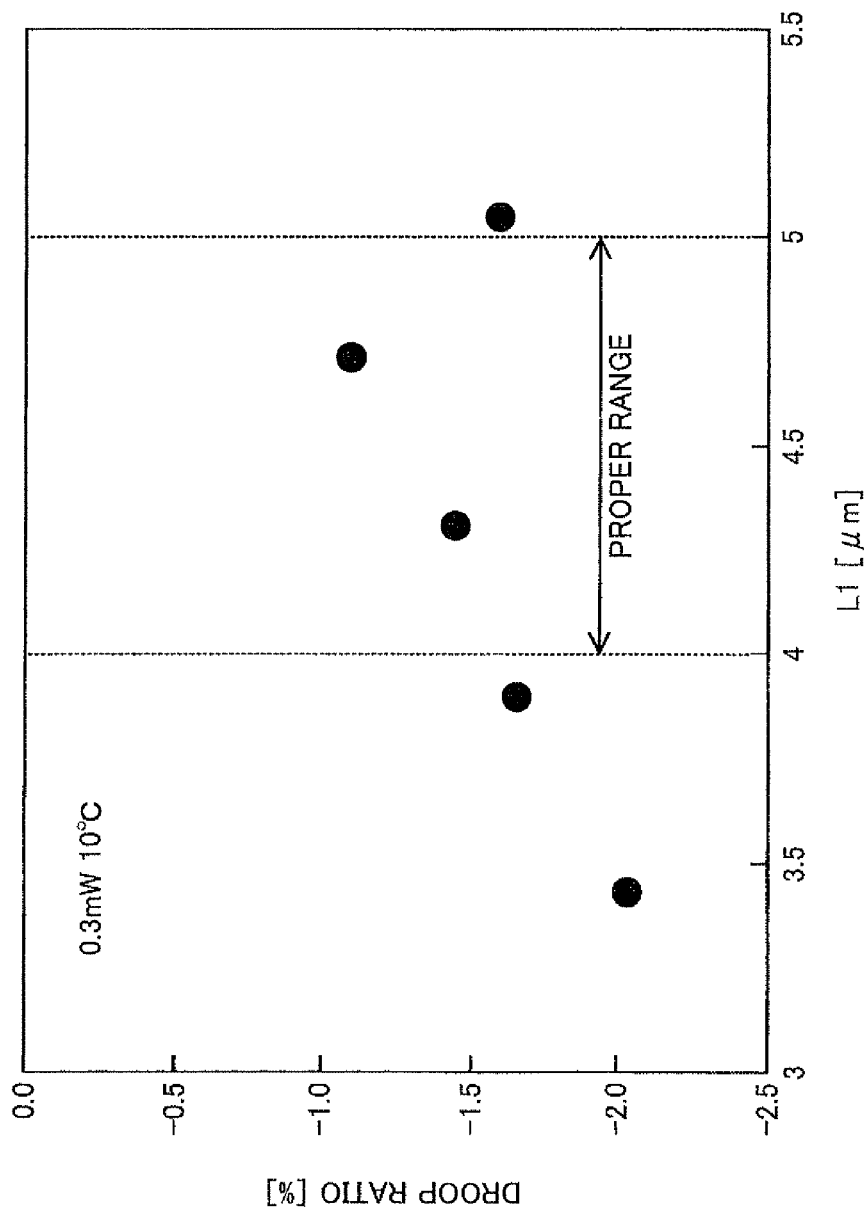
FIG. 30 is a graph illustrating the relationship between a negative droop ratio and the internal diameter L1 of the low-reflectivity region.

FIG. 29 illustrates the relationship between L1 and the single-mode output of a surface-emitting laser having a thickness of 32 nm of the selectively oxidized layer and an area of 25 μm² of the current passage region. FIG. 30 illustrates the relationship between L1 and the negative droop ratio of the surface-emitting laser. FIG. 29 shows that as the value of L1 decreases, the single-mode output increases. This is believed to be due to the increase in the overlap between the low-reflectivity region and the oscillation region of the high-order mode as the value of L1 decreases, resulting in a greater effect of preventing the high-order mode oscillation. In FIG. 29, the dashed-dotted line indicates the single-mode output (0.9 mW) of a surface-emitting laser in which the low-reflectivity region is not provided. By providing the low-reflectivity region, the single-mode output is greatly increased. The single-mode output is saturated when the value of L1 is about 4 μm.

FIG. 30 shows that as the value of L1 decreases, the absolute value of the negative droop ratio increases in the negative region. This is due to the fact that as the value of L1 decreases, the spatial overlap between the low-reflectivity region and the fundamental mode increases, resulting in an increase in the threshold current. The increase in the threshold current results in an increase in the operating current and the amount of heat generated.

Thus, the internal diameter L1 of the low-reflectivity region has an appropriate range of 4.0 μm to 5.0 μm where the single-mode output can be significantly increased without increasing the negative droop characteristics.

Figure 31:
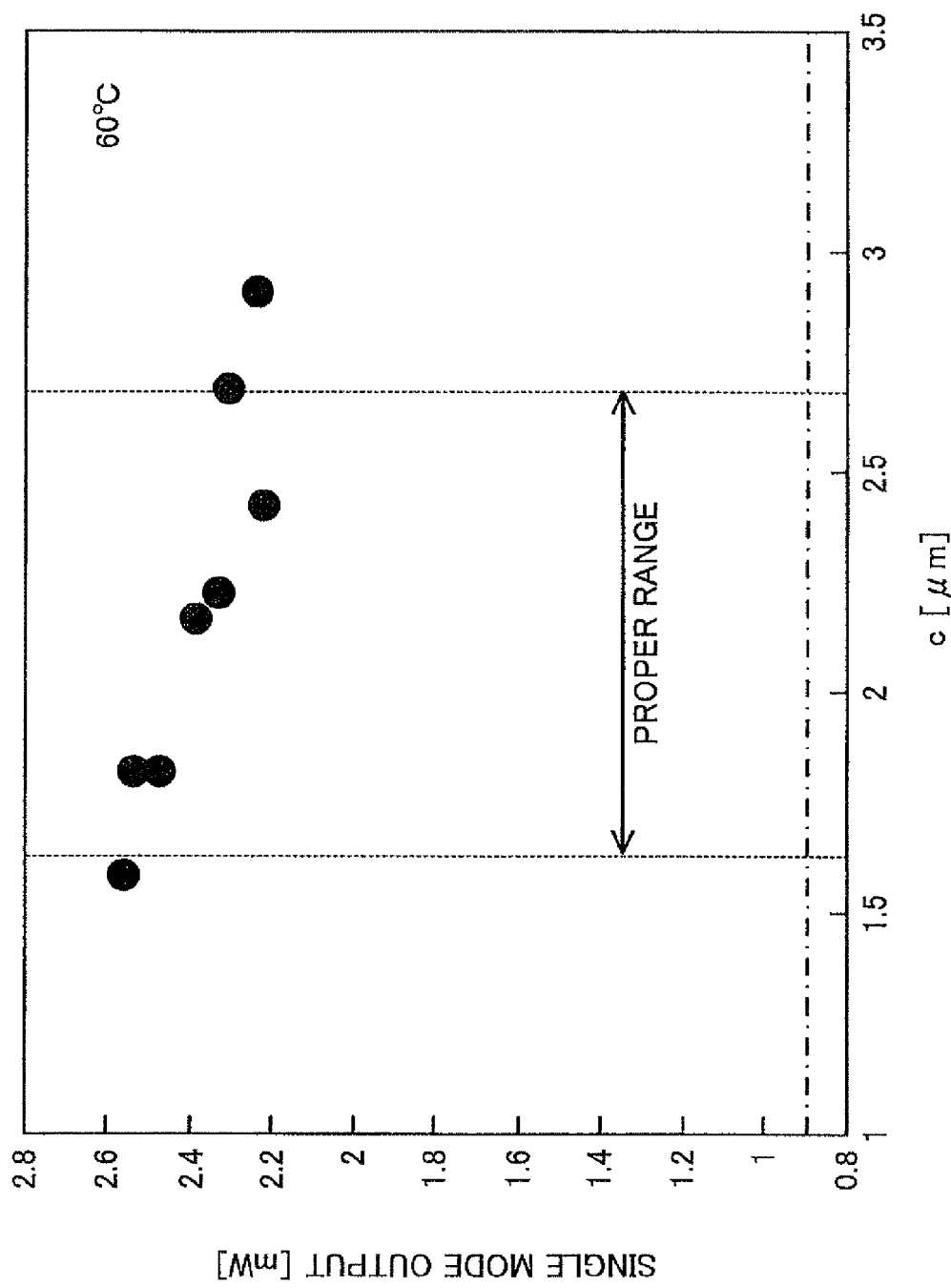
FIG. 31 is a graph illustrating the relationship between the single-mode output and a width c of two low-reflectivity regions illustrated in FIG. 10.
Figure 32:
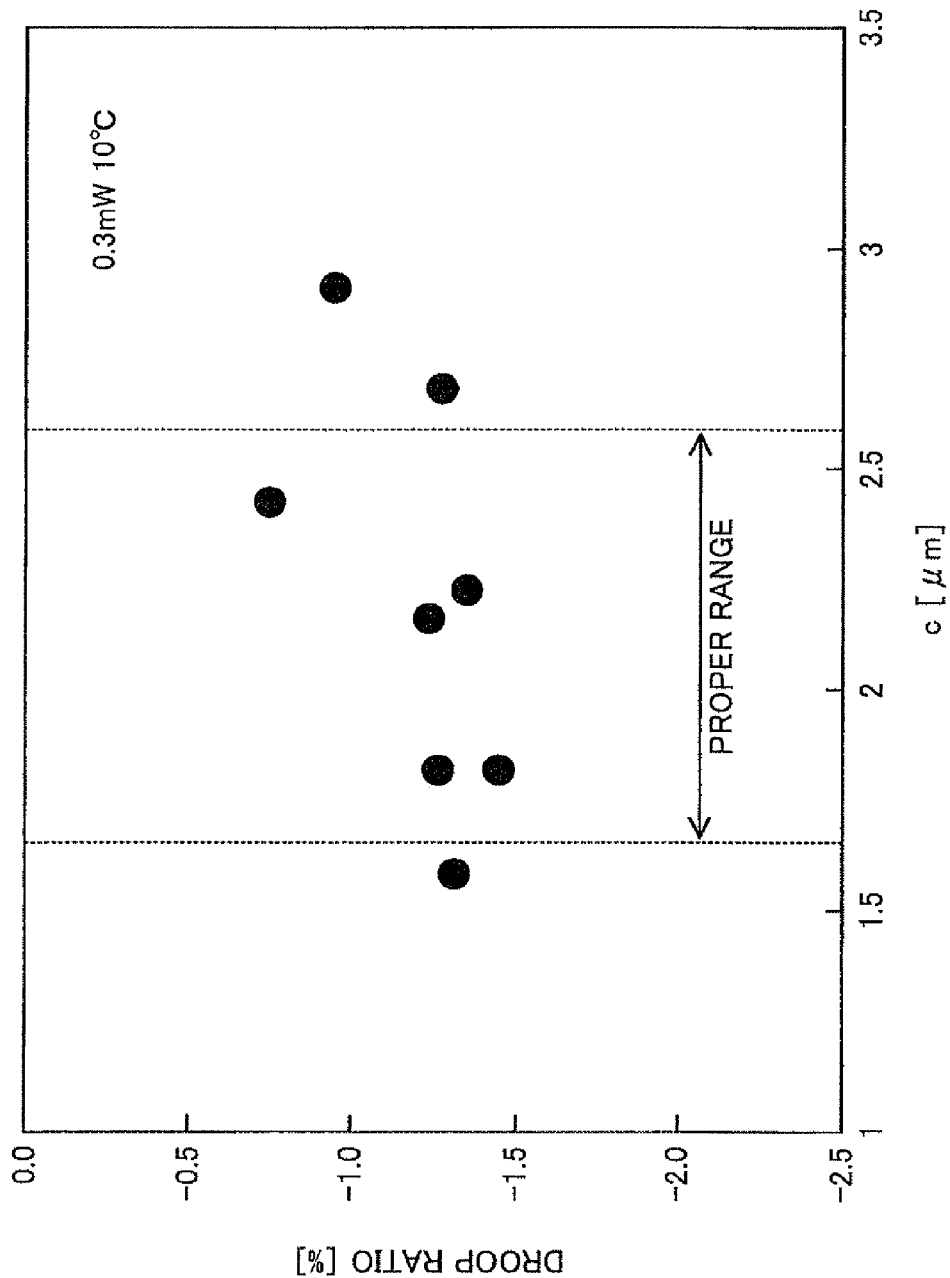
FIG. 32 is a graph illustrating the relationship between the negative droop ratio and the width c of the two low-reflectivity regions.

FIG. 31 illustrates the relationship between the interval c (see FIG. 10) of the two low-reflectivity regions and the single-mode output of a surface-emitting laser of which the thickness of the selectively oxidized layer is 32 nm and the oxidized confinement area is 25 μm$^2$. FIG. 32 illustrates the relationship between the interval c and the negative droop ratio of the surface-emitting laser.

FIG. 31 shows that as the value of c decreases, the single-mode output increases. This is due to the fact that as the value of c decreases, the overlap between the low-reflectivity region and the oscillation region of the high-order mode increases, resulting in a greater effect of preventing the oscillation of the high-order mode.

FIG. 32 shows that as the value of c decreases, the absolute value of the droop ratio increases in the negative region, although the degree of change is smaller than L1. From the viewpoint of single-mode output, a smaller value of c is desirable. However, if the value of c is too small, shape reproducibility during the manufacturing process or the stability of polarization direction and the like may be reduced. Thus, in view of reproducibility and the like, the value of c is preferably in a range from 1.7 μm to 2.7 μm.

Figure 33:
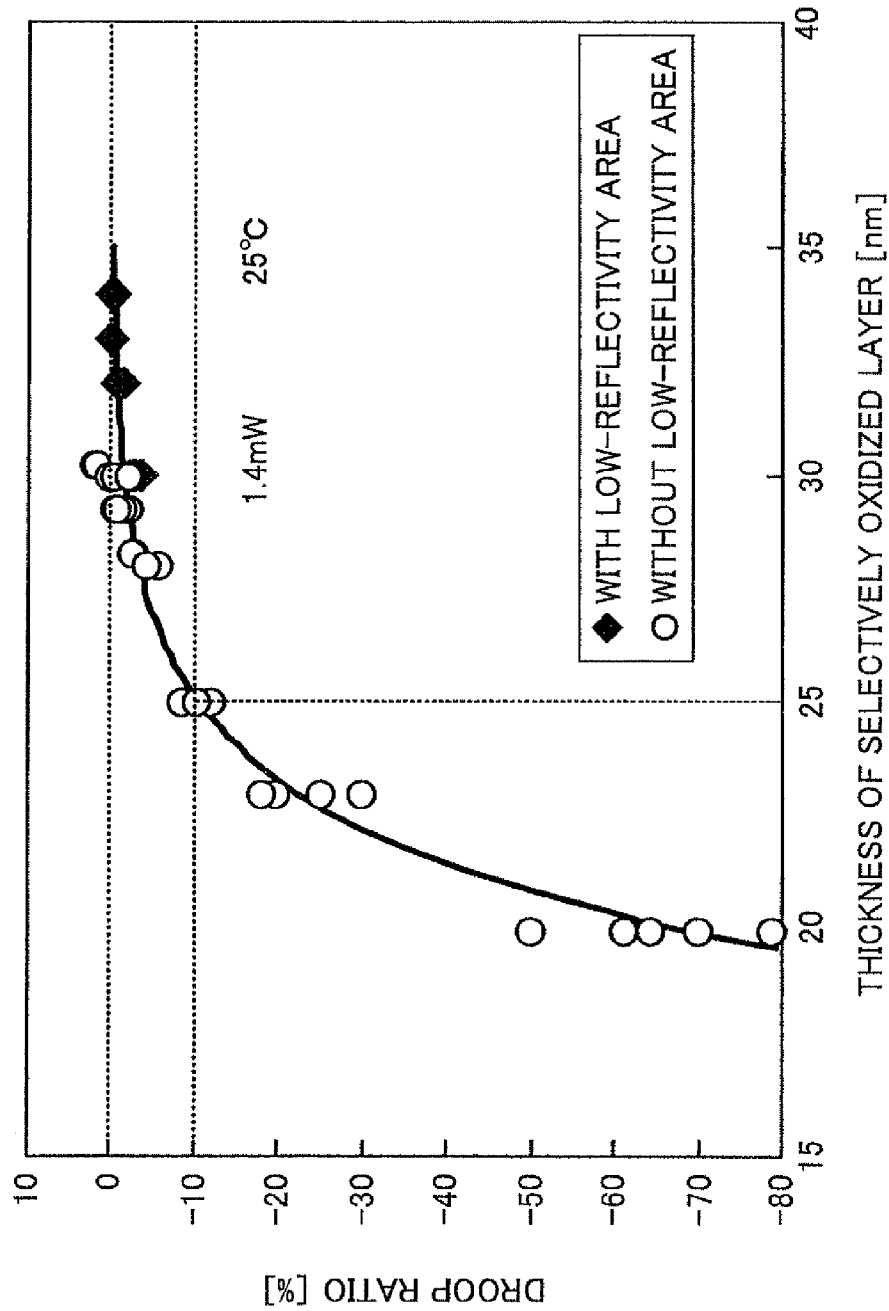
FIG. 33 is a graph illustrating the relationship between the negative droop ratio and the thickness of the selectively oxidized layer.

FIG. 33 illustrates the relationship between the thickness of the selectively oxidized layer and the negative droop ratio of a surface-emitting laser in which a low-reflectivity region of dielectric film (SiN) is provided in the emission region, and a surface-emitting laser in which no such low-reflectivity region is provided. The current passage region of the surface-emitting lasers is square in shape and has an area in a range from 16 to 28 μm$^2$. The amount of detuning of the surface-emitting lasers is 0 nm or less.

FIG. 33 shows that regardless of the presence of the low-reflectivity region, the absolute value of the droop ratio increases in the negative region as the thickness of the selectively oxidized layer becomes smaller. Namely, the negative droop characteristics become more noticeable. This is due to the fact that the decrease in the thickness of the selectively oxidized layer results in a decrease in optical confinement in the transverse direction. FIG. 33 also shows that as the negative droop characteristics become more noticeable, variations of the negative droop characteristics also tend to increase. The dependency of the negative droop ratio on the thickness of the selectively oxidized layer is substantially the same for the two surface-emitting lasers. Namely, the negative droop characteristics are basically determined by the thickness of the selectively oxidized layer and the amount of detuning. In order to obtain a clear image, the negative droop ratio needs to be controlled to be not greater than −10%. FIG. 33 shows that for a surface-emitting laser whose amount of detuning is 0 nm or more, the thickness of the selectively oxidized layer needs to be about 25 nm or more.

Figure 34:
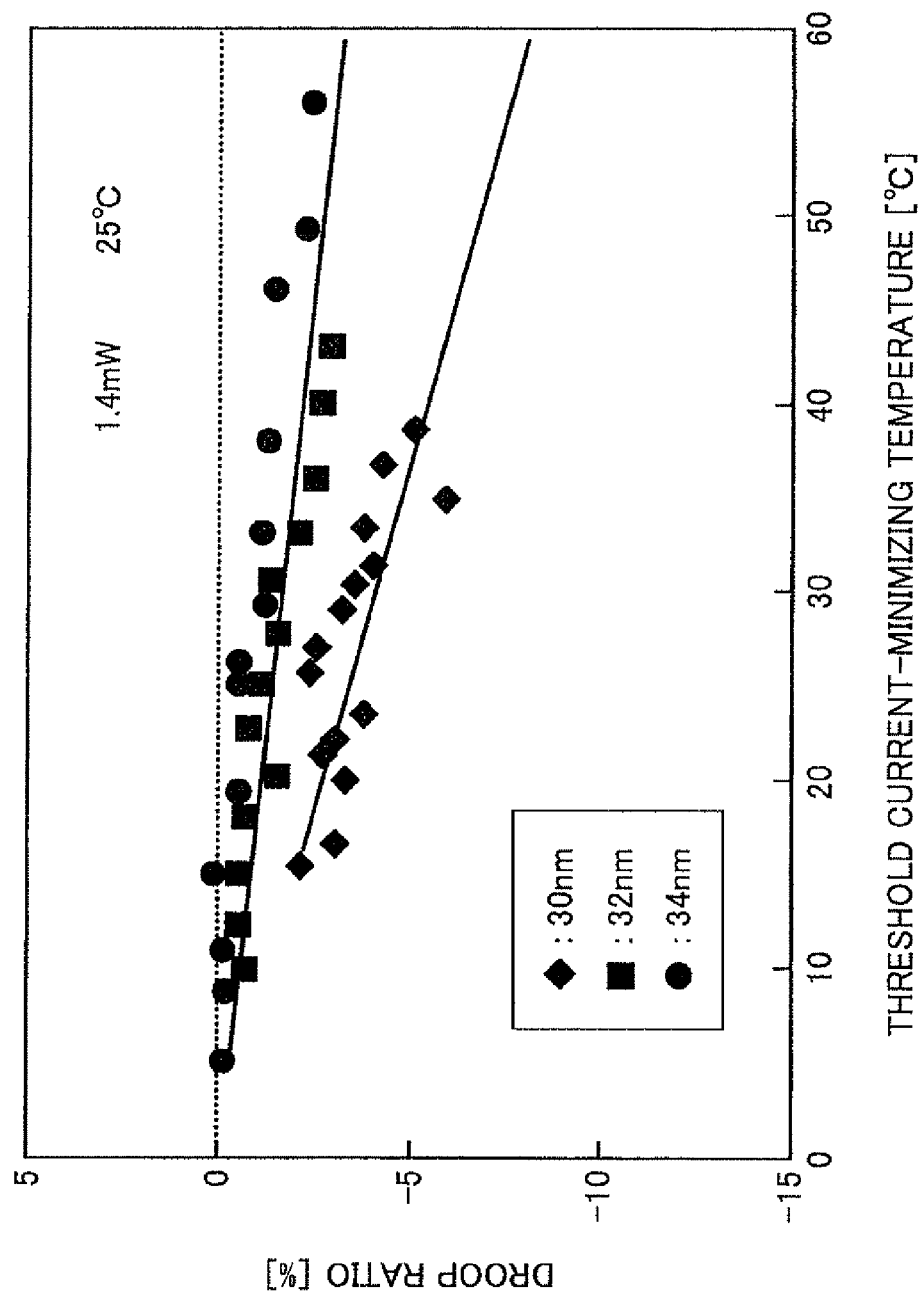
FIG. 34 is a graph illustrating the relationship between the negative droop ratio and a threshold-current-minimizing temperature.

FIG. 34 illustrates the relationship between the threshold-current-minimizing temperature and the negative droop ratio at 25° C. and an output of 1.4 mW of surface-emitting lasers in which the low-reflectivity region of dielectric film (SiN) is provided in the emission region and having various thicknesses of the selectively oxidized layer, namely 30 nm, 32 nm, and 34 nm.

The amount of detuning is 0 nm in the surface-emitting laser in which the threshold-current-minimizing temperature is 25° C. The amount of detuning increases by about 0.24 nm as the threshold-current-minimizing temperature increases by 1° C.

FIG. 34 shows that the greater the thickness of the selectively oxidized layer, the more are the negative droop characteristics reduced, as is also indicated by FIG. 33. As the threshold-current-minimizing temperature increases, the absolute value of the droop ratio increases in the negative direction. This is believed due to the fact that, in the surface-emitting laser in which the threshold-current-minimizing temperature is high, emission efficiency is improved by the increase in the internal temperature of the surface-emitting laser by current injection. This tendency is more pronounced as the thickness of the selectively oxidized layer becomes smaller.

In FIG. 33, the negative droop ratio of −10% or less is obtained when the thickness of the selectively oxidized layer is 25 nm or more. This is because the amount of detuning of the surface-emitting laser illustrated in FIG. 33 is smaller than 0 nm. As can be seen from the tendency illustrated in FIG. 34, the appearance of the negative droop characteristics in response to an increase in the threshold-current-minimizing temperature tends to be more pronounced as the thickness of the selectively oxidized layer decreases. For example, this tendency is very pronounced in the case of the selectively oxidized layer having a thickness of 25 nm. The negative droop ratio of −10% or less was obtained only in the surface-emitting lasers in which the threshold-current-minimizing temperature is 25° C. or lower (i.e., the amount of detuning is 0 nm or less).

Thus, while the negative droop characteristics can be effectively reduced by setting the threshold-current-minimizing temperature at a low value, a surface-emitting laser with such a temperature setting may experience an increase in the operating current during a high-temperature operation, resulting in poor temperature characteristics. Thus, for practical purposes, a proper balance needs to be achieved between the control of the negative droop characteristics and temperature characteristics. Specifically, in view of the temperature characteristics, the threshold-current-minimizing temperature should be 25° C. or higher.

Such a demand may be addressed by increasing the thickness of the selectively oxidized layer. By so doing, the negative droop ratio approaches 0%, as illustrated in FIG. 33, and the dependency on the threshold-current-minimizing temperature can also be reduced, as illustrated in FIG. 34. Furthermore, the negative droop ratio of −10% or less can be obtained even when the threshold-current-minimizing temperature is 25° C. or higher (i.e., the amount of detuning is 0 nm or more). FIG. 34 shows that as long as the thickness of the selectively oxidized layer is 30 nm or more, the negative droop ratio of −10% or less can be obtained even when the threshold-current-minimizing temperature is 60° C. Thus, by increasing the thickness of the selectively oxidized layer, the negative droop characteristics can be controlled and the temperature characteristics can be improved. However, the single mode output, which is an important characteristic of the surface-emitting laser, may be limited.

Figure 35:
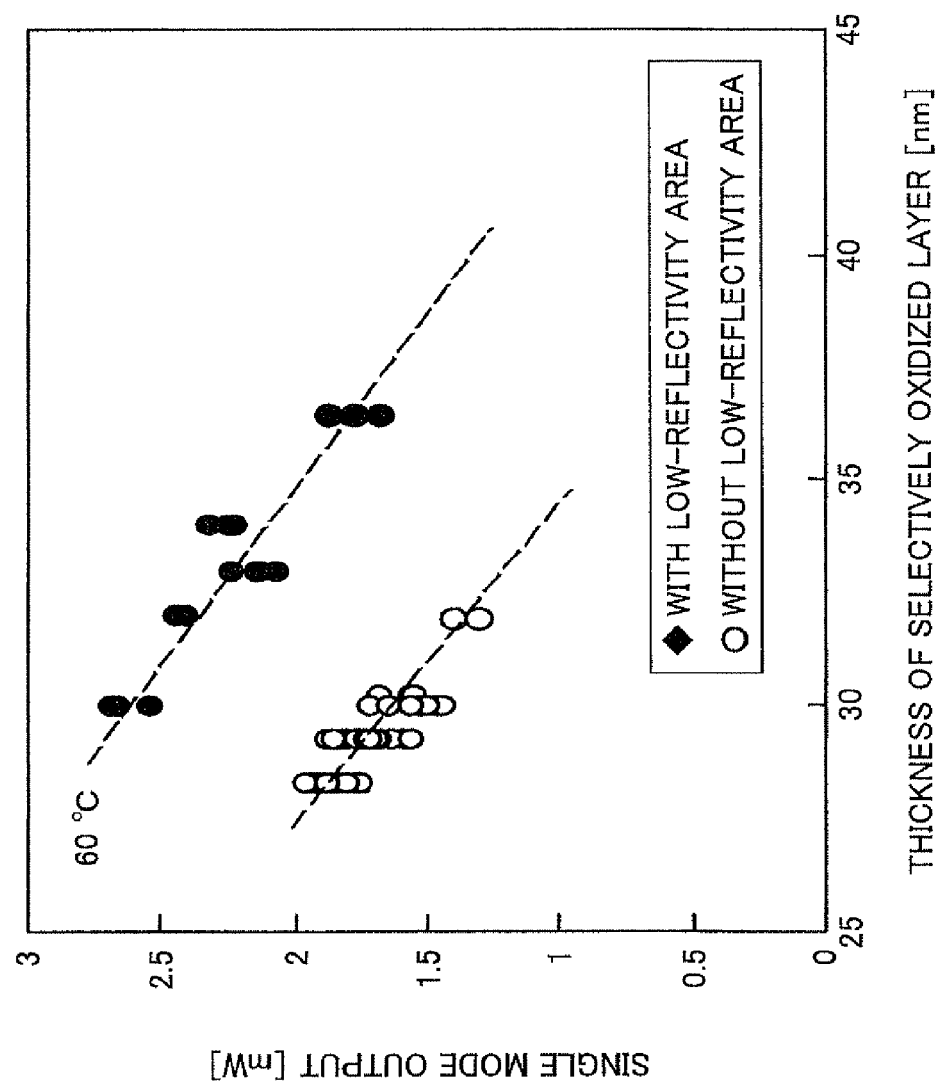
FIG. 35 is a graph illustrating the relationship between the single-mode output and the thickness of the selectively oxidized layer.

FIG. 35 illustrates the relationship between the thickness of the selectively oxidized layer and the single-mode output of a surface-emitting laser in which a low-reflectivity region of dielectric film (SiN) is provided in the emission region, as well as a surface-emitting laser in which there is no such low-reflectivity region. As can be seen from FIG. 35, regardless of the presence of the low-reflectivity region, the single-mode output tends to decrease as the thickness of the selectively oxidized layer increases. This is believed due to the fact that as the thickness of the selectively oxidized layer increases, optical confinement in the transverse direction by the oxidized layer increases, so that the high-order transverse mode is confined and oscillation tends to occur more easily. It can also be seen from FIG. 35 that the single-mode output decreases by about 0.1 mW for each 1 nm increase in the thickness of the selectively oxidized layer.

Still referring to FIG. 35, with regard to the surface-emitting laser having no low-reflectivity region, it can be estimated that a single-mode output of almost 2.5 mW would be obtained when the thickness of the selectively oxidized layer is about 25 nm. However, when the thickness of the selectively oxidized layer is decreased to 30 nm, the single-mode output is also decreased to about 1.5 mW. Thus, there is a trade-off between the negative droop characteristics and the single-mode output. Namely, an attempt to effectively control the negative droop characteristics leads to a decrease in the single-mode output. An attempt to obtain a high single-mode output leads to more pronounced negative droop characteristics. In order to reduce the effect of the negative droop characteristics even a little, the amount of detuning would have to be set such that the temperature characteristics of the surface-emitting laser are degraded.

Thus, in the surface-emitting laser having no low-reflectivity region, a balance must be achieved between the single-mode output and the negative droop characteristics.

A high single-mode output is desirable not just in printer systems but also in other applications. In a printer system, a single-mode output of about 1 mW or more may be sufficient for practical purposes. A faster system can be realized by increasing the output, and there is always the increasing demand for faster printing speeds. Thus, it is desirable to realize a surface-emitting laser in which the negative droop characteristics are minimized and the single-mode output is maximized.

In accordance with the present embodiment, this trade-off problem is addressed by the surface-emitting laser in which a low-reflectivity region of a dielectric film is provided in the emission surface. FIG. 35 shows that in the case of the surface-emitting laser having the low-reflectivity region of the dielectric film, a greater single-mode output is obtained by the function of the low-reflectivity region to control the oscillation of the high-order transverse mode than the surface-emitting laser having no such low-reflectivity region of dielectric film. For example, when the thickness of the selectively oxidized layer is 30 nm or more, the negative droop characteristics can be effectively controlled in lasers in which the threshold-current-minimizing temperature is up to 60° C. When the selectively oxidized layer has such a thickness, a single-mode output of 2.5 mW can be obtained in the surface-emitting laser having the low-reflectivity region of dielectric film, exhibiting an improvement of about 1 mW in output. What is important is that the single-mode control is achieved not by the thickness of the selectively oxidized layer but by the dielectric film. Namely, the dielectric film significantly reduces the dependency of the single-mode output on the thickness of the oxidized layer, so that a high single-mode output can be obtained even when the oxidized layer has a relatively large thickness.

Thus, the surface-emitting laser in accordance with the present embodiment can provide a higher single-mode output than a surface-emitting laser that has no low-reflectivity region of dielectric film at the same negative droop ratio (i.e., the same oxidized layer thickness). From a different perspective, in accordance with the present embodiment, the thickness of the oxidized layer can be increased compared to the surface-emitting laser having no low-reflectivity region of dielectric film at the same single-mode output. Thus, the threshold-current-minimizing temperature can be set to a higher value, which is preferable in terms of temperature characteristics. Thus, in accordance with the present embodiment, there is less of the trade-off problem mentioned above, so that a single-mode output of 1 mW or more, which is generally required in printer systems, can be easily obtained as long as the thickness of the selectively oxidized layer is 40 nm or less, as illustrated in FIG. 35.

Thus, a large single-mode output can be obtained while the negative droop characteristics are effectively controlled. As a result, a surface-emitting laser suitable for a printer system that has good temperature characteristics and that can achieve high image quality and print speed can be realized.

As described above, in accordance with the present embodiment, the surface-emitting laser 100 includes the substrate 101 on which the buffer layer 102, the lower semiconductor DBR 103, the resonator structure including the active layer 105, the upper semiconductor DBR 107, and the contact layer 109, for example, are stacked. The upper semiconductor DBR 107 includes a confinement structure in which a current passage region is surrounded by an oxide that includes at least an oxide formed by the oxidation of a part of the selectively oxidized layer 108 that includes aluminum. In the emission region via which laser light is emitted, two small regions (first and second small regions) are provided in areas spaced apart from the central portion of the emission region. In the two small regions, the transparent layers 111A and 111B having an optical thickness of $\lambda/4$ are formed. The transparent layers 111A and 111B include an optically transparent dielectric film such that the reflectivity of the small regions is lower than the reflectivity of the central portion of the emission region. The thickness of the selectively oxidized layer may range from 30 nm to 34 nm, and the temperature at which the oscillation threshold current is minimized is 60° C. or lower.

In this case, the negative droop ratio of $-10\%$ or less and a very large single-mode output of 2 mW or more can be obtained at the same time. Thus, a large single-mode output can be realized while the negative droop characteristics are controlled regardless of the pulse period. When the target single-mode output is 1 mW or more, the thickness of the selectively oxidized layer may be in the range of 30 nm to 40 nm. The transparent layers 111A and 111B have optical anisotropy with respect to two directions perpendicular to each other. Thus, optical anisotropy can be intentionally caused in the confinement effect on the laser light in the transverse direction, so that the stability in the polarization direction can be improved.

The transparent layers 111A and 111B have an optical thickness of $\lambda/4$. When viewed from the direction of optical emission, the transparent layers 111A and 111B have the distance L1 in the range of 4.0 μm to 5.0 μm and the width c in the range of 1.7 μm to 2.7 μm. Thus, the single-mode output can be increased and stability in the polarization direction can be improved while reproducibility is maintained and the negative droop characteristics are controlled. When a square-wave current pulse having a pulse period of 1 ms and a pulse width of 500 μs is supplied, the relationship $(P1-P2)/P2 \geq -0.1$ is satisfied, where P1 is the optical output 10 ns after the start of pulse supply, and P2 is the optical output 1 μs after the start of pulse supply. Thus, the negative droop characteristics can be further reduced.

Because the light source 14 of the optical scanning apparatus 1010 has the surface-emitting laser 100, the optical scanning apparatus 1010 can perform a highly accurate optical scan operation. Thus, the laser printer 1000 including the optical scanning apparatus 1010 can form a high-quality image.

While in the foregoing embodiment, the protection layer 111 has been described as comprising SiN, the present invention is not limited to such an embodiment. Examples of the material of a dielectric film (dielectric layer) include $SiO_2$, SiN, TiOx, AlOx, FCa, and FMg. Particularly, SiN has a dense film structure and is capable of effectively preventing the entry of water or oxygen, for example, when used as a surface protection film, thus contributing to a significant improvement in the reliability of the device. Further, an SiN film can be easily etched using a hydrogen fluoride solution and the like. Thus, SiN is a preferable example from the viewpoint of process controllability and long-term reliability.

Further, while in the foregoing embodiment the small regions have been described as being semi-circular in shape, the present invention is not limited to such embodiment. For example, the small regions may have other shapes, such as elliptical or rectangular shapes. While the material of the transparent layers 111A and 111B has been described as being the same as the material of the protection layer 111, the is merely an example and the transparent layers 111A and 111B may be made of other materials. Similarly, while the transparent layers 111A and 111B have been described as having an optical thickness of $\lambda/4$, this is merely an example. In another example, the transparent layers 111A and 111B may have an optical thickness of $3\lambda/4$, as in the case of the surface-emitting laser 100A illustrated in FIG. 36. Namely, what is required is that the optical thickness of the transparent layers 111A and 111B be an odd multiple of $\lambda/4$.

Figure 36:
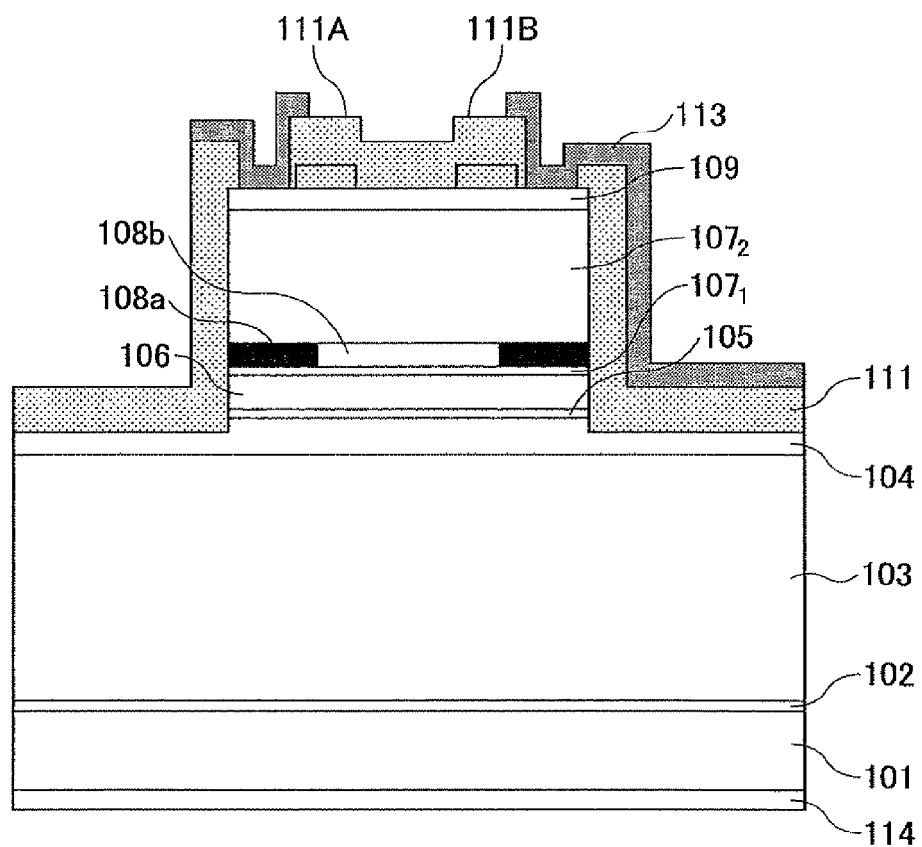
FIG. 36 is a cross section of a surface-emitting laser according to an embodiment of the present invention.

FIG. 36 is a cross section of the surface-emitting laser 100A taken in a plane parallel to the X-Z plane. In this case, the central portion of the emission region is covered with the protection layer 111 (dielectric film) having an optical thickness of $2\lambda/4$. The peripheral regions of the emission region except for the two small regions (first and second small regions) are also covered with the protection layer 111 (dielectric film) having the optical thickness of $2\lambda/4$.

In the surface-emitting laser 100A, because the entire emission surface is covered with the protection layer 111 (dielectric film), oxidation or contamination of the emission surface can be prevented. Although the central portion of the emission region is also covered with the protection layer 111 (dielectric film), the optical characteristics similar to those obtained in the absence of the protection layer 111 (dielectric film) can be obtained without reduction in reflectivity because the optical thickness of the central region is an even multiple of $\lambda/2$. Namely, what is required is that the optical thickness of the region whose reflectivity is desired to be reduced is an odd multiple of $\lambda/4$ while the optical thickness of the other regions is an even multiple of $\lambda/4$.

Thus, a surface-emitting laser having high moisture resistance and that does not degrade easily over time can be obtained. Generally, an optical film having an optical thickness of an integer multiple of $\lambda/2$ has little influence on reflectivity. Thus, the provision of the dielectric film having the optical thickness of an integer multiple of $\lambda/2$ on the surface-emitting laser surface hardly affects the characteristics of the device.

Semiconductor materials have the problem of reacting with the oxygen and water in the atmosphere, resulting in corrosion. Corrosion may be prevented by mounting the surface-emitting laser in a hermetically sealed package filled with an inert gas, such as nitrogen. However, this may result in higher cost for the packaging or mounting. Also, complete hermetic sealing is difficult to achieve. Thus, improvement in corrosion resistance of the surface-emitting laser itself provides an advantage from the cost or mounting technology point of view. A dielectric film of SiN or $SiO_2$ can be densely formed and has a significant effect in preventing the entry of oxygen or water. Thus, by providing a dielectric member of such material on the device surface, the entry of oxygen or water into the device and also the resultant corrosion of the device can be effectively prevented. In this case, there is little influence on reflectivity when the thickness of the dielectric film is set to be an integer multiple of $\lambda/2$. The same effect can be obtained when the optical thickness of the dielectric film in the low-reflectivity region is an odd multiple of $\lambda/4$. Thus, the device can be protected, the high-order mode can be controlled, and the polarization direction can be controlled at the same time by setting the film thickness (optical thickness) of the low-reflectivity region to be $\lambda/4$ and the optical thickness of the dielectric film that covers the entire device as a protection film to be $\lambda/2$. In this way, destruction of the device due to the absorption of moisture, for example, can be prevented, thus further improving the long-term reliability of the device.

In the surface-emitting laser 100A, which is a variation of the preceding embodiment, a dielectric film (first dielectric film) having an optical thickness of an odd multiple of $\lambda/4$ is provided in a region away from the center of the emission region. Thereafter, a dielectric film (second dielectric film) having an optical thickness of $\lambda/2$ is provided on the entire surface of the device. When the first and the second dielectric films are made of the same material, the reflectivity of the region in which the first and the second dielectric films are provided can be more effectively reduced. On the other hand, when the first and the second dielectric films are made of different materials, a refractive index difference may be caused in the interface of the first and the second dielectric films, so that the decrease in reflectivity may be hampered by the reflection on the interface. Particularly, when the refractive index of the first dielectric film which is located below is smaller, the influence of reflection at the interface increases. In the surface-emitting laser 100A, because the first and the second dielectric films are made of the same material, the reflectivity of the region away from the center of the emission region can be effectively reduced, so that the effect of controlling the high-order transverse mode can be effectively obtained.

Figure 37A:
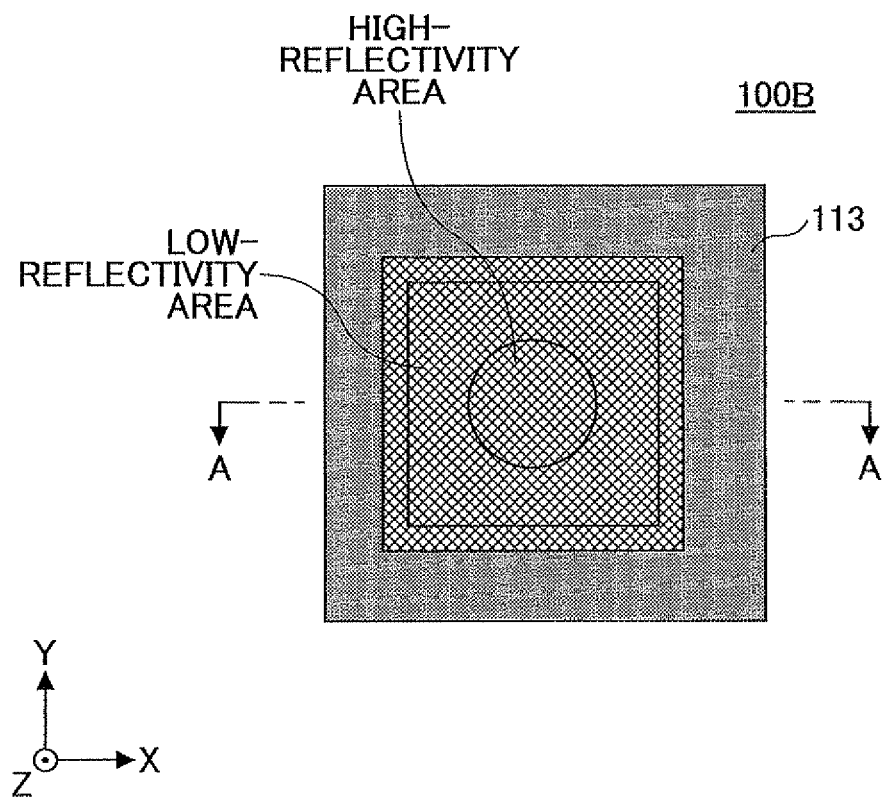
FIG. 37A is a plan view of the surface-emitting laser according to another embodiment of the present invention.
Figure 37B:
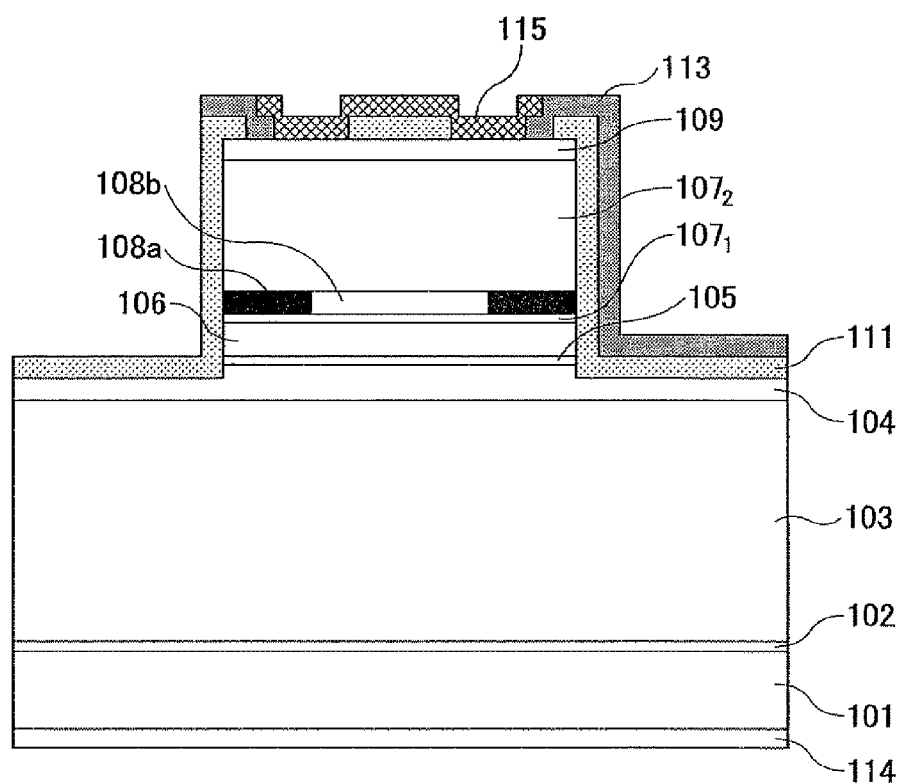
FIG. 37B is a cross section of the surface-emitting laser of FIG. 37A.
Figure 38A:
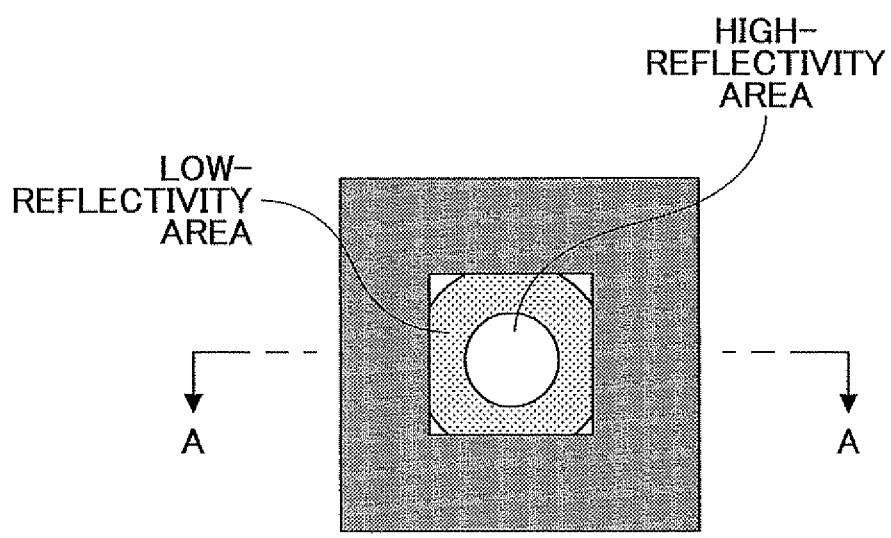
FIG. 38A is a plan view of the surface-emitting laser according to another embodiment.
Figure 38B:
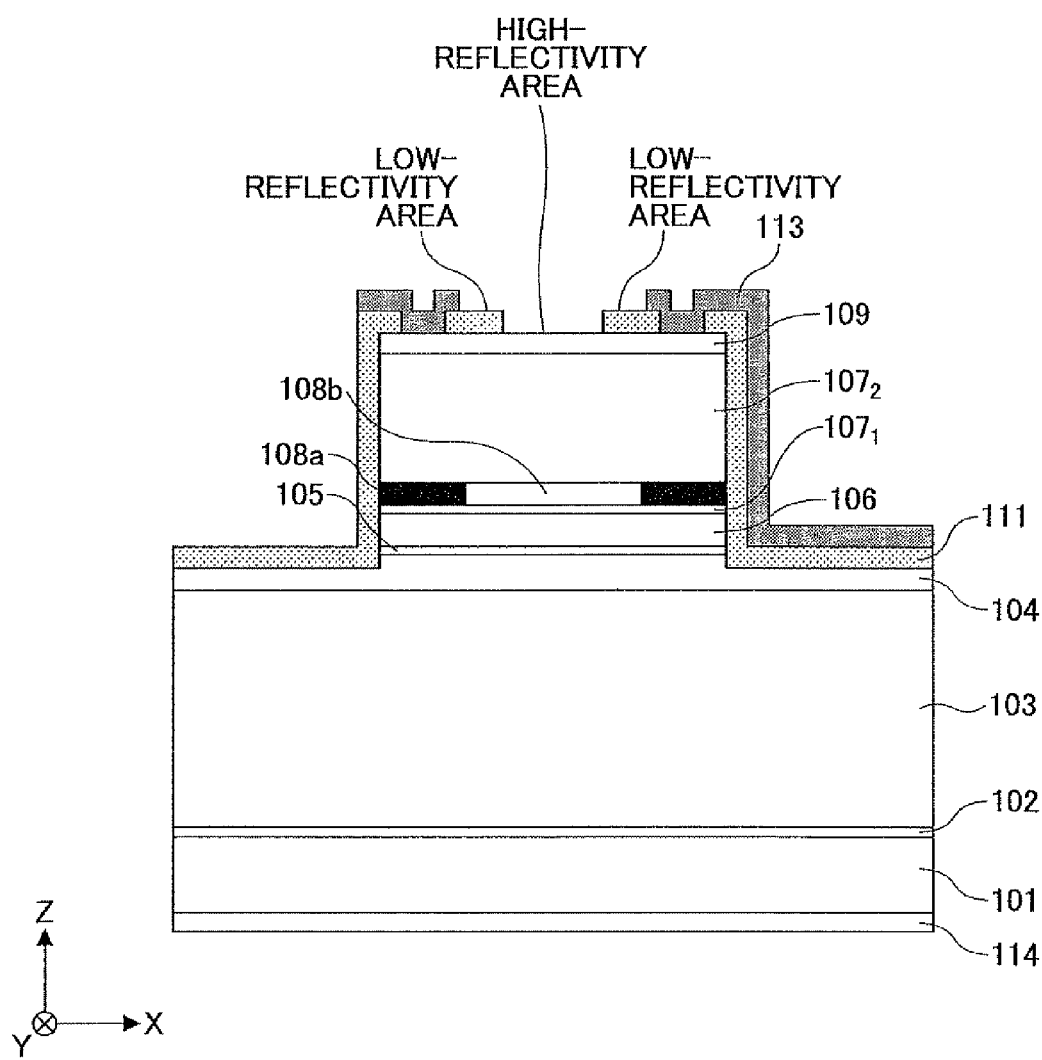
FIG. 38B is a cross section of the surface-emitting laser of FIG. 38A.

FIGS. 37A and 37B illustrate a surface-emitting laser 100B according to an embodiment of the present invention. In a central portion of the surface-emitting laser 100B, a high-reflectivity region having two transparent dielectric layers is provided. In a region away from the central region, a low-reflectivity region having a single dielectric layer is provided. The dielectric layers each have an optical thickness corresponding to an odd multiple of $\lambda/4$ of the oscillation wavelength $\lambda$. FIG. 37B is a cross section taken along line A-A of FIG. 37A.

The central region comprises two kinds of dielectric material, namely $SiO_2$ (lower layer 111) and TiOx (upper layer 115). The upper and lower layers are disposed on a contact layer 109. In this case, it is necessary that the refractive index of the lower dielectric layer 111 be smaller than that of the upper dielectric layer 115. Preferably, the refractive index of the lower dielectric layer 111 may be about 1.5, while the refractive index of the upper dielectric layer 115 may be about 2.5. In a region away from the center of the laser, only TiOx is stacked.

In this setting of the thickness of the dielectric layer, the central region has the same structure as that of a conventional multilayer film reflector, resulting in a high reflectivity. In the peripheral region away from the central region, there is the single layer of the dielectric layer having the thickness of $\lambda/4n$. Because the refractive index of TiOx (upper layer 115) is smaller than the refractive index of the semiconductor layer, the peripheral region has a lower reflectivity.

Further, in the surface-emitting laser 100B, because the reflectivity of the central region is increased, a very large reflectivity difference can be obtained between the central region and the peripheral region. The high-order transverse mode often has a partial mode distribution in the peripheral region away from the central region of the device. Thus, in the surface-emitting laser 100B, reflectivity with respect to the high-order transverse mode can be selectively reduced, so that oscillation of the high-order transverse mode can be prevented and a large single-mode output can be obtained.

As illustrated in FIGS. 37A, 37B, 38A, and 38B, a large single-mode output can be obtained even when the selectively oxidized layer has a large thickness by providing the low-reflectivity region in the region away from the center of the surface-emitting laser. Thus, the negative droop characteristics can be effectively reduced by increasing the thickness of the oxidized layer. Further, the threshold-current-minimizing temperature can be set to a high-temperature (such as 60° C.). When it is necessary to control polarization, the separated dielectric shape illustrated in FIG. 10 may be utilized.

While in the surface-emitting laser 100B the second dielectric layer has a square outer shape, this is merely an example. In another embodiment, the outer shape of the second dielectric layer may include a circular shape. Similarly, the shape of the high-reflectivity region may be other than circular. Effects similar to those obtained by the present embodiment can be obtained if the single-mode output can be increased regardless of the thickness of the selectively oxidized layer. For example, besides providing the dielectric film in accordance with the present embodiment, the reflectivity of the region away from the center of the emission region can be selectively reduced by removing a portion of the semiconductor multilayer film reflector away from the center of the emission region by etching, so that the peripheral region has a reduced thickness. Alternatively, reflectivity of the peripheral region may be reduced by partially providing a semiconductor layer on the peripheral region away from the center of the emission region. Further alternatively, a surface-emitting laser having a anti-guiding structure referred to as the ARROW structure may be formed by forming a refractive index step in the transverse direction by processing the peripheral region of the semiconductor multilayer film reflector away from the emission region (see IEEE JOURNAL OF QUANTUM ELECTRONICS, VOL. 38, NO. 12, DECEMBER 2002 pp. 1599). This structure also prevents the oscillation of the high-order transverse mode.

In any case, a high single-mode output can be obtained regardless of the thickness of the selectively oxidized layer. Thus, the negative droop characteristics can be reduced while a high single-mode output can be obtained.

The light source 14 may include a surface-emitting laser array 100C illustrated in FIG. 39, instead of the surface-emitting laser 100. The surface-emitting laser array 100C includes plural (21 in the illustrated example) light-emitting portions disposed on the same substrate. In this case, the X-axis of FIG. 39 corresponds to the main-scan-corresponding direction, and the Y-axis corresponds to the sub-scan corresponding direction. The plural light-emitting portions are disposed such that when all of the light-emitting portions were orthographically projected on an imaginary line extending along the Y-axis direction, the adjacent light-emitting portions are disposed at intervals of d2. Thus, the 21 light-emitting portions are two-dimensionally arranged. In the present disclosure, the "interval of the light-emitting portions" refers to the distance between the centers of two adjacent light-emitting portions. The number of the light-emitting portions is not limited to 21.

Figure 40:
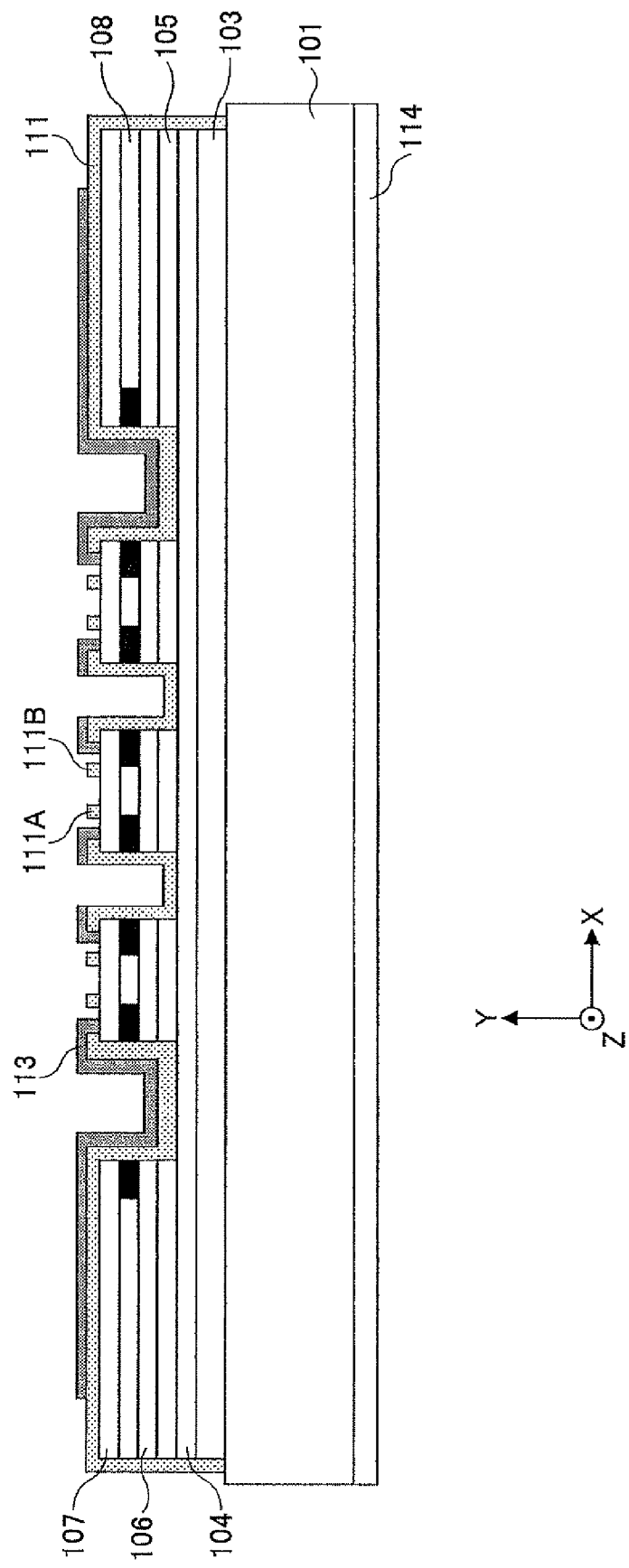
FIG. 40 is a cross section taken along line A-A of FIG. 37.

Each of the light-emitting portions has a structure similar to the surface-emitting laser 100, as illustrated in FIG. 40 which is a cross section taken along line A-A of FIG. 39. The surface-emitting laser array 100C may be manufactured by a process similar to that for the surface-emitting laser 100. Thus, plural beams of laser light having a high single-mode output and a uniform polarization direction can be obtained from the light-emitting portions. Therefore, 21 circular optical spots having a high optical density and a very small size can be simultaneously formed on the photosensitive drum 1030.

The light-emitting portions of the surface-emitting laser array 100C have the uniform interval d2 in the orthogonal projection on the imaginary line extending along the sub-scan corresponding direction, the embodiment provides the same effect as if the light-emitting portions are arranged over the photosensitive drum 1030 at equal intervals in the sub-scan direction by adjusting the timing of turning on the light emitting portions.

When the interval d2 is 2.65 μm and the optical system of the optical scanning apparatus 1010 has a magnifying power of 2, a high-density writing operation of 4800 dpi (dots per inch) can be performed. Obviously, higher densities and a higher-quality printing operation may be performed by increasing the number of the light-emitting portions disposed in the main-scan-corresponding direction, by further reducing the interval d2 by narrowing the pitch d1 in the sub-scan corresponding direction, or by decreasing the magnifying power of the optical system. A write interval in the main-scan direction can be easily controlled by adjusting the timing of turning on the light-emitting portions.

In this case, the laser printer 1000 can perform a printing operation without lowering the print speed even when the write dot density is increased. Further, the print speed can be increased for the same write dot density. Because the surface-emitting laser according to the present embodiment has a high single-mode output while the negative droop characteristics are reduced, a high print speed and a high-resolution image quality can be achieved.

Because the polarization directions of the light beams from the light-emitting portions are stable and aligned, the laser printer 1000 can form a high-quality image stably. Preferably, adjacent light-emitting portions are electrically and spatially separated by grooves having a width of 5 μm or more. If the width is too narrow, it may become difficult to control the etching step during the manufacturing process. Preferably, the size of the mesa (i.e., the length of the sides) is 10 μm or more. If the size of the mesa is too small, heat may be trapped during an operation, thereby degrading the device characteristics. The surface-emitting laser array 100C may include a one-dimensional arrangement of light-emitting portions similar to the light-emitting lasers 100.

While the foregoing embodiment has been described with reference to the case where the normal to the principal surface of the substrate lies at an angle of 15° toward the crystal orientation [1 1 1]A with respect to the crystal orientation [1 0 0], this is merely an example. It is only required that, when an inclined substrate is used, the normal to the principal surface of the substrate is inclined toward a direction of the crystal orientation <1 1 1> with respect to a direction of the crystal orientation <1 0 0>.

While in the foregoing embodiment, the light-emitting portion has been described as having an oscillation wavelength of the 780 nm band, this is merely an example. In another embodiment, the light-emitting portion may have a different oscillation wavelength depending on the characteristics of the photosensitive material.

The surface-emitting lasers according to the various embodiments of the present invention may be utilized for purposes other than an image forming apparatus. In such embodiments, the oscillation wavelength may include wavelengths from the 650 nm band, 850 nm band, 980 nm band, 1.3 µm band, or 1.5 µm band, depending on the particular purpose. The semiconductor material of the active layer may include a mixed crystal semiconductor material depending on the oscillation wavelength. For example, in the 650 nm band, an AlGaInP mixed crystal semiconductor material may be used. In the 980 nm band, an InGaAs mixed crystal semiconductor material may be used. In the 1.3 µm and the 1.5 µm band, a GaInNAs(Sb) mixed crystal semiconductor material may be used.

By selecting the material and structure of the reflecting mirrors depending on the oscillation wavelength, a light-emitting portion corresponding to the desired oscillation wavelength can be formed. For example, an AlGaInP mixed crystal may be used instead of an AlGaAs mixed crystal. Preferably, a combination of the low-refractive index layer and the high-refractive index layer is selected such that the combination is transparent to the oscillation wavelength and the refractive index difference between the low- and high-refractive index layers can be maximized.

While in the foregoing embodiments the optical scanning apparatus 1010 has been described as being applied in a printer, the optical scanning apparatus 1010 may be applied to other types of image forming apparatuses, such as copy machines, FAX machines, or multifunction peripherals (MFP) incorporating multiple image forming functions.

While the foregoing embodiments have been described with reference to the laser printer 1000 as an image forming apparatus, the present invention is not limited to such embodiments. For example, the present invention may be embodied in an image forming apparatus configured to irradiate a medium (such as a sheet of recording material) configured to emit a color upon laser irradiation with laser light directly.

The image carrier may include a silver halide film. In this case, a latent image may be formed on the silver halide film by optical scanning. The latent image may be rendered visible and then printed onto a print paper by a process similar to the conventional silver halide photography process. Such an image forming apparatus may be configured as an optical plate-making apparatus, or an optical image rendering apparatus configured to render a CT scan image and the like.

Figure 41:
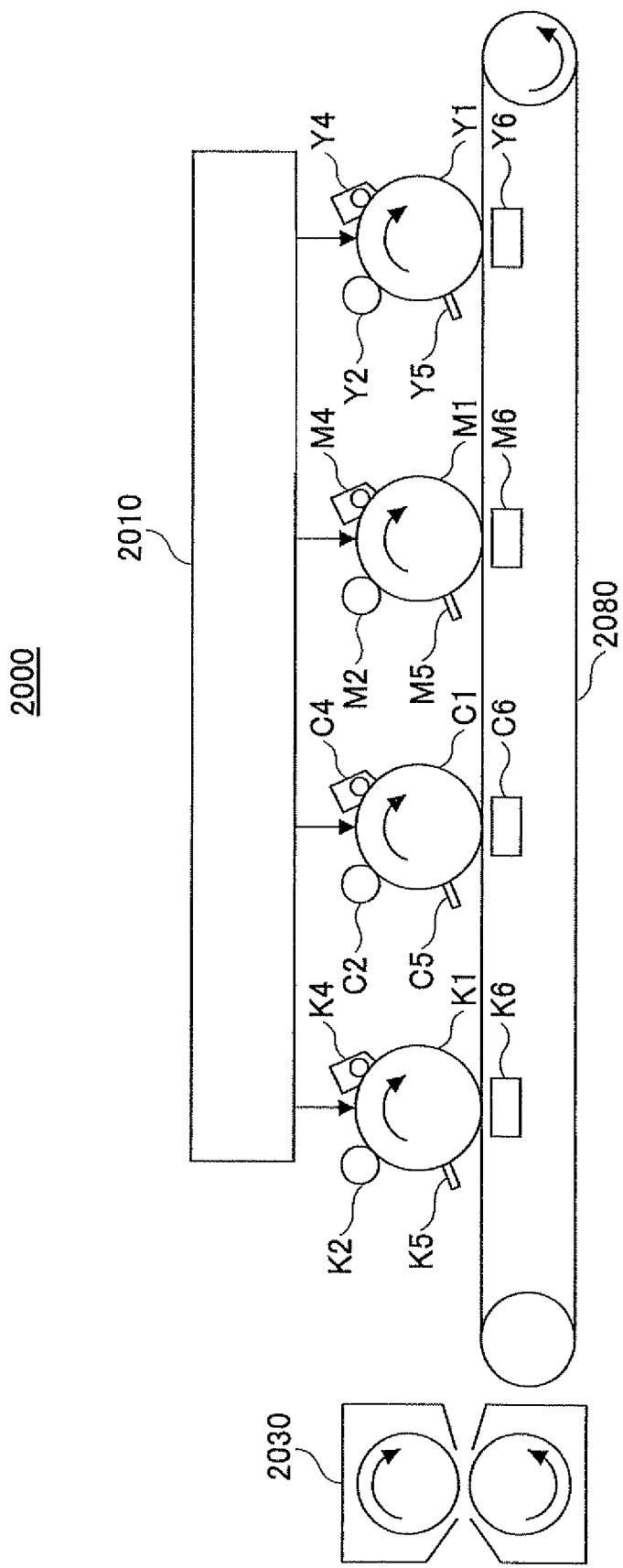
FIG. 41 illustrates a color printer according to an embodiment of the present invention.

FIG. 41 illustrates a color printer 2000 according to an embodiment of the present invention having plural photosensitive drums. The color printer 2000 is a multi-color printer of the tandem type configured to form a full-color image by overlapping four colors of black (B), cyan (C), magenta (M), and yellow (Y). The color printer 2000 includes photosensitive drums K1, C1, M1, and Y1; charging units K2, C2, M2, and Y2; developing units K4, C4, M4, and Y4; cleaning units K5, C5, M5, and Y5; and transfer units K6, C6, M6, and Y6 for the respective colors. The color printer 2000 also includes an optical scanning apparatus 2010, a transfer belt 2080, and a fusing unit 2030.

The photosensitive drums K1, C1, M1, and Y1 (each of which may be referred to as "the photosensitive drum") are rotated in a direction indicated by the corresponding arrows in FIG. 41. The charging units K2, C2, M2, and Y2 ("the charging unit"), the developing units K4, C4, M4, and Y4 ("the developing unit"), the transfer units K6, C6, M6, and Y6 ("the transfer unit"), and the cleaning units K5, C5, M5, and Y5 ("the cleaning unit") are disposed along the direction of rotation of the photosensitive drum. The charging unit is configured to charge a surface of the photosensitive drum uniformly.

The charged surface of the photosensitive drum is then irradiated with light emitted by the optical scanning apparatus 2010, whereby a latent image is formed on the photosensitive drum. The latent image is then developed by the developing unit, thereby forming a toner image of the corresponding color on the photosensitive drum surface. The toner images of the respective colors are transferred by the transfer units onto a recording paper carried on the transfer belt 2080, followed by the fusing of the image onto the recording paper by the fusing unit 2030.

The optical scanning apparatus 2010 may include the surface-emitting laser 100 or the surface-emitting laser array 100C as a light source for each color. Thus, the optical scanning apparatus 2010 can provide effects similar to those of the optical scanning apparatus 1010. Because the color printer 2000 includes the optical scanning apparatus 2010, the color printer 2000 can provide effects similar to those of the laser printer 1000.

In the color printer 2000, a color displacement may be caused by manufacturing or position errors of the components of the color printer 2000. In accordance with the present embodiment, such color displacement can be reduced by selectively turning on the light-emitting portions in the case where the light source of the optical scanning apparatus 2010 comprises the surface-emitting laser array 100C.

Thus, the surface-emitting laser and the surface-emitting laser array according to the embodiments of the present invention can provide a high single-mode output while controlling the negative droop characteristics regardless of the pulse period. An optical scanning apparatus according to an embodiment of the present invention can perform a highly accurate optical scanning operation. An image forming apparatus according to an embodiment of the present invention can be suitably used for forming a high-quality image.

Although this invention has been described in detail with reference to certain embodiments, variations and modifications exist within the scope and spirit of the invention as described and defined in the following claims.

The present application is based on Japanese Priority Applications No. 2009-217917 filed Sep. 18, 2009 and No. 2010-152678 filed Jul. 5, 2010, the entire contents of which are hereby incorporated by reference.

The invention claimed is:

1. A surface-emitting laser comprising:
   a substrate;
   a lower semiconductor multilayer film reflector disposed on the substrate;
   a resonator structure including an active layer and disposed on the lower semiconductor multilayer film reflector;
   an upper semiconductor multilayer film reflector disposed on the resonator structure, the upper semiconductor multilayer film reflector including a confinement structure in which a current passage region is surrounded by an oxidized portion of a selectively oxidized layer containing aluminum; and
   an upper electrode disposed on the upper semiconductor multilayer film reflector, the upper electrode defining an emission region,
   wherein the emission region includes a central portion and a peripheral portion, the peripheral portion being covered with a transparent dielectric film and having a reflectivity lower than a reflectivity of the central portion,
   wherein the selectively oxidized layer has a thickness in a range from 30 nm to 40 nm, and
   the temperature at which an oscillation threshold current is minimized is 60° C. or lower, wherein the peripheral portion of the emission region has optical anisotropy with respect to two directions perpendicular to each other, wherein the thickness of the dielectric film is λ/4n where λ is an oscillation wavelength and n is the refractive index of the dielectric film, wherein the peripheral portion includes a first peripheral portion and a second peripheral portion separated from each other by a straight line passing through the central portion disposed therebetween as viewed from a direction in which light is emitted from the laser, and wherein the central portion has a width in a range from 4.0 μm to 5.0 μm, and the straight line has a width in a range from 1.7 μm to 2.7 μm.

2. The surface-emitting laser according to claim 1, wherein the thickness of the selectively oxidized layer is in a range from 30 nm to 34 nm.

3. The surface-emitting laser according to claim 1, wherein a relationship (P1-P2)/P2≥−0.1 is satisfied upon supply of a square-wave current pulse having a pulse period of 1 ms and a pulse width of 500 μs, where P1 is an optical output 10 ns after the start of pulse supply and P2 is an optical output 1 μs after the start of pulse supply.

4. The surface-emitting laser according to claim 1, wherein the emission region is entirely covered with a second dielectric film having a thickness of λ/2n.

5. The surface-emitting laser according to claim 4, wherein the second dielectric film is made of the same material as the transparent dielectric film.

6. The surface-emitting laser according to claim 1, wherein the transparent dielectric film comprises SiN.

7. A surface-emitting laser array comprising a plurality of the surface-emitting lasers recited in claim 1.

8. An optical scanning apparatus comprising:
a light source including the surface-emitting laser array recited in claim 7;
a deflector configured to deflect a beam of light emitted by the light source; and
a scanning optical system configured to focus the beam of light deflected by the deflector on a scanned surface.

9. An image forming apparatus comprising:
an image carrier; and
the optical scanning apparatus recited in claim 8,
wherein the optical scanning apparatus is configured to scan the image carrier with the beam of light that is modulated in accordance with image information.

10. An optical scanning apparatus comprising:
a light source including the surface-emitting laser according to claim 1;
a deflector configured to deflect a beam of light emitted by the light source; and
a scanning optical system configured to focus the beam of light deflected by the deflector on a scanned surface.

11. An image forming apparatus comprising:
an image carrier; and
the optical scanning apparatus recited in claim 10,
wherein the optical scanning apparatus is configured to scan the image carrier with the beam of light that is modulated in accordance with image information.

12. The image forming apparatus according to claim 11, wherein the image information includes multi-color image information.

* * * * *